(12) United States Patent
Ozawa et al.

(10) Patent No.: US 9,681,059 B2
(45) Date of Patent: Jun. 13, 2017

(54) IMAGE-CAPTURING DEVICE

(71) Applicant: Sony Corporation, Tokyo (JP)

(72) Inventors: Ken Ozawa, Kanagawa (JP); Masanori Iwasaki, Kanagawa (JP); Hideaki Mogi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 164 days.

(21) Appl. No.: 14/356,022

(22) PCT Filed: Dec. 7, 2012

(86) PCT No.: PCT/JP2012/081798
§ 371 (c)(1),
(2) Date: May 2, 2014

(87) PCT Pub. No.: WO2013/089036
PCT Pub. Date: Jun. 20, 2013

(65) Prior Publication Data
US 2014/0320695 A1    Oct. 30, 2014

(30) Foreign Application Priority Data
Dec. 16, 2011    (JP) .................. 2011-276508

(51) Int. Cl.
*H04N 5/235*    (2006.01)
*H01L 27/146*    (2006.01)
(Continued)

(52) U.S. Cl.
CPC ..... *H04N 5/2355* (2013.01); *H01L 27/14607* (2013.01); *H01L 27/14623* (2013.01);
(Continued)

(58) Field of Classification Search
CPC ........ H04N 9/07–9/083; H04N 5/2355; H04N 2209/045; H01L 27/14621
See application file for complete search history.

(56) References Cited

U.S. PATENT DOCUMENTS 6,803,955 B1 *  10/2004  Yosida .................. H04N 5/235
                                              348/272
2013/0083226 A1 *  4/2013  Kwan .................... G06T 5/50
                                              348/302

FOREIGN PATENT DOCUMENTS

JP    2000-244797        9/2000
JP    2002-135792 A      5/2002
(Continued)

*Primary Examiner* — Paul Berardesca
(74) *Attorney, Agent, or Firm* — Chip Law Group

(57) ABSTRACT

An image-capturing device includes an image-capturing unit 30 including a first image-capturing element 41, a second image-capturing element 51, a third image-capturing element 61, and a fourth image-capturing element 71, and includes an image processing unit 11, wherein a sensitivity of the fourth image-capturing element 71 is less than sensitivities of the first image-capturing element 41 to the third image-capturing element 61, and the image processing unit 11 generates high sensitivity image data on the basis of outputs from the first image-capturing element 41 to the third image-capturing element 61, and generates low sensitivity image data on the basis of an output from the fourth image-capturing element 71, and further, the image processing unit 11 generates a combined image using high sensitivity image data corresponding to a low illumination image area in the low illumination image area obtained from the low sensitivity image data or the high sensitivity image data, and using low sensitivity image data corresponding to an high illumination image area.

10 Claims, 29 Drawing Sheets

(51) Int. Cl.
  *H04N 9/04* (2006.01)
  *H04N 5/355* (2011.01)
(52) U.S. Cl.
  CPC ..... *H01L 27/14645* (2013.01); *H04N 5/2353* (2013.01); *H04N 5/2358* (2013.01); *H04N 5/35563* (2013.01); *H04N 9/045* (2013.01)

(56) References Cited

FOREIGN PATENT DOCUMENTS

| | | | |
|---|---|---|---|
| JP | 2003-153291 | A | 5/2003 |
| JP | 2003-199117 | A | 7/2003 |
| JP | 2006-253876 | A | 9/2006 |
| JP | 2006-270364 | | 10/2006 |

* cited by examiner

|   | i | i+1 | i+2 | i+3 | i+4 | i+5 |   |
|---|---|---|---|---|---|---|---|
| | R $G_2'$ | R $G_2'$ | R $G_2'$ | R $G_2'$ | R $G_2'$ | R $G_2'$ | j |
| | $G_1$ B | $G_1$ B | $G_1$ B | $G_1$ B | $G_1$ B | $G_1$ B | |
| | R $G_2'$ | R $G_2'$ | R $G_2'$ | R $G_2'$ | R $G_2'$ | R $G_2'$ | j+1 |
| | $G_1$ B | $G_1$ B | $G_1$ B | $G_1$ B | $G_1$ B | $G_1$ B | |
| | R $G_2'$ | R $G_2'$ | R $G_2'$ | R $G_2'$ | R $G_2'$ | R $G_2'$ | j+2 |
| | $G_1$ B | $G_1$ B | $G_1$ B | $G_1$ B | $G_1$ B | $G_1$ B | |
| 61 | R $G_2'$ | R $G_2'$ | R $G_2'$ | R $G_2'$ | R $G_2'$ | R $G_2'$ | j+3 |
| | $G_1$ B | $G_1$ B | $G_1$ B | $G_1$ B | $G_1$ B | $G_1$ B | |

|   | i | i+1 | i+2 | i+3 | i+4 | i+5 |   |
|---|---|---|---|---|---|---|---|
| | $Gy_3'$ $Gy_4$ | $Gy_3'$ $Gy_4$ | $Gy_3'$ $Gy_4$ | $Gy_3'$ $Gy_4$ | $Gy_3'$ $Gy_4$ | $Gy_3'$ $Gy_4$ | j |
| | $Gy_2'$ $Gy_1'$ | $Gy_2'$ $Gy_1'$ | $Gy_2'$ $Gy_1'$ | $Gy_2'$ $Gy_1'$ | $Gy_2'$ $Gy_1'$ | $Gy_2'$ $Gy_1'$ | |
| | $Gy_3'$ $Gy_4$ | $Gy_3'$ $Gy_4$ | $Gy_3'$ $Gy_4$ | $Gy_3'$ $Gy_4$ | $Gy_3'$ $Gy_4$ | $Gy_3'$ $Gy_4$ | j+1 |
| | $Gy_2'$ $Gy_1'$ | $Gy_2'$ $Gy_1'$ | $Gy_2'$ $Gy_1'$ | $Gy_2'$ $Gy_1'$ | $Gy_2'$ $Gy_1'$ | $Gy_2'$ $Gy_1'$ | |
| | $Gy_3'$ $Gy_4$ | $Gy_3'$ $Gy_4$ | $Gy_3'$ $Gy_4$ | $Gy_3'$ $Gy_4$ | $Gy_3'$ $Gy_4$ | $Gy_3'$ $Gy_4$ | j+2 |
| | $Gy_2'$ $Gy_1'$ | $Gy_2'$ $Gy_1'$ | $Gy_2'$ $Gy_1'$ | $Gy_2'$ $Gy_1'$ | $Gy_2'$ $Gy_1'$ | $Gy_2'$ $Gy_1'$ | |
| | $Gy_3'$ $Gy_4$ | $Gy_3'$ $Gy_4$ | $Gy_3'$ $Gy_4$ | $Gy_3'$ $Gy_4$ | $Gy_3'$ $Gy_4$ | $Gy_3'$ $Gy_4$ | j+3 |
| | $Gy_2'$ $Gy_1'$ | $Gy_2'$ $Gy_1'$ | $Gy_2'$ $Gy_1'$ | $Gy_2'$ $Gy_1'$ | $Gy_2'$ $Gy_1'$ | $Gy_2'$ $Gy_1'$ | |

OUTPUT RATIO IN IMAGE DATA

| R [1] | G$_2'$[1] | R [1] | G$_2'$[1] | R [1] | G$_2'$[1] |
|---|---|---|---|---|---|
| G$_1$[1] | B [1] | G$_1$[1] | B [1] | G$_1$[1] | B [1] |
| R [1] | G$_2'$[1] | R [1] | G$_2'$[1] | R [1] | G$_2'$[1] |
| G$_1$[1] | B [1] | G$_1$[1] | B [1] | G$_1$[1] | B [1] |

FIG. 10B

| Gy$_3'$[1/32] | Gy$_4$[1/32] | Gy$_3'$[1/32] | Gy$_4$[1/32] | Gy$_3'$[1/32] | Gy$_4$[1/32] |
|---|---|---|---|---|---|
| Gy$_2'$[1/32] | Gy$_1'$[1/32] | Gy$_2'$[1/32] | Gy$_1'$[1/32] | Gy$_2'$[1/32] | Gy$_1'$[1/32] |
| Gy$_3'$[1/32] | Gy$_4$[1/32] | Gy$_3'$[1/32] | Gy$_4$[1/32] | Gy$_3'$[1/32] | Gy$_4$[1/32] |
| Gy$_2'$[1/32] | Gy$_1'$[1/32] | Gy$_2'$[1/32] | Gy$_1'$[1/32] | Gy$_2'$[1/32] | Gy$_1'$[1/32] |

OUTPUT RATIO IN IMAGE DATA

FIG. 28A

|  | i |  | i+1 |  | i+2 |  |
|---|---|---|---|---|---|---|
| $R^{1-4}$ |  | $R^{1-4}$ |  | $R^{1-4}$ |  | j |
| $G_1^{1-4}$ | $B^{1-4}$ | $G_1^{1-4}$ | $B^{1-4}$ | $G_1^{1-4}$ | $B^{1-4}$ |  |
| $R^{1-4}$ |  | $R^{1-4}$ |  | $R^{1-4}$ |  | j+1 |
| $G_1^{1-4}$ | $B^{1-4}$ | $G_1^{1-4}$ | $B^{1-4}$ | $G_1^{1-4}$ | $B^{1-4}$ |  |

FIG. 28B

|  | i |  | i+1 |  | i+2 |  |
|---|---|---|---|---|---|---|
| $R^{1-4}$ [4] | $G_2^{1-4}$ [4] | $R^{1-4}$ [4] | $G_2^{1-4}$ [4] | $R^{1-4}$ [4] | $G_2^{1-4}$ [4] | j |
| $G_1^{1-4}$ [4] | $B^{1-4}$ [4] | $G_1^{1-4}$ [4] | $B^{1-4}$ [4] | $G_1^{1-4}$ [4] | $B^{1-4}$ [4] |  |
| $R^{1-4}$ [4] | $G_2^{1-4}$ [4] | $R^{1-4}$ [4] | $G_2^{1-4}$ [4] | $R^{1-4}$ [4] | $G_2^{1-4}$ [4] | j+1 |
| $G_1^{1-4}$ [4] | $B^{1-4}$ [4] | $G_1^{1-4}$ [4] | $B^{1-4}$ [4] | $G_1^{1-4}$ [4] | $B^{1-4}$ [4] |  |

FIG. 29

| $Gy_4^1$ [1/8] | $Gy_4^2$ [1/8] | $Gy_4^1$ [1/8] | $Gy_4^2$ [1/8] | $Gy_4^1$ [1/8] | $Gy_4^2$ [1/8] |
|---|---|---|---|---|---|
| $Gy_4^3$ [1/8] | $Gy_4^4$ [1/8] | $Gy_4^3$ [1/8] | $Gy_4^4$ [1/8] | $Gy_4^3$ [1/8] | $Gy_4^4$ [1/8] |
| $Gy_4^1$ [1/8] | $Gy_4^2$ [1/8] | $Gy_4^1$ [1/8] | $Gy_4^2$ [1/8] | $Gy_4^1$ [1/8] | $Gy_4^2$ [1/8] |
| $Gy_4^3$ [1/8] | $Gy_4^4$ [1/8] | $Gy_4^3$ [1/8] | $Gy_4^4$ [1/8] | $Gy_4^3$ [1/8] | $Gy_4^4$ [1/8] |

IMAGE-CAPTURING DEVICE

TECHNICAL FIELD

The present disclosure relates to an image-capturing device, and more specifically, relates to an image-capturing device for obtaining an image by high dynamic range (HDR) imaging.

BACKGROUND ART

In an image-capturing device in which image-capturing elements are arranged in a two-dimensional matrix form, a technique for obtaining multiple pieces of image data by performing image-capturing process multiple times and combining the multiple pieces of image data is well known as indicated in, for example, JP 2000-244797 A. Alternatively, in order to cope with an image-capturing scene having great difference in the brightness, N pieces of image data of which sensitivities are different are obtained by performing image-capturing process of a still picture N times (N is equal to or larger than 2) with different exposure times, and an HDR-combined image is obtained by combining these N pieces of image data. However, in the method for obtaining these N pieces of image data, it takes a certain period of time to obtain the N pieces of image data, and the simultaneousness cannot be ensured, and in addition, artifact occurs due to the combining of the N pieces of image data, and it is difficult to cope with motion pictures.

A technique for arranging image-capturing elements of different sensitivities adjacent to each other, and expanding the dynamic range by combining a signal from an image-capturing element of a higher sensitivity and a signal from an image-capturing element of a lower sensitivity is well known as indicated in JP 2006-270364 A. In a technique disclosed in JP 2006-253876 A, the difference in the sensitivity is given within one piece of image data by performing control so as to change the electrical-charge accumulation time of each image-capturing element for each area of the image-capturing unit by controlling the shutter speed.

CITATION LIST

Patent Documents

Patent Document 1: JP 2000-244797 A
Patent Document 2: JP 2006-270364 A
Patent Document 3: JP 2006-253876 A

SUMMARY OF THE INVENTION

Problems to be Solved by the Invention

In JP 2006-270364 A, a small image-capturing element having a complementary filter is arranged in an image-capturing element arranged in a honeycomb form, so that two pieces of image data of which sensitivities are different can be obtained in a unit frame. In this method, however, due to the reduction of the size of the entire image-capturing element, it is difficult to form a small image-capturing element having a complementary filter, and the arrangement of the color filter is complicated. In addition, there is a problem of increase of the color filter materials and the process cost. The control of the shutter speed for each area in the technique disclosed in JP 2006-253876 A increases the complexity of the control circuit and the control algorithm of the image-capturing device, and as a result, the cost increases. Further, the techniques disclosed in these patent publications explained above increases the complexity of the structure of the image-capturing device and increases the cost of image processing such as resolution recovery, solving of jaggy, and color noise compensation.

Therefore, it is an object of the present disclosure to provide an image-capturing device having a simple configuration and structure capable of obtaining an image by high dynamic range imaging, and in addition, capable of easily coping with image-capturing of a motion picture.

Solutions to Problems

An image-capturing device according to the first aspect of the present disclosure for achieving the object explained above is an image-capturing device including: an image-capturing unit; and an image processing unit, wherein the image-capturing unit includes image-capturing element units arranged in a two-dimensional matrix form, and each of the image-capturing element units includes a first image-capturing element including a first filter and a first photoelectric conversion element, and configured to receive light in a first wavelength band; a second image-capturing element including a second filter and a second photoelectric conversion element, and configured to receive light in a second wavelength band having a peak wavelength longer than a peak wavelength of the first wavelength band; a third image-capturing element including a third filter and a third photoelectric conversion element, and configured to receive light in a third wavelength band having a peak wavelength longer than a peak wavelength of the second wavelength band; and a fourth image-capturing element including a fourth filter and a fourth photoelectric conversion element, and configured to receive light in the first wavelength band, the second wavelength band, and the third wavelength band, and wherein a light transmission rate of the fourth filter is less than a light transmission rate of the first filter, a light transmission rate of the second filter, and a light transmission rate of the third filter, and wherein the image processing unit generates high sensitivity image data based on outputs from the first image-capturing element, the second image-capturing element, and the third image-capturing element, and generates low sensitivity image data based on an output from the fourth image-capturing element, and the image processing unit further generates a combined image using high sensitivity image data corresponding to a low illumination image area in the low illumination image area obtained from the low sensitivity image data or the high sensitivity image data, and using low sensitivity image data corresponding to an high illumination image area in the high illumination image area obtained from the low sensitivity image data or the high sensitivity image data. With the image-capturing device according to the first aspect of the present disclosure, the combined image can be obtained, in which a portion of the image is a single-color image, and the remaining portion is a color image.

An image-capturing device according to the second aspect of the present disclosure for achieving the object explained above is an image-capturing device including: an image-capturing unit; and an image processing unit, wherein the image-capturing unit includes image-capturing element units arranged in a two-dimensional matrix form, and each of the image-capturing element units includes: a first image-capturing element and a third image-capturing element including a first photoelectric conversion element and configured to receive light in a visible light range; and a second image-capturing element and a fourth image-capturing element including a neutral density filter and a second photoelectric conversion element and configured to receive light in a visible light range, wherein the image processing unit generates high sensitivity image data on the basis of outputs from the first image-capturing element and the third image-capturing element, and generates low sensitivity image data on the basis of outputs from the second image-capturing element and the fourth image-capturing element, and the image processing unit further generates a combined image using high sensitivity image data corresponding to a low illumination image area in the low illumination image area obtained from the low sensitivity image data or the high sensitivity image data and using low sensitivity image data corresponding to a high illumination image area in the high illumination image area obtained from the low sensitivity image data or the high sensitivity image data. With the image-capturing device according to the second aspect of the present disclosure, a single-color image can be obtained.

An image-capturing device according to the third aspect of the present disclosure for achieving the object explained above is an image-capturing device including: an image-capturing unit; and an image processing unit, wherein the image-capturing unit includes image-capturing element units arranged in a two-dimensional matrix form, and each of the image-capturing element units includes four image-capturing element sub-units each including a first image-capturing element including a first filter and a first photoelectric conversion element and configured to receive light in a first wavelength band; a second image-capturing element including a second filter and a second photoelectric conversion element and configured to receive light in a second wavelength band having a peak wavelength longer than a peak wavelength of the first wavelength band; a third image-capturing element including a third filter and a third photoelectric conversion element and configured to receive light in a third wavelength band having a peak wavelength longer than a peak wavelength of the second wavelength band; and a fourth image-capturing element including a fourth filter and a fourth photoelectric conversion element and configured to receive light in the first wavelength band, the second wavelength band, and the third wavelength band, wherein a light transmission rate of the fourth filter is less than a light transmission rate of the first filter, a light transmission rate of the second filter, and a light transmission rate of the third filter, and the image processing unit generates high sensitivity image data on the basis of an output summation of the first image-capturing elements, an output summation of the second image-capturing elements, and an output summation of the third image-capturing elements of the four image-capturing element sub-units constituting the image-capturing element unit, and generates low sensitivity image data on the basis of an output from the fourth image-capturing element of each of the four image-capturing element sub-units, and the image processing unit further generates a combined image using high sensitivity image data corresponding to a low illumination image area in the low illumination image area obtained from the low sensitivity image data or the high sensitivity image data, and using low sensitivity image data corresponding to an high illumination image area in the high illumination image area obtained from the low sensitivity image data or the high sensitivity image data. With the image-capturing device according to the third aspect of the present disclosure, the combined image can be obtained, in which a portion of the image is a single-color image, and the remaining portion is a color image.

An image-capturing device according to the fourth aspect of the present disclosure for achieving the object explained above is an image-capturing device that includes an image-capturing unit and an image processing unit, wherein the image-capturing unit is arranged with image-capturing element units, and each of the image-capturing element units includes: a first image-capturing element including a first photoelectric conversion element and configured to receive light in a visible light range and a second image-capturing element including a neutral density filter and a second photoelectric conversion element and configured to receive light in a visible light range. The image processing unit generates high sensitivity image data on the basis of an output from the first image-capturing element and generates low sensitivity image data on the basis of an output from the second image-capturing element, and the image processing unit further generates a combined image using high sensitivity image data corresponding to a low illumination image area in the low illumination image area obtained from the low sensitivity image data or the high sensitivity image data and using low sensitivity image data corresponding to a high illumination image area in the high illumination image area obtained from the low sensitivity image data or the high sensitivity image data. With the image-capturing device according to the fourth aspect of the present disclosure, a single-color image can be obtained.

Effects of the Invention

Depending on application fields and usage fields of an image-capturing device, color information is not necessarily required in a high illumination portion of an image-capturing scene in which there is great difference in the brightness, and even image acquisition of a gray image without so-called blown out highlights would not cause any problem in practical point of view. Examples of such fields include a monitoring camera and an on-board camera which are strongly required "not to lose any information." An image-capturing device according to the present disclosure basically generates low sensitivity image data and high sensitivity image data on the basis of an output from an image-capturing unit in one image-capturing process, and an image processing unit uses the high sensitivity image data in a low illumination image area and uses the low sensitivity image data in a high illumination image area to generate a combined image. Therefore, although the image-capturing device has, for example, the simple configuration and structure equivalent to those of the image-capturing device having a conventional Bayer arrangement, the image-capturing device can easily obtain an image based on a high dynamic range imaging, and can easily cope with image-capturing of a motion picture. For this reason, a low-cost image-capturing device based on high dynamic range imaging method can be provided.

BRIEF DESCRIPTION OF DRAWINGS

FIGS. 2A and 2B are conceptual diagrams for explaining operation of an image-capturing unit of the image-capturing device of the first embodiment.

FIGS. 3A and 3B are conceptual diagrams for explaining operation of the image-capturing unit of the image-capturing device of the first embodiment.

Figure 4:
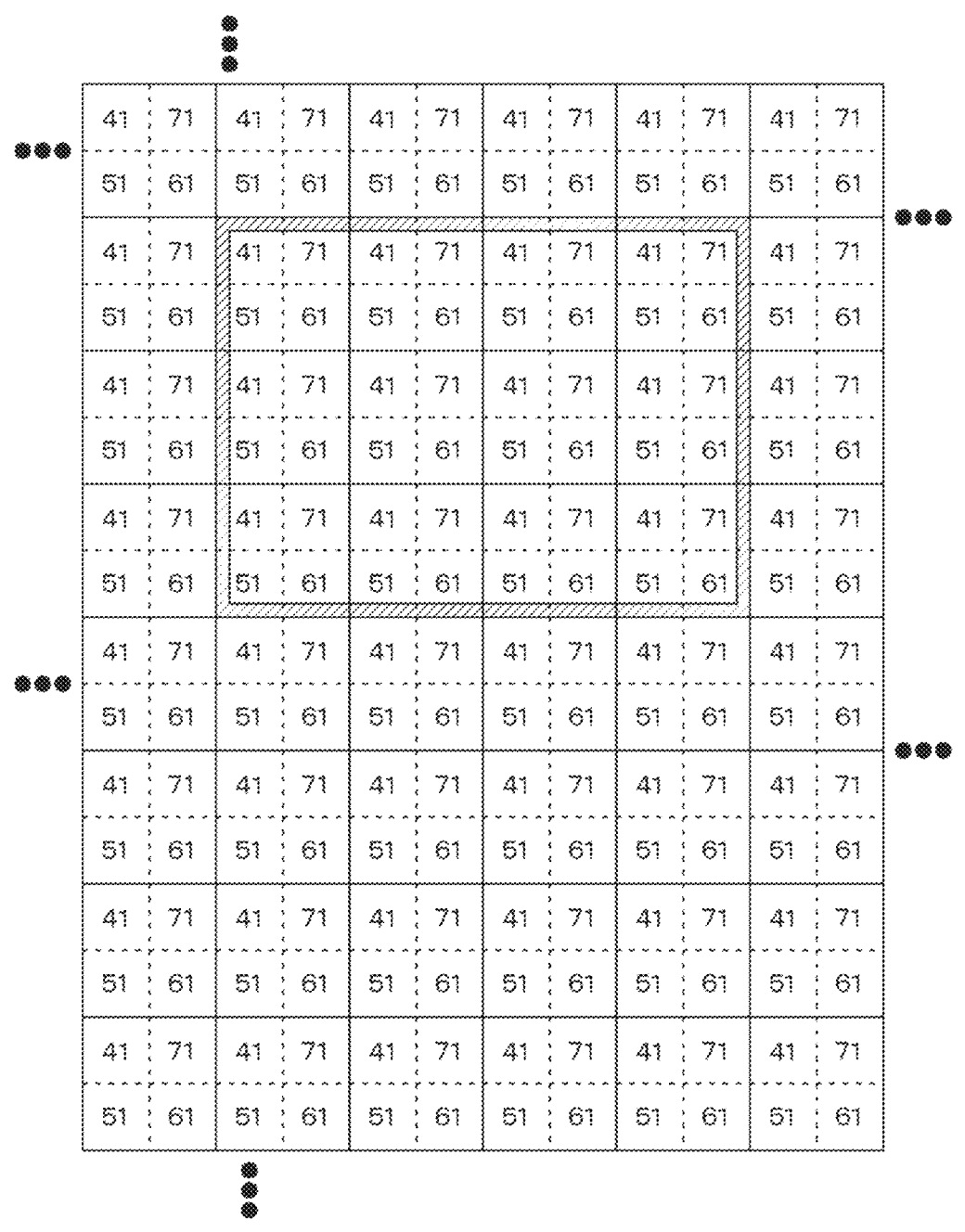

FIG. 4 is a conceptual diagram for explaining operation of the image-capturing unit of the image-capturing device of the first embodiment.

FIG. 5 is a conceptual diagram for explaining operation of the image-capturing unit of the image-capturing device of the first embodiment.

FIGS. 10A and 10B are a final output ratio of high sensitivity image data of the image-capturing device of the third embodiment, and a figure illustrating a final output ratio of low sensitivity image data, respectively.

FIGS. 18A and 18B are conceptual diagrams for explaining operation of the image-capturing unit of the image-capturing device of the sixth embodiment.

Figures 19A, 19B:
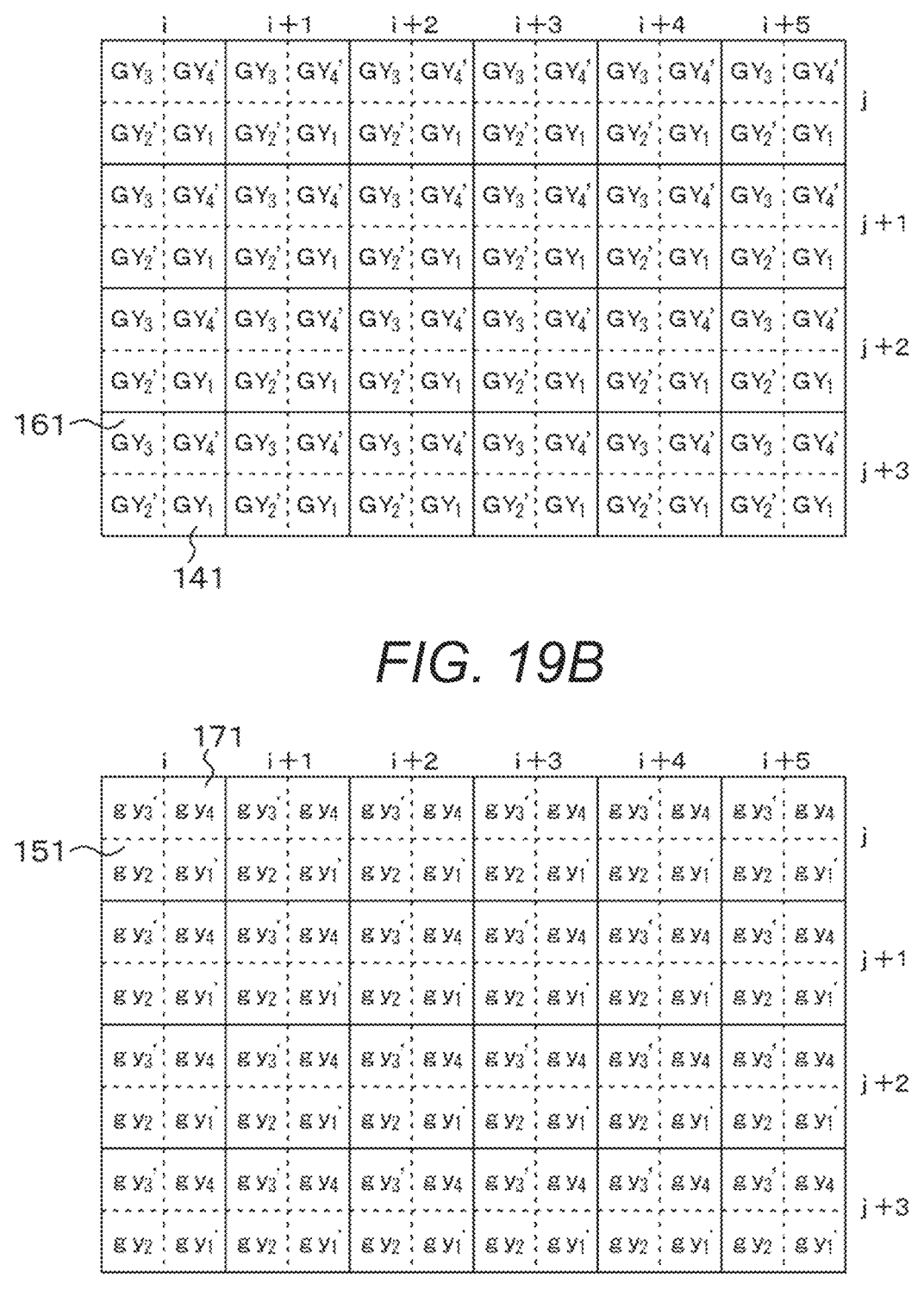

FIGS. 19A and 19B are conceptual diagrams for explaining operation of the image-capturing unit of the image-capturing device of the sixth embodiment.

FIG. 20 is a conceptual diagram for explaining operation of the image-capturing unit of the image-capturing device of the sixth embodiment.

FIG. 21 is a conceptual diagram for explaining operation of the image-capturing unit of the image-capturing device of the sixth embodiment.

FIGS. 28A and 28B are conceptual diagrams for explaining operation of the image-capturing unit of the image-capturing device according to the eleventh embodiment.

FIG. 29 is a conceptual diagram for explaining operation of the image-capturing unit of the image-capturing device according to the eleventh embodiment.

MODE FOR CARRYING OUT THE INVENTION

Figure 1A:
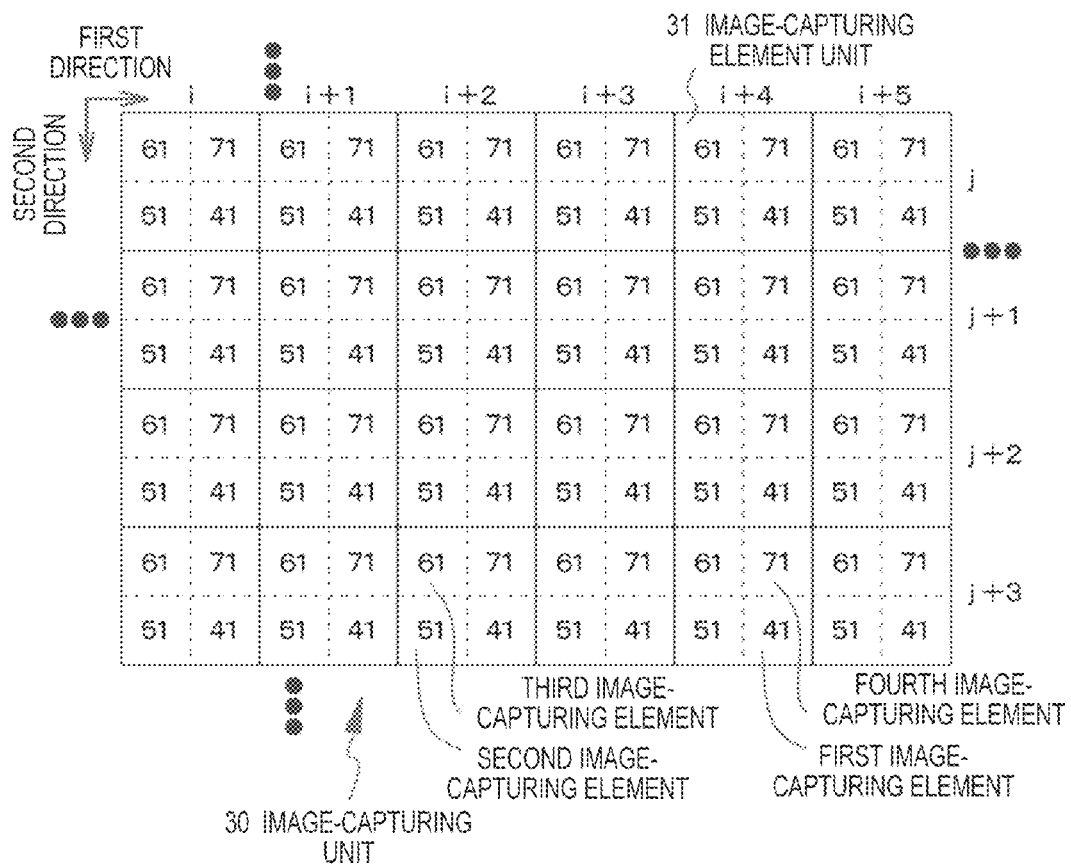
FIGS. 1A and 1B are a conceptual diagram illustrating an image-capturing unit of an image-capturing device of the first embodiment, and a figure schematically illustrating light reception characteristics of a first image-capturing element, a second image-capturing element, a third image-capturing element, and a fourth image-capturing element, respectively.

The present disclosure will be explained on the basis of embodiments with reference to drawings, but the present disclosure is not limited to the embodiments, and various numerical values and materials in the embodiments are merely examples. Explanation will be made in the following order.

1. General explanation about image-capturing device according to first aspect to fourth aspect of the present disclosure
2. First embodiment (image-capturing device according to the first aspect of the present disclosure)
3. Second embodiment (modification of first embodiment)
4. Third embodiment (another modification of first embodiment)
5. Fourth embodiment (still another modification of first embodiment)
6. Fifth embodiment (modification of first embodiment to fourth embodiment 7. Sixth embodiment (image-capturing device according to second aspect and fourth aspect of the present disclosure
8. Seventh embodiment (modification of sixth embodiment)
9. Eighth embodiment (another modification of sixth embodiment)
10. Ninth embodiment (still another modification of sixth embodiment)
11. Tenth embodiment (modification of first embodiment and sixth embodiment)
12. Eleventh embodiment (image-capturing device according to the third aspect of the present disclosure), and others

[General Explanation about Image-Capturing Device According to First Aspect to Fourth Aspect of the Present Disclosure]

In an image-capturing device according to the first aspect of the present disclosure, a first aperture portion may be formed between a first filter and a first photoelectric conversion element; a second aperture portion may be formed between a second filter and a second photoelectric conversion element; a third aperture portion may be formed between a third filter and a third photoelectric conversion element; and a fourth aperture portion may be formed between a fourth filter and a fourth photoelectric conversion element, wherein the fourth aperture portion may be smaller than the first aperture portion, the second aperture portion, and the third aperture portion. With such configuration, the quantity of light received by the fourth image-capturing element is less than the quantity of light received by the first image-capturing element, the second image-capturing element, and the third image-capturing element, and as a result, the dynamic range can be expanded. An aperture portion can be obtained by forming the aperture portion in a light shield layer formed between a filter and a photoelectric conversion element. The planar shape of the aperture portion may be a circular shape, or a regular polygonal shape (for example, a regular pentagon, a regular hexagon, a regular heptagon, and a regular octagon). It should be noted that the regular polygonal shape includes quasi-regular polygonal shapes (a regular polygonal shape of which sides are constituted by curved lines, and a regular polygonal shape of which vertexes are round). This is also applicable to an image-capturing device according to the second aspect of the present disclosure explained subsequently.

In an image-capturing device according to the second aspect of the present disclosure, the first aperture portion may be formed in a light incidence area of the first photoelectric conversion element; the second aperture portion may be formed between a neutral density filter and the second photoelectric conversion element; a third aperture portion may be formed in a light incidence area of the third photoelectric conversion element; a fourth aperture portion may be formed between the neutral density filter and the fourth photoelectric conversion element, wherein the third aperture portion may be smaller than the first aperture portion, and the fourth aperture portion may be smaller than the second aperture portion. With such configuration, the quantity of light received by the first image-capturing element is less than the quantity of light received by the third image-capturing element. In addition, the quantity of light received by the second image-capturing element is less than the quantity of light received by the fourth image-capturing element. As a result, the dynamic range can be expanded. An aperture portion can be obtained by forming the aperture portion in a light shield layer formed between a neutral density filter and a photoelectric conversion element.

In the image-capturing device according to the first aspect of the present disclosure, or the image-capturing device according to the third aspect of the present disclosure including the above preferable configurations, the image processing unit may include a first gain adjustment unit configured to adjust outputs from the first image-capturing element, the second image-capturing element, and the third image-capturing element, and a second gain adjustment unit configured to adjust an output from the fourth image-capturing element. In this case, where an adjustment coefficient for the outputs from the first image-capturing element, the second image-capturing element, and the third image-capturing element by the first gain adjustment unit is denoted as $Gn_1$, and an adjustment coefficient for the output from the fourth image-capturing element by the second gain adjustment unit is denoted as $Gn_2$, it is preferable to satisfy $Gn_1/Gn_2 \geq 1$. More specifically, examples of values of $(Gn_1/Gn_2)$ include 2, 4, 8, and the like. Even with such configuration, the dynamic range can be expanded. The value of $Gn_1/Gn_2$ may be fixed at "1" in a case where there is a small degree of difference in the brightness in an image-capturing scene, but in a case where there is great difference in the brightness in an image-capturing scene, the value of $Gn_1/Gn_2$ may be automatically or manually changed in accordance with the difference between the brightness of the high sensitivity image data in a low illumination area in the image-capturing scene and the brightness of the low sensitivity image data in a high illumination area in the image-capturing scene. This is also applicable to an image-capturing device according to the second aspect of the present disclosure explained subsequently. The adjustments of the outputs from the first image-capturing element, the second image-capturing element, and the third image-capturing element by the first gain adjustment unit may be the same, or may be different depending on cases.

In the image-capturing device according to the second aspect of the present disclosure including the above preferable configuration, the image processing unit may include a first gain adjustment unit configured to adjust outputs from the first image-capturing element and the third image-capturing element, and a second gain adjustment unit configured to adjust outputs from the second image-capturing element and the fourth image-capturing element. In this case, where an adjustment coefficient for outputs from the first image-capturing element and the third image-capturing element by the first gain adjustment unit is denoted as $Gn_1$, and an adjustment coefficient for outputs from the second image-capturing element and the fourth image-capturing element by the second gain adjustment unit is denoted as $Gn_2$, it is preferable to satisfy $Gn_1/Gn_2 \geq 1$. More specifically, examples of values of $(Gn_1/Gn_2)$ include 2, 4, 8, and the like. Even with such configuration, the dynamic range can be expanded. The adjustments of the outputs from the first image-capturing element and the third image-capturing element by the first gain adjustment unit may be the same, or may be different depending on cases. The adjustments of the outputs from the second image-capturing element and the fourth image-capturing element by the second gain adjustment unit may be the same, or may be different depending on cases.

In the image-capturing device according to the first aspect or the third aspect of the present disclosure including the various kinds of preferable configurations explained above, the image processing unit may generate N sets of high sensitivity image data and low sensitivity image data of which exposure times are different, and the image processing unit may further divide an illumination area of an image obtained from the low sensitivity image data or the high sensitivity image data into 2N levels of areas ranging from an area of which illumination is the lowest to an area of which illumination is the highest, and may generate a combined image using N sets of high sensitivity image data respectively corresponding to N levels of low illumination image areas in the N levels of low illumination image areas ranging from the area of which illumination is the lowest to the area of which illumination is the N-th lowest, and using N sets of low sensitivity image data respectively corresponding to N levels of high illumination image areas in the N levels of high illumination image areas ranging from the area of which illumination is the (N+1)-th lowest to the area of which illumination is the highest. In this case, N is 2, and there can be such relationship that the image-capturing time for obtaining the high sensitivity image data and the low sensitivity image data of the first set is twice the image-capturing time for obtaining the high sensitivity image data and the low sensitivity image data of the second set. It should be noted that such configuration can also be expanded to a case where N is equal to or more than 3. Even with such configuration, the dynamic range can be expanded. In addition, an image of which dynamic range is expanded to 2N levels from N sets of image data can be obtained, and it is easy to cope with image-capturing of a motion picture. In the conventional technique, as described above, only an image of which dynamic range is expanded to N levels from N sets of image data can be obtained.

In the image-capturing device according to the second aspect of the present disclosure including the various kinds of preferable configurations explained above, the image processing unit may generate N sets of high sensitivity image data and low sensitivity image data of which exposure times are different, and the image processing unit may further divide an illumination area of an image obtained from the low sensitivity image data or the high sensitivity image data into 2N levels of image areas ranging from an image area of which illumination is the lowest to an image area of which illumination is the highest, and may generate a combined image using N sets of high sensitivity image data respectively corresponding to N levels of low illumination image areas in N levels of low illumination image areas ranging from the image area of which illumination is the lowest to the image area of which illumination is the N-th lowest, and using N sets of low sensitivity image data respectively corresponding to N levels of high illumination image areas in the N levels of high illumination image areas ranging from the image area of which illumination is the (N+1)-th lowest to the image area of which illumination is the highest. In this case, N is 2, and there can be such relationship that the image-capturing time for obtaining the high sensitivity image data and the low sensitivity image data of the first set is twice the image-capturing time for obtaining the high sensitivity image data and the low sensitivity image data of the second set. It should be noted that such configuration can also be expanded to a case where N is equal to or more than 3. Even with such configuration, the dynamic range can be expanded. In addition, an image of which dynamic range is expanded to 2N levels from N sets of image data can be obtained, and it is easy to cope with image-capturing of a motion picture. In the conventional technique, as described above, only an image of which dynamic range is expanded to N levels from N sets of image data can be obtained.

In the image-capturing device according to the first aspect or the third aspect of the present disclosure including the various kinds of preferable configurations explained above, a gap may not exist between the first filter, the second filter, the third filter, and the fourth filter. Such configuration can be easily achieved by using an exposure mask with a corner serif pattern when at least one of the filters of the first filter, the second filter, the third filter, and the fourth filter is formed using a photolithography technique.

Further, in the image-capturing device according to the first aspect or the third aspect of the present disclosure including the various kinds of preferable configurations explained above, the fourth filter may be configured to have a three-layer stacked layer structure including a first material layer made of a first material constituting a first filter, a second material layer made of a second material constituting a second filter, and a third material layer made of a third material constituting a third filter. Alternatively, the fourth filter may be configured to be made of a material made by mixing the first material constituting the first filter, the second material constituting the second filter, and the third material constituting the third filter. Alternatively, the fourth filter may be configured to have a two-layer stacked layer structure including a first material layer made of a first material constituting a first filter and a third material layer made of a third material constituting a third filter. Alternatively, the fourth filter may be configured to be made of a material made by mixing the first material constituting the first filter and the third material constituting the third filter. In such case, the spectral characteristic of the fourth filter is, for example, spectral characteristic such as magenta. Alternatively, the fourth filter may be a material constituting an on-chip lens having almost uniform spectral transmission rate over the visible light range, or a transparent material having a spectral transmission rate characteristic suitable for spectral visual sensitivity characteristics of a human.

In the image-capturing device according to the second aspect of the present disclosure including the various kinds of preferable configurations explained above, the neutral density filter may be configured to have a spectral characteristic equal to the spectral characteristic of the filter made by stacking the first filter and the third filter. In the image-capturing device according to the fourth aspect of the present disclosure, the neutral density filter may be configured to have a spectral characteristic equal to the spectral characteristic the neutral density filter may be configured to have a three-layer stacked layer structure including the first material layer made of the first material constituting the first filter, the second material layer made of the second material constituting the second filter, and the third material layer made of the third material constituting the third filter of the image-capturing device according to the first aspect or the third aspect of the present disclosure. Alternatively, the neutral density filter may be configured to be made of a material made by mixing the first material constituting the first filter, the second material constituting the second filter, and the third material constituting the third filter of the image-capturing device according to the first aspect or the third aspect of the present disclosure. Alternatively, a material constituting an on-chip lens having almost uniform spectral transmission rate over the visible light range, or a transparent material suitable for spectral visual sensitivity characteristics of a human can be exemplified as a fourth filter.

In the image-capturing device according to the first aspect or the third aspect of the present disclosure, the first wavelength band may be, for example, a wavelength band such as 350 nm to 550 nm (mainly a wavelength band for blue color), and the peak wavelength band of the first wavelength band may be, for example, 430 nm to 480 nm. The second wavelength band may be, for example, a wavelength band such as 450 nm to 650 nm (mainly a wavelength band for green color), and the peak wavelength band of the second wavelength band may be, for example, 500 nm to 550 nm. The third wavelength band may be, for example, a wavelength band such as 550 nm to 750 nm (mainly a wavelength band for red color), and the peak wavelength band of the third wavelength band may be, for example, 580 nm to 620 nm. However, the embodiments are not limited thereto. In some cases, the filter may be a color filter for passing a particular wavelength such as cyan, magenta, and yellow.

In the image-capturing device according to the first aspect of the present disclosure, an arrangement of four image-capturing elements in one image-capturing element unit may be Bayer arrangement. More specifically, the image-capturing element units are arranged in a two-dimensional matrix form, and in a case where the image-capturing element units are arranged in a first direction and a second direction perpendicular to the first direction, for example, the image-capturing elements are arranged in any given image-capturing element unit as follows: the third image-capturing element and the fourth image-capturing element are arranged adjacently to each other along the first direction, the first image-capturing element and the second image-capturing element are arranged adjacently to each other along the first direction, the first image-capturing element and the fourth image-capturing element are arranged adjacently to each other along the second direction, and the second image-capturing element and the third image-capturing element are arranged adjacently to each other along the second direction. In the image-capturing device according to the third aspect of the present disclosure, an arrangement of four image-capturing elements in one image-capturing element sub-unit may be Bayer arrangement. More specifically, for example, in one image-capturing element sub-unit, the third image-capturing element and the fourth image-capturing element are arranged adjacently to each other along the first direction, the first image-capturing element and the second image-capturing element are arranged adjacently to each other along the first direction, the first image-capturing element and the fourth image-capturing element are arranged adjacently to each other along the second direction, and the second image-capturing element and the third image-capturing element are arranged adjacently to each other along the second direction. Further, in the image-capturing device according to the second aspect of the present disclosure, an arrangement of four image-capturing elements in one image-capturing element unit may be an arrangement similar to the Bayer arrangement. More specifically, for example, in any given image-capturing element unit, the third image-capturing element and the fourth image-capturing element are arranged adjacently to each other along the first direction, the first image-capturing element and the second image-capturing element are arranged adjacently to each other along the first direction, the first image-capturing element and the fourth image-capturing element are arranged adjacently to each other along the second direction, and the second image-capturing element and the third image-capturing element are arranged adjacently to each other along the second direction.

In the image-capturing device according to the first aspect or the third aspect of the present disclosure, the fourth image-capturing element may receive light in the first wavelength band, the second wavelength band, and the third wavelength band. In other words, this can also be said to be receiving light in the visible light range.

In the image-capturing device according to the first aspect or the third aspect of the present disclosure, the light transmission rate of the fourth filter may be less than the light transmission rate of the first filter, the light transmission rate of the second filter, and the light transmission rate of the third filter, and more specifically, where the light transmission rate of the fourth filter is denoted as $T_4$, and an average value of the light transmission rate of the first filter, the light transmission rate of the second filter, and the light transmission rate of the third filter is denoted as $T_{123}$, for example, the light transmission rate of the fourth filter is configured to satisfy $0.01 \leq T_4/T_{123} \leq 0.25$.

In the image-capturing device according to the first aspect or the third aspect of the present disclosure, in a case where the difference between the average luminance of the high sensitivity image data in the low illumination area in the image-capturing scene and the average luminance of the low sensitivity image data in the high illumination area in the image-capturing scene is equal to or more than a predetermined value, the combined image may be generated using the high sensitivity image data corresponding to the low illumination image area in the low illumination image area obtained from the low sensitivity image data or the high sensitivity image data and using the low sensitivity image data corresponding to the high illumination image area in the high illumination image area obtained from the low sensitivity image data or the high sensitivity image data, and on the other hand, in a case where the difference between the average luminance of the high sensitivity image data and the average luminance of the low sensitivity image data is less than a predetermined value, the image can also be obtained using only the high sensitivity image data corresponding to the low illumination image area.

In the image-capturing device according to the first aspect of the present disclosure, the second image-capturing element may be assumed to be located in an area where the fourth image-capturing element is located, and an output that may be considered to be output by the second image-capturing element that is assumed as above (for the sake of convenience, this will be referred to as "assumed second image-capturing element") is interpolated from an output from a second image-capturing element adjacent to the assumed second image-capturing element, so that it is preferable to obtain an output equivalent to an output from an image-capturing element in an ordinary image-capturing device of the Bayer arrangement (one red image-capturing element, two green image-capturing elements, and one blue image-capturing element. This is also applicable to the following cases). Such interpolation processing will be referred to as "interpolation processing of assumed second image-capturing element" for the sake of convenience. The fourth image-capturing element may be assumed to be located in an area where the first image-capturing element is located, and an output that may be considered to be output by the fourth image-capturing element that is assumed as above (for the sake of convenience, this will be referred to as "assumed first (fourth) image-capturing element") may be interpolated from an output of a fourth image-capturing element adjacent to the assumed first (fourth) image-capturing element, the fourth image-capturing element may be assumed to be located in an area where the second image-capturing element is located, and an output that may be considered to be output by the fourth image-capturing element that is assumed as above (for the sake of convenience, this will be referred to as "assumed second (fourth) image-capturing element") may be interpolated from an output of a fourth image-capturing element adjacent to the assumed second (fourth) image-capturing element, and the fourth image-capturing element may be assumed to be located in an area where the third image-capturing element is located, and an output that may be considered to be output by the fourth image-capturing element that is assumed as above (for the sake of convenience, this will be referred to as "assumed third (fourth) image-capturing element") may be interpolated from an output of a fourth image-capturing element adjacent to the assumed third (fourth) image-capturing element, so that it is preferable to obtain an output based on the fourth image-capturing element similar to an output from an image-capturing element in an ordinary image-capturing device of the Bayer arrangement. With the above interpolation processing, the data configuration and the data structure of the low sensitivity image data and the data configuration and the data structure of the high sensitivity image data can be configured to be the same while the original number of pixels is not changed, and therefore, various kinds of signal processing can be simplified.

In the image-capturing device according to the second aspect of the present disclosure, the fourth image-capturing element may be assumed to be located in an area where the first image-capturing element is located, and an output that may be considered to be output by the fourth image-capturing element that is assumed as above (for the sake of convenience, this will be referred to as "assumed first (fourth) image-capturing element") may be interpolated from an output of a fourth image-capturing element adjacent to the assumed first (fourth) image-capturing element, the fourth image-capturing element may be assumed to be located in an area where the second image-capturing element is located, and an output that may be considered to be output by the fourth image-capturing element that is assumed as above (for the sake of convenience, this will be referred to as "assumed second (fourth) image-capturing element") may be interpolated from an output of a fourth image-capturing element adjacent to the assumed second (fourth) image-capturing element, and the fourth image-capturing element may be assumed to be located in an area where the third image-capturing element is located, and an output that may be considered to be output by the fourth image-capturing element that is assumed as above (for the sake of convenience, this will be referred to as "assumed third (fourth) image-capturing element") may be interpolated from an output of a fourth image-capturing element adjacent to the assumed third (fourth) image-capturing element, so that it is preferable to obtain an output based on the fourth image-capturing element similar to an output from an image-capturing element in an ordinary image-capturing device of the Bayer arrangement. Likewise, the third image-capturing element may be assumed to be located in an area where the first image-capturing element is located, and an output that may be considered to be output by the third image-capturing element that is assumed as above (for the sake of convenience, this will be referred to as "assumed first (third) image-capturing element") may be interpolated from an output of a third image-capturing element adjacent to the assumed first (third) image-capturing element, the third image-capturing element may be assumed to be located in an area where the second image-capturing element is located, and an output that may be considered to be output by the third image-capturing element that is assumed as above (for the sake of convenience, this will be referred to as "assumed second (third) image-capturing element") may be interpolated from an output of a third image-capturing element adjacent to the assumed second (third) image-capturing element, and the third image-capturing element may be assumed to be located in an area where the fourth image-capturing element is located, and an output that may be considered to be output by the third image-capturing element that is assumed as above (for the sake of convenience, this will be referred to as "assumed fourth (third) image-capturing element") may be interpolated from an output of a third image-capturing element adjacent to the assumed fourth (third) image-capturing element, so that it is preferable to obtain an output based on the third image-capturing element similar to an output from an image-capturing element in an ordinary image-capturing device of the Bayer arrangement. Likewise, the second image-capturing element may be assumed to be located in an area where the first image-capturing element is located, and an output that may be considered to be output by the second image-capturing element that is assumed as above (for the sake of convenience, this will be referred to as "assumed first (second) image-capturing element") may be interpolated from an output of a second image-capturing element adjacent to the assumed first (second) image-capturing element, the second image-capturing element may be assumed to be located in an area where the third image-capturing element is located, and an output that may be considered to be output by the second image-capturing element that is assumed as above (for the sake of convenience, this will be referred to as "assumed third (second) image-capturing element") may be interpolated from an output of a second image-capturing element adjacent to the assumed third (second) image-capturing element, and the second image-capturing element may be assumed to be located in an area where the fourth image-capturing element is located, and an output that may be considered to be output by the second image-capturing element that is assumed as above (for the sake of convenience, this will be referred to as "assumed fourth (second) image-capturing element") may be interpolated from an output of a second image-capturing element adjacent to the assumed fourth (second) image-capturing element, so that it is preferable to obtain an output based on the second image-capturing element similar to an output from an image-capturing element in an ordinary image-capturing device of the Bayer arrangement. Likewise, the first image-capturing element may be assumed to be located in an area where the second image-capturing element is located, and an output that may be considered to be output by the first image-capturing element that is assumed as above (for the sake of convenience, this will be referred to as "assumed second (first) image-capturing element") may be interpolated from an output of a first image-capturing element adjacent to the assumed second (first) image-capturing element, the first image-capturing element may be assumed to be located in an area where the third image-capturing element is located, and an output that may be considered to be output by the first image-capturing element that is assumed as above (for the sake of convenience, this will be referred to as "assumed third (first) image-capturing element") may be interpolated from an output of a first image-capturing element adjacent to the assumed third (first) image-capturing element, and the first image-capturing element may be assumed to be located in an area where the fourth image-capturing element is located, and an output that may be considered to be output by the first image-capturing element that is assumed as above (for the sake of convenience, this will be referred to as "assumed fourth (first) image-capturing element") may be interpolated from an output of a first image-capturing element adjacent to the assumed fourth (first) image-capturing element, so that it is preferable to obtain an output based on the first image-capturing element similar to an output from an image-capturing element in an ordinary image-capturing device of the Bayer arrangement. With the above interpolation processing, the data configuration and the data structure of the low sensitivity image data and the data configuration and the data structure of the high sensitivity image data can be configured to be the same while the original number of pixels is not changed, and therefore, various kinds of signal processing can be simplified.

In the image-capturing device according to the third aspect of the present disclosure, where a total output of a cluster including four first image-capturing elements of four image-capturing element sub-units is referred to as "first image-capturing element cluster output," a total output of a cluster including four second image-capturing elements thereof is referred to as "second image-capturing element cluster output," and a total output of a cluster including four third image-capturing elements thereof is referred to as "third image-capturing element cluster output," "the interpolation processing of the assumed second image-capturing element" mentioned above may be performed on the basis of the first image-capturing element cluster output, the second image-capturing element cluster output, and the third image-capturing element cluster output. Accordingly, an output equivalent to the output from image-capturing elements in an ordinary image-capturing device of the Bayer arrangement (one red image-capturing element, two green image-capturing elements, and one blue color image-capturing element) can be obtained from the first image-capturing element cluster output, the second image-capturing element cluster output, and the third image-capturing element cluster output. An output equivalent to outputs from four image-capturing elements in an ordinary image-capturing device of the Bayer arrangement can be obtained without performing adding processing on the basis of the fourth image-capturing element constituting the first image-capturing element sub-unit, the fourth image-capturing element constituting the second image-capturing element sub-unit, the fourth image-capturing element constituting the third image-capturing element sub-unit, and the fourth image-capturing element constituting the fourth image-capturing element sub-unit. Accordingly, the data configuration and the data structure of the low sensitivity image data obtained from ¼ of the original number of pixels can be the same as the data configuration and the data structure of the high sensitivity image data, and various kinds of signal processing can be simplified. The high sensitivity image data are subjected to the four-pixel adding processing, but the low sensitivity image data are not subjected to the adding processing. Therefore, there is an advantage in that the sensitivity difference can be increased to four times.

In the image-capturing device according to the fourth aspect of the present disclosure, the second image-capturing element may be assumed to be located in an area where the first image-capturing element is located, and an output that may be considered to be output by the second image-capturing element that is assumed as above (for the sake of convenience, this will be referred to as "assumed first image-capturing element") may be interpolated from an output of a second image-capturing element adjacent to the assumed first image-capturing element, and the first image-capturing element may be assumed to be located in an area where the second image-capturing element is located, and an output that may be considered to be output by the first image-capturing element that is assumed as above (for the sake of convenience, this will be referred to as "assumed first image-capturing element") may be interpolated from an output of a second image-capturing element adjacent to the assumed first image-capturing element, so that low sensitivity image data and high sensitivity image data can be obtained.

In the image-capturing device according to the first aspect to the fourth aspect of the present disclosure, a low illumination image area and a high illumination image area are obtained from the low sensitivity image data or the high sensitivity image data, and in a case where the luminance value of the high sensitivity image data in any given illumination area is saturated, or close to saturation, this area is determined to be a high illumination area, and the luminance value of the low sensitivity image data is used. The method for deriving the low illumination image area and the high illumination image area may be a well-known method.

With the image-capturing device according to the first aspect or the third aspect of the present disclosure, a single-color (gray) image can also be obtained. In this case, the first gain adjustment unit may perform gain adjustment on the outputs from the first image-capturing element, the second image-capturing element, and the third image-capturing element, and the spectral characteristic based on the outputs preferably match the spectral characteristic of the fourth filter provided in the fourth image-capturing element.

Examples of photoelectric conversion elements include a CCD element, a CMOS image sensor, a CIS (Contact Image Sensor), a CMD (Charge Modulation Device)-type signal amplification image sensor. Examples of image-capturing elements include a front-illuminated image-capturing element and a back-illuminated image-capturing element. Further, the image-capturing device according to the present disclosure may constitute, for example, a digital still camera, a video camera, a camcorder, a so-called camera-equipped cellular phone. The image-capturing device may have a lens system. The lens system may be a single-focus lens or a so-called zoom lens. The configuration and the structure of the lens and the lens system may be determined on the basis of the specification required for the lens system.

First Embodiment

Figure 1B:
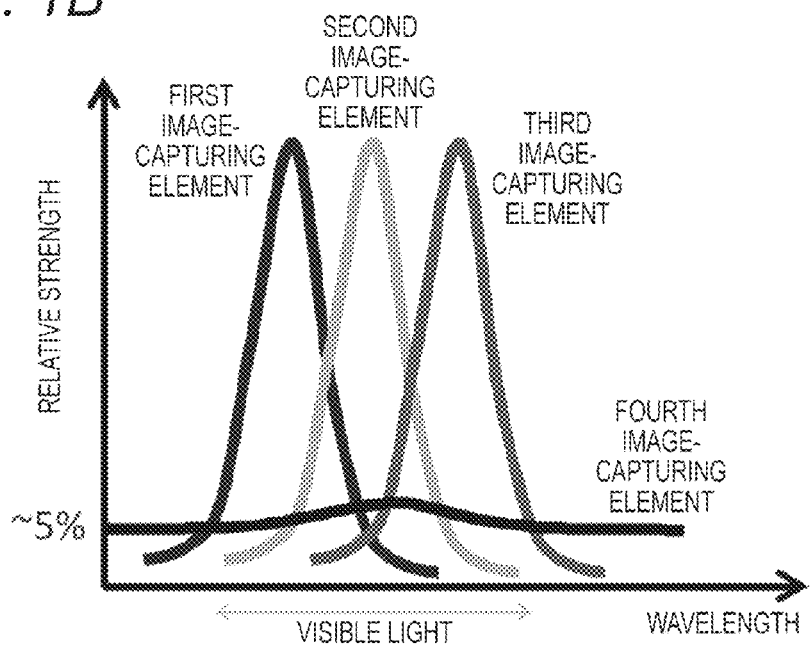
Figure 5:
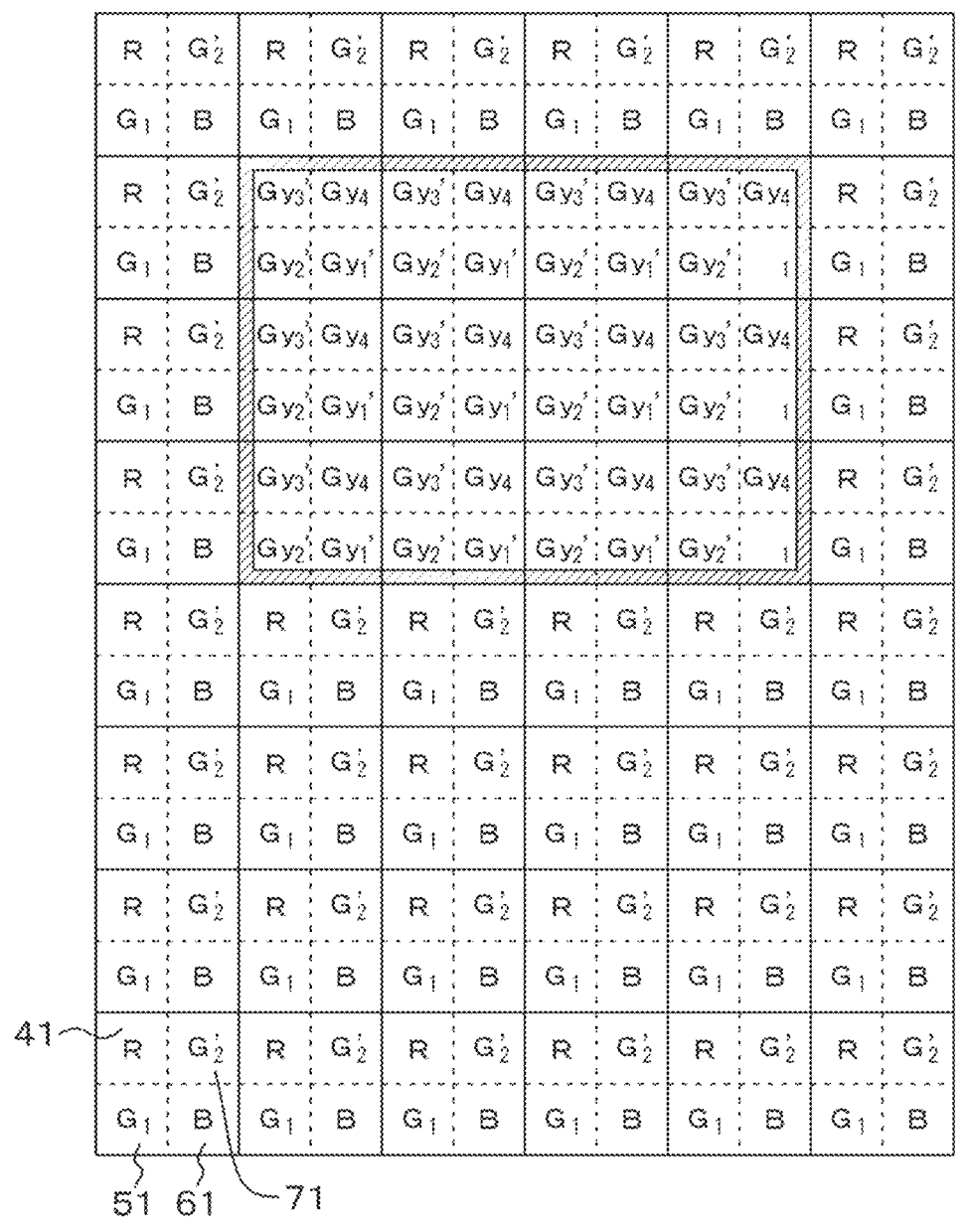
Figure 6:
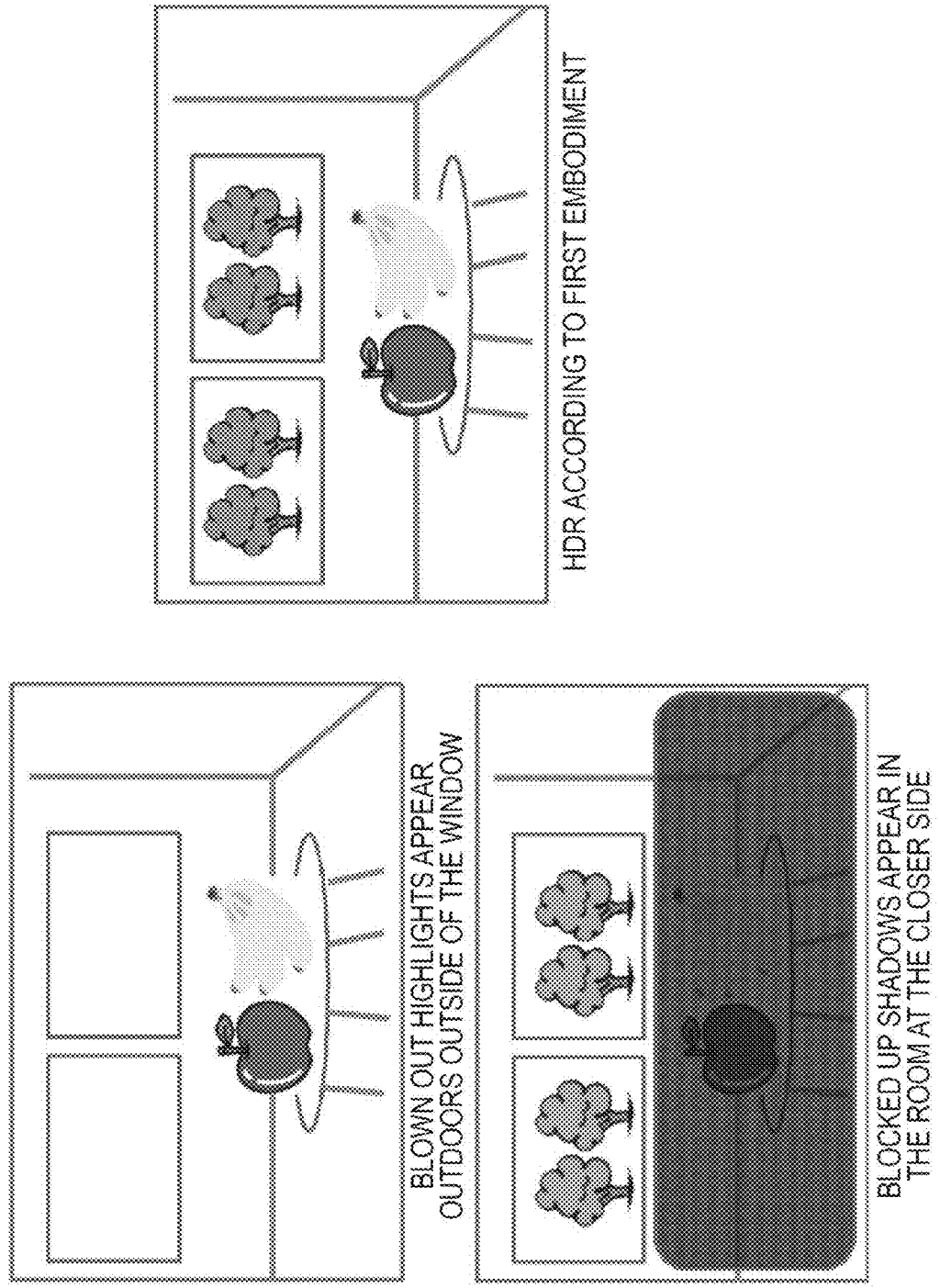
FIG. 6 is a figure schematically illustrating an image-capturing state of the image-capturing device of the first embodiment.
Figure 7A:
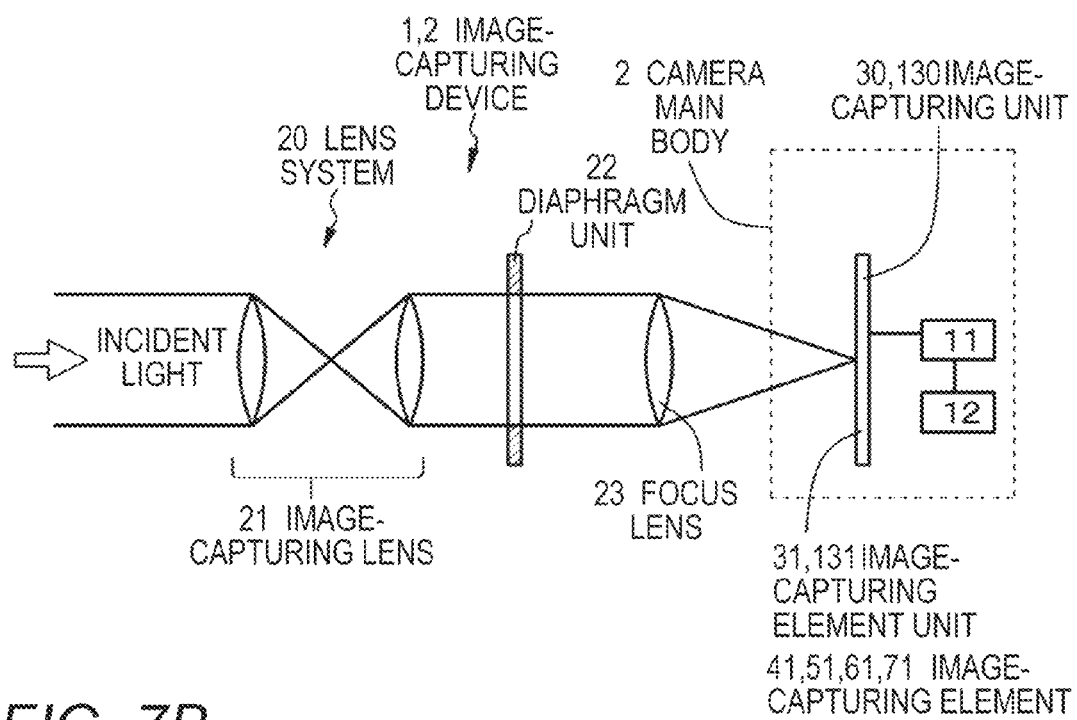
FIGS. 7A and 7B are a conceptual diagram of the image-capturing device of the first embodiment, and a schematic partial cross sectional view illustrating an image-capturing element, respectively.
Figure 7B:
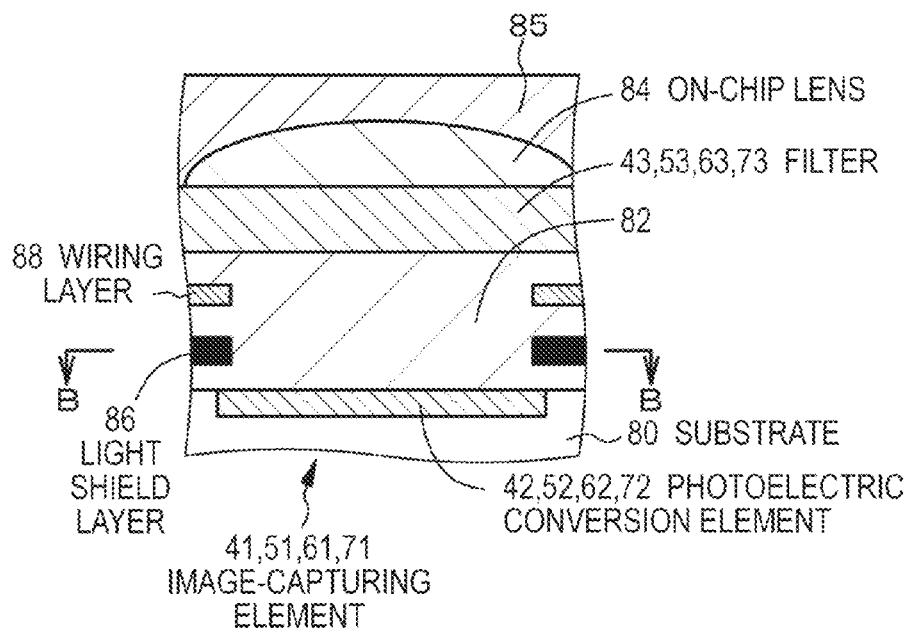

The first embodiment relates to the image-capturing device according to the first aspect of the present disclosure. A conceptual diagram of the image-capturing unit of the image-capturing device of the first embodiment is shown in FIG. 1A. A conceptual diagram for explaining operation of the image-capturing unit is shown in FIG. 2A, FIG. 2B, FIG. 3A, FIG. 3B, FIG. 4 and FIG. 5. A conceptual diagram of the image-capturing device is shown in FIG. 7A. A schematic partial cross sectional view of an image-capturing element is shown in FIG. 7B. light reception characteristics of the first image-capturing element, the second image-capturing element, the third image-capturing element, and the fourth image-capturing element are schematically shown in FIG. 1B. Further, the image-capturing state of the image-capturing device of the first embodiment is schematically shown in FIG. 6.

The image-capturing device 1 of the first embodiment is an image-capturing device for obtaining a combined image in which a portion of the image is a single-color image and the remaining portion thereof is a color image. In FIG. 7B, the image-capturing device 1 of the first embodiment includes an image-capturing unit 30 and an image processing unit 11, wherein the image-capturing unit 30 includes image-capturing element units 31 arranged in a two-dimensional matrix form, and each of the image-capturing element units 31 includes: a first image-capturing element 41 including a first filter 43 and a first photoelectric conversion element 42, and configured to receive light in a first wavelength band, a second image-capturing element 51 including a second filter 53 and a second photoelectric conversion element 52, and configured to receive light in a second wavelength band having a peak wavelength longer than a peak wavelength of the first wavelength band, a third image-capturing element 61 including a third filter 63 and a third photoelectric conversion element 62, and configured to receive light in a third wavelength band having a peak wavelength longer than a peak wavelength of the second wavelength band, and a fourth image-capturing element 71 including a fourth filter 73 and a fourth photoelectric conversion element 72, and configured to receive light in the first wavelength band, the second wavelength band, and the third wavelength band. It should be noted that the number of pixels of the image-capturing unit 30 is, for example, VGA (640×480), and the image-capturing unit 30 captures a motion picture. This is applicable to image-capturing devices in the following embodiments.

In this case, although not limited to the following configuration, the first wavelength band is 350 nm to 550 nm (mainly blue color wavelength band), and the peak wavelength of the first wavelength band is 450 nm, and the first image-capturing element 41 is a blue color image-capturing element; the second wavelength band is 450 nm to 650 nm (mainly green color wavelength band), and the peak wavelength of the second wavelength band is 530 nm, and the second image-capturing element 51 is a green color image-capturing element. Further, the third wavelength band is 550 nm to 750 nm (mainly red color wavelength band), and the peak wavelength of the third wavelength band is 600 nm, and the third image-capturing element 61 is a red color image-capturing element.

The light transmission rate of the fourth filter 73 that functions as an ND filter (Neutral Density Filter) is less than the light transmission rate of the first filter 43, the light transmission rate of the second filter 53, and the light transmission rate of the third filter 63. Alternatively, the sensitivity of the fourth image-capturing element 71 is less than the sensitivities of the first image-capturing element 41, the second image-capturing element 51, and the third image-capturing element 61. FIG. 1B schematically illustrates the light reception characteristics of the first image-capturing element, the second image-capturing element, the third image-capturing element, and the fourth image-capturing element. More specifically, where the light transmission rate of the fourth filter 73 is denoted as $T_4$, and the average value of the light transmission rate of the first filter 43, the light transmission rate of the second filter 53, and the light transmission rate of the third filter 63 is denoted as $T_{123}$, $T_4/T_{123} \approx 0.05$ holds, although the light reception characteristics are not limited thereto. The fourth filter 73 is made of a material obtained by mixing a pigment-based first material constituting the first filter 43, a pigment-based second material constituting the second filter 53, and a pigment-based third material constituting the third filter 63, or the fourth filter 73 is made of a material obtained by mixing a pigment-based first material constituting the first filter 43 and a pigment-based third material constituting the third filter 63. The thickness of the fourth filter 73 is about 1 μm, and the fourth filter 73 can be formed on the basis of ordinary lithography technique by ultraviolet irradiation. The fourth image-capturing element 71 is a gray image-capturing element, and the output from the fourth image-capturing element 71 is gray gradation information without any color information.

For example, the image-capturing elements 41, 51, 61, 71 have photoelectric conversion elements 42, 52, 62, 72 provided on a silicon semiconductor substrate 80 as shown in the partial cross sectional view of FIG. 7B, and further, a first planarization film 82, filters 43, 53, 63, 73, an on-chip lens 84, and a second planarization film 85 are stacked thereon. It should be noted that reference numeral 86 denotes a light shield layer, and reference numeral 88 denotes a wiring layer.

The photoelectric conversion elements 42, 52, 62, 72 are made of, for example, CMOS image sensors. Further, for example, a video camera and the like are constituted by the image-capturing device of the first embodiment. As shown in the conceptual diagram of FIG. 7A, the image-capturing device 1 has a lens system 20. In the lens system 20, an image-capturing lens 21, a diaphragm unit 22, and an imaging lens 23 are accommodated in the lens barrel, and function as the zoom lens. The image-capturing lens 21 is a lens for condensing incidence light from a subject. The image-capturing lens 21 includes, for example, a focus lens for focus and a zoom lens for enlarging a subject, and in general, the image-capturing lens 21 is achieved by a combination of multiple lenses for correcting chromatic aberration and the like. The diaphragm unit 22 has a narrowing down function for adjusting the quantity of light condensed, and in general, the diaphragm unit 22 is constituted by a combination of multiple diaphragm blades in a plate-like shape. At least at the position of the diaphragm unit 22, the light from any given point of the subject becomes parallel light. The imaging lens 23 focuses the light onto the image-capturing unit 30. The image-capturing unit 30 is provided inside of a camera main body 2. The camera main body 2 includes not only the image-capturing unit 30 but also, for example, an image processing unit 11 and an image storage unit 12. Then, image data are formed on the basis of an output (electric signal) from the image-capturing unit 30. The image processing unit 11 constituted by a well-known circuit converts an electric signal which is output from the image-capturing unit 30 into image data, and records the image data to a well-known image storage unit 12. It should be noted that a band pass filter (not shown) for shielding light other than visible light is provided above the image-capturing element, or a seal glass surface of an image-capturing element package, or in a lens barrel.

As shown in FIG. 1A, in the image-capturing device 1 of the first embodiment, the arrangement of four image-capturing elements 41, 51, 61, 71 (indicated by squares of solid lines and dotted lines in FIG. 1A) of any given image-capturing element unit 31 (indicated by square of solid line in FIG. 1A) is Bayer arrangement. More specifically, the image-capturing element units 31 are arranged in a two-dimensional matrix form, but the image-capturing element units 31 are arranged in the first direction and the second direction perpendicular to the first direction, and in any given image-capturing element unit 31, the image-capturing elements 41, 51, 61, 71 are arranged as follows: the third image-capturing element 61 and the fourth image-capturing element 71 are arranged adjacently to each other along the first direction, the first image-capturing element 41 and the second image-capturing element 51 are arranged adjacently to each other in the first direction, the first image-capturing element 41 and the fourth image-capturing element 71 are arranged adjacently to each other in the second direction, and the second image-capturing element 51 and the third image-capturing element 61 are arranged adjacently to each other in the second direction.

Then, the image processing unit 11 generates high sensitivity image data from outputs of the first image-capturing element 41, the second image-capturing element 51, and the third image-capturing element 61, and generates low sensitivity image data from an output from the fourth image-capturing element 71.

Figures 2A, 2B:
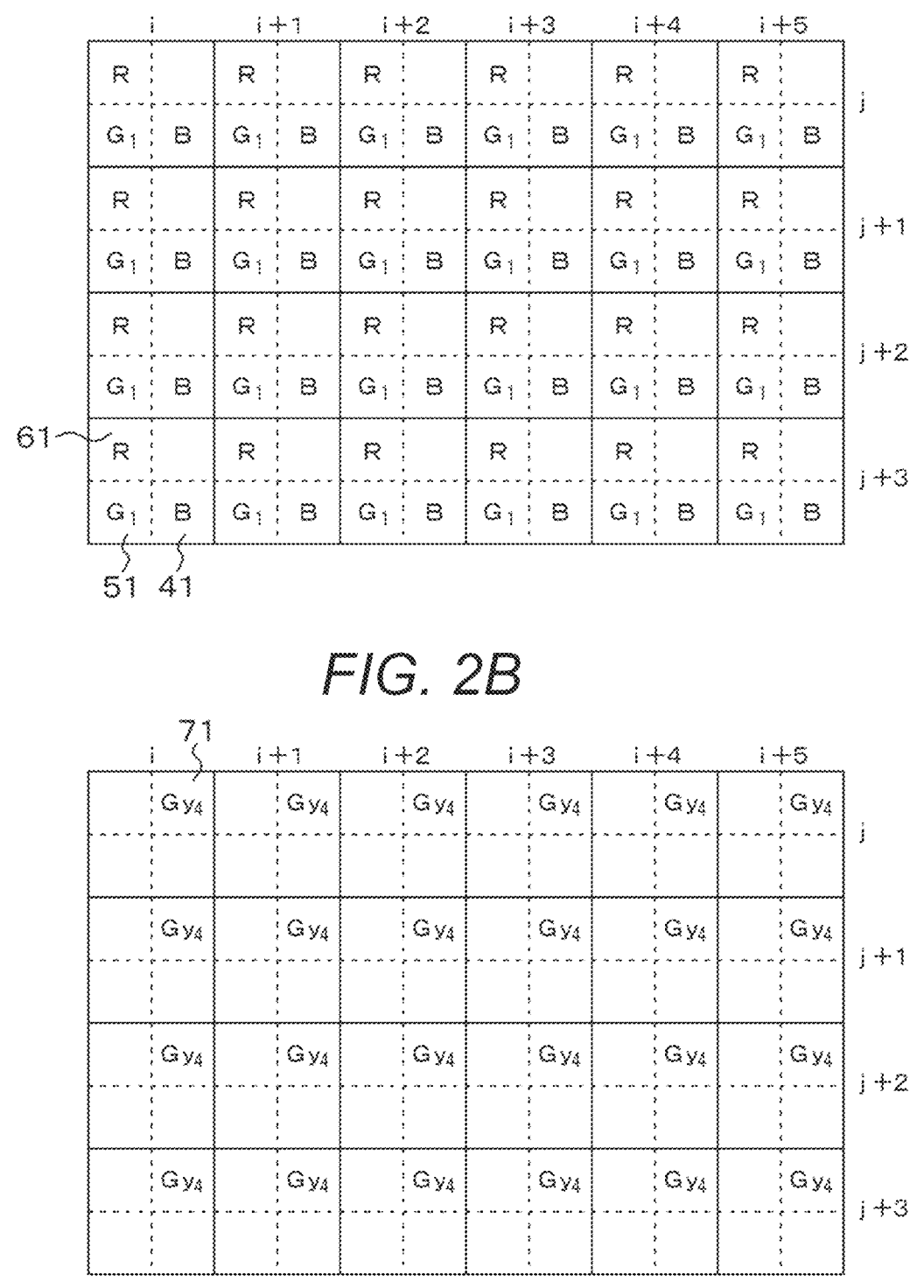

More specifically, when a certain image-capturing scene is captured, the first image-capturing element 41, the second image-capturing element 51, and the third image-capturing element 61 output signal values "B", "$G_1$", "R," respectively, as shown in FIG. 2A. On the other hand, the fourth image-capturing element 71 outputs the signal value "$Gy_4$" as shown in FIG. 2B.

The light reception sensitivities of the first photoelectric conversion element 42 constituting the first image-capturing element 41, the second photoelectric conversion element 52 constituting the second image-capturing element 51, and the third photoelectric conversion element 62 constituting the third image-capturing element 61 are equally "1" for the sake of convenience and for simplifying the explanation. The light reception sensitivity of the fourth photoelectric conversion element 72 constituting the fourth image-capturing element 71 is "⅛" for the sake of convenience. This is considered to be also applicable to the following explanation. More specifically, the ratio between the average accumulation electrical-charge quantity of the first image-capturing element 41, the second image-capturing element 51, and the third image-capturing element 61 and the accumulation electrical-charge quantity of the fourth image-capturing element 71 is 8:1 (18 dB). Due to the sensitivity difference of 18 dB, low sensitivity image data for three levels of exposure are obtained. This is basically also applicable to the following explanation.

Each image-capturing element having received the light in the state as shown in FIGS. 2A and 2B transmits an output (electric signal) based on the received light quantity to the image processing unit 11. In the image processing unit 11, for example, the interpolation processing is performed on the basis of the following method.

More specifically, the second image-capturing element 51 is assumed to be located in an area where the fourth image-capturing element 71 is located, and an output that may be considered to be output from the second image-capturing element 51 that has been assumed (assumed second image-capturing element 51) is interpolated from an output from a second image-capturing element 51 adjacent to the assumed second image-capturing element 51. For example, in FIG. 2A, an output that may be considered to be output from the (i+1, j+1)-th assumed second image-capturing element 51 is derived as an average value "$G'_2$" of outputs from four image-capturing elements, that is, a (i+1, j)-th second image-capturing element 51, a (i+2, j)-th second image-capturing element 51, a (i+1, j+1)-th second image-capturing element 51, and a (i+2, j+1)-th second image-capturing element 51. A reference symbol having an apostrophe " ' " attached thereto basically indicates an output obtained by interpolation. In this manner, outputs (R, $G_1$, $G'_2$, B) equivalent to the outputs from the image-capturing elements in an ordinary image-capturing device of the Bayer arrangement (one red color image-capturing element, two green color image-capturing elements, and one blue color image-capturing element) can be obtained (see FIG. 3A), and the high sensitivity image data can be obtained from the entire obtained outputs.

On the other hand, the fourth image-capturing element 71 is assumed to be located in an area where the first image-capturing element 41 is located, and an output "$Gy_1$" that may be considered to be output from the fourth image-capturing element 71 that has been assumed (assumed first (fourth) image-capturing element) is interpolated from an output from a fourth image-capturing element 71 adjacent to the assumed first (fourth) image-capturing element. More specifically, for example, the output value "$Gy'_1$" from the (i+1, j+1)-th assumed first (fourth) image-capturing element is derived from an average value of the outputs from the (i+1, j+1)-th fourth image-capturing element 71 and the (i+1, j+2)-th fourth image-capturing element 71. The fourth image-capturing element 71 is assumed to be located in an area where the second image-capturing element 51 is located, and an output that may be considered to be output from the fourth image-capturing element 71 that has been assumed (assumed second (fourth) image-capturing element) is interpolated from an output from a fourth image-capturing element 71 adjacent to the assumed second (fourth) image-capturing element. More specifically, the output value "$Gy'_2$" of the (i+1, j+1)-th assumed second (fourth) image-capturing element is derived from an average value of outputs from the (i, j+1)-th fourth image-capturing element 71, the (i+1, j+1)-th fourth image-capturing element 71, the (i, j+2)-th fourth image-capturing element 71, and, the (i+1, j+2)-th fourth image-capturing element 71. Further, the fourth image-capturing element 71 is assumed to be located in an area where the third image-capturing element 61 is located, and an output that may be considered to be output from the fourth image-capturing element 71 that has been assumed (assumed third (fourth) image-capturing element) is interpolated from an output from a fourth image-capturing element 71 adjacent to the assumed third (fourth) image-capturing element. More specifically, the output value "$Gy'_3$" of the (i+1, j+1)-th assumed third (fourth) image-capturing element is derived from an average value of outputs from the (i, j+1)-th fourth image-capturing element 71 and the (i+1, j+1)-th fourth image-capturing element 71. In this manner, outputs ($Gy'_1$, $Gy'_2$, $Gy'_3$, $Gy_4$) based on the fourth image-capturing element 71 similar to the outputs from the image-capturing elements in an ordinary image-capturing device of the Bayer arrangement can be obtained (see FIG. 3B), and the low sensitivity image data can be obtained from the entire obtained outputs.

It is to be understood that the interpolation method (bi-linear method) explained above is merely an example, and can be changed as necessary. A method adopting an output given by an adjacent second image-capturing element 51 as an output of the assumed second image-capturing element 51 as it is (nearest neighbor method), and further, a more sophisticated pixel interpolation algorithm using direction selection algorithm may be applied. The algorithm may be determined by the target frame rate and the image processing cost of the entire system. This is also applicable to the following explanation.

With such processing, the data configuration and the data structure of the low sensitivity image data and the data configuration and the data structure of the high sensitivity image data can be configured to be the same while the original number of pixels is not changed, and therefore, various kinds of signal processing can be simplified, and an image can be generated that is combined by HDR imaging with a processing engine at an extremely low cost. Since the simplest periodicity and symmetric property are maintained as image processing, image quality degradation such as false color and jaggy is less likely to occur when a combined image is formed.

Subsequently, the image processing unit 11 generates a combined image using high sensitivity image data corresponding to a low illumination image area in the low illumination image area obtained from the low sensitivity image data or the high sensitivity image data, and using low sensitivity image data corresponding to a high illumination image area in the high illumination image area obtained from the low sensitivity image data or the high sensitivity image data. More specifically, for example, the low illumination image area and the high illumination image area are extracted from the high sensitivity image data. More specifically, in a case where the luminance average value of a pixel of high sensitivity image data in any given size of area is equal to or more than a value defined in advance (for example, in a case where the luminance value after the AD conversion is saturated, or in a case where the luminance value is 90% or higher with respect to the saturation level, etc.), this area may be adopted as the high illumination image area, and in a case where the illumination average value is less than the value defined in advance, this area may be adopted as the low illumination image area. For example, in FIG. 4, an area encircled by double lines with shade is considered to be the high illumination image area.

Then, the combined image is generated using the high sensitivity image data corresponding to the low illumination image area in the low illumination image area and using the low sensitivity image data corresponding to the high illumination image area in the high illumination image area. This state is schematically shown in FIG. 5.

As schematically shown in FIG. 6, an image-capturing scene is considered in which, an apple and a banana is placed on a table arranged in a dark room, and there are trees outdoors outside of windows where it is bright. In such image-capturing scene, when an image-capturing condition (exposure and shutter speed) is adjusted for a dark room, the image-capturing state in the room is appropriate, but "blown out highlights" may occur in the scenery outdoors outside of the windows (see a drawing at the upper side at the left hand side of FIG. 6). On the other hand, when the image-capturing condition (exposure and gain) is adjusted for the outdoors where it is bright, the image-capturing state inside of the room becomes "blocked up shadows" (see a drawing at the lower side at the left hand side of FIG. 6).

In the image-capturing device of the first embodiment, for example, the shutter speed is adjusted so that the maximum luminance value in the high illumination area of the low sensitivity image data is about 80% output of the AD conversion full range. It should be noted that the frame rate is fixed, which is, for example, 30 fps. With such processing, the output from the fourth image-capturing element 71 is not saturated in the high illumination image area, and although it is gray scale, a luminance distribution with a preferable linearity can be obtained. In the high illumination image area, at least one of the first image-capturing element 41, the second image-capturing element 51, and the third image-capturing element 61 is saturated, and a part or all of the color information is lost. On the other hand, in the low illumination image area, the first image-capturing element 41, the second image-capturing element 51, and the third image-capturing element 61 are not saturated, and therefore, a luminance distribution and color information can be obtained with a preferable linearity.

Both of the low sensitivity image data and the high sensitivity image data are obtained by one image-capturing process, and a combined image is generated using the high sensitivity image data corresponding to the dark room (low illumination image area) for the dark room (low illumination image area) and using the low sensitivity image data corresponding to the bright outdoors (high illumination image area) for the bright outdoors (high illumination image area). This state is schematically shown in the drawing at the right hand side of FIG. 6. In accordance with the dynamic range (for example, RGB 8 bit) of a display apparatus for displaying a combined image or a printer for printing a combined image, so-called tone mapping processing is performed to convert the luminance range in an image into the range suitable for display, whereby an image combined by HDR imaging can be obtained. The image of bright outdoors (high illumination image area) is a single color (black and white) image, and the image of the dark room (low illumination image area) is a color image. Such combined image (image combined by HDR imaging) is required to have color on the entire screen of devices requiring high degree of quality such as ordinary digital cameras and camcorders, and therefore, the image-capturing device of the first embodiment is difficult to be applied to such devices. However, in the usage field of image-capturing devices such as a monitoring camera and an on-board camera which are strongly required "not to lose any information," this would not cause any problem in practical point of view. In addition, it is easy to support motion pictures. As described above, although the image-capturing device has, for example, the simple configuration and structure equivalent to those of the image-capturing device having a conventional Bayer arrangement, the image-capturing device can easily obtain an image based on a high dynamic range imaging, and this means that an image by high dynamic range imaging can be obtained by using inexpensive image-capturing device.

It should be noted that an output (electrical-charge) generated by each image-capturing element in accordance with the received light quantity is sent to a column signal processing circuit. For example, the column signal processing circuit is provided for each column of the image-capturing elements, and performs, for each column, signal processing such as noise reduction on the output that is output from one row of image-capturing elements. More specifically, the column signal processing circuit performs signal processing such as correlated double sampling (CDS) for eliminating fixed pattern noise unique to the image-capturing element, signal amplification, and analog/digital conversion. The horizontal driving circuit is constituted by, for example, shift registers, and selects the column signal processing circuits in order by successively outputting a horizontal scanning pulse, thus causing each of the column signal processing circuits to output a signal. The system control circuit receives data for, for example, commanding an input clock and an operation mode, and outputs data such as internal information about the image-capturing device. More specifically, the system control circuit generates a clock signal and a control signal serving as a basis of operation of the vertical drive circuit, the column signal processing circuit, the horizontal driving circuit, and the like on the basis of the vertical synchronization signal, the horizontal synchronization signal, and master clock. Then, the system control circuit outputs these signals to the vertical drive circuit, the column signal processing circuit, the horizontal driving circuit, and the like. The drive circuit for driving each image-capturing element is constituted by the peripheral circuits (vertical drive circuit, column signal processing circuit, horizontal driving circuit and system control circuit) and the circuit provided for each of the image-capturing elements.

Alternatively, the image-capturing element is driven on the basis of the circuit of the first embodiment disclosed in JP 2005-323331 A, for example.

Second Embodiment

By increasing the film thickness of the fourth filter 73, the optical density (OD) can be increased. However, the film thicknesses of the filters 43, 53, 63 of the image-capturing elements 41, 51, 61 are typically thinner than 1 µm. Therefore, the film thickness of the fourth filter 73 of the fourth image-capturing element 71 formed in the same plane is also desirably about the same in view of the light condensing performance of the image-capturing element. In view of the filter forming process, it is sometimes difficult to form a filter of which film thickness is thick with a variation equal to or less than a certain level. The light transmission rate of the fourth filter 73 of which film thickness is 1 µm according to the first embodiment is limited to about 5%, and the outputs of the fourth image-capturing element 71 is about ⅛ of the output of the first image-capturing element 41, the second image-capturing element 51, and the third image-capturing element 61, and this determines the dynamic range of the entire image-capturing device. Therefore, in reality, in order to support an image-capturing scene where there is still more great difference in the brightness, the fourth image-capturing element 71 may be desirable to attain lower sensitivity in some cases.

Figure 8:
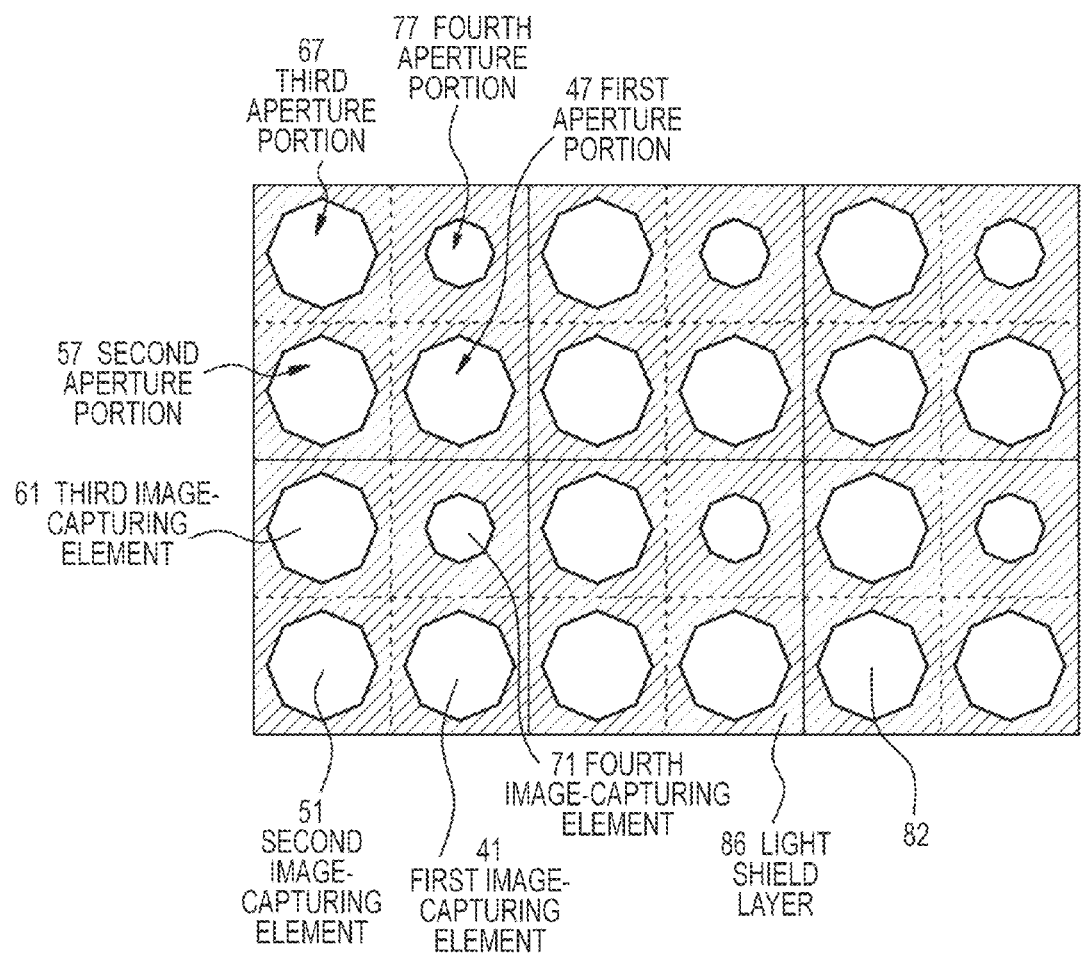
FIG. 8 is a schematic partial top view illustrating a light shield layer when an image-capturing element is cut along arrow B-B of FIG. 7B in the image-capturing device of the second embodiment.

The second embodiment is a modification of the first embodiment. In the image-capturing device of the second embodiment, a schematic partial top view of the light shield layer 86 when the image-capturing element is considered to be cut along arrow B-B of FIG. 7B is shown in FIG. 8. As shown in FIG. 8, a first aperture portion 47 is formed between a first filter 43 and a first photoelectric conversion element 42, a second aperture portion 57 is formed between a second filter 53 and a second photoelectric conversion element 52, a third aperture portion 67 is formed between a third filter 63 and a third photoelectric conversion element 62, and a fourth aperture portion 77 is formed between a fourth filter 73 and a fourth photoelectric conversion element 72, wherein the fourth aperture portion 77 is smaller than the first aperture portion 47, the second aperture portion 57, and the third aperture portion 67.

For example, when the sizes of the first aperture portion 47, the second aperture portion 57, the third aperture portion 67, and the fourth aperture portion 77 are determined so that the light quantity attenuation for the fourth image-capturing element 71 is twice the light quantity attenuation for the first image-capturing element 41, the second image-capturing element 51, and the third image-capturing element 61. The sensitivity of the fourth image-capturing element 71 is ⅛ (the first embodiment) to 1/16 (24 dB) of the sensitivities of the first image-capturing element 41, the second image-capturing element 51, and the third image-capturing element 61. As described above, the quantity of light received by the fourth image-capturing element 71 can be less than the quantity of light received by the first image-capturing element 41, the second image-capturing element 51, and the third image-capturing element 61, and as a result, the dynamic range can be expanded without thickening the film thickness of the fourth filter 73.

Third Embodiment

The third embodiment is also a modification of the first embodiment. In the first embodiment, the sensitivity ratio of the first image-capturing element 41, the second image-capturing element 51, and the third image-capturing element 61, and the fourth image-capturing element 71 is 1:⅛ (18 dB), but when the sensitivity ratio is fixed, it may be difficult to cope with various kinds of image-capturing scenes, and the dynamic rang such as 18 dB may be in sufficient.

In the third embodiment, the output of the final stage is variably controlled by combining the gains that can be independently set between the first image-capturing element 41, the second image-capturing element 51, and the third image-capturing element 61, and the fourth image-capturing element 71, whereby the dynamic range of the image combined by HDR imaging can be expanded, and the variable control of the dynamic range is enabled, whereby image-capturing scenes where there are various differences in the brightness can be supported. In an image-capturing scene, the difference in the brightness needs to be equal to or more than 32 dB in many cases.

More specifically, in the third embodiment, the image processing unit 11 may include a first gain adjustment unit for adjusting outputs from the first image-capturing element 41, the second image-capturing element 51, and the third image-capturing element 61 and a second gain adjustment unit for adjusting an output from the fourth image-capturing element 71, and in this case, where an adjustment coefficient for outputs from the first image-capturing element 41, the second image-capturing element 51, and the third image-capturing element 61 by the first gain adjustment unit is denoted as $Gn_1$, and an adjustment coefficient for an output from the fourth image-capturing element 71 by the second gain adjustment unit is denoted as $Gn_2$, $Gn_1/Gn_2=4$ may hold although the present embodiment is not limited thereto. More specifically, the range of the gain difference between the first image-capturing element 41, the second image-capturing element 51, and the third image-capturing element 61, and the fourth image-capturing element 71 is up to 12 dB.

Figure 9A:
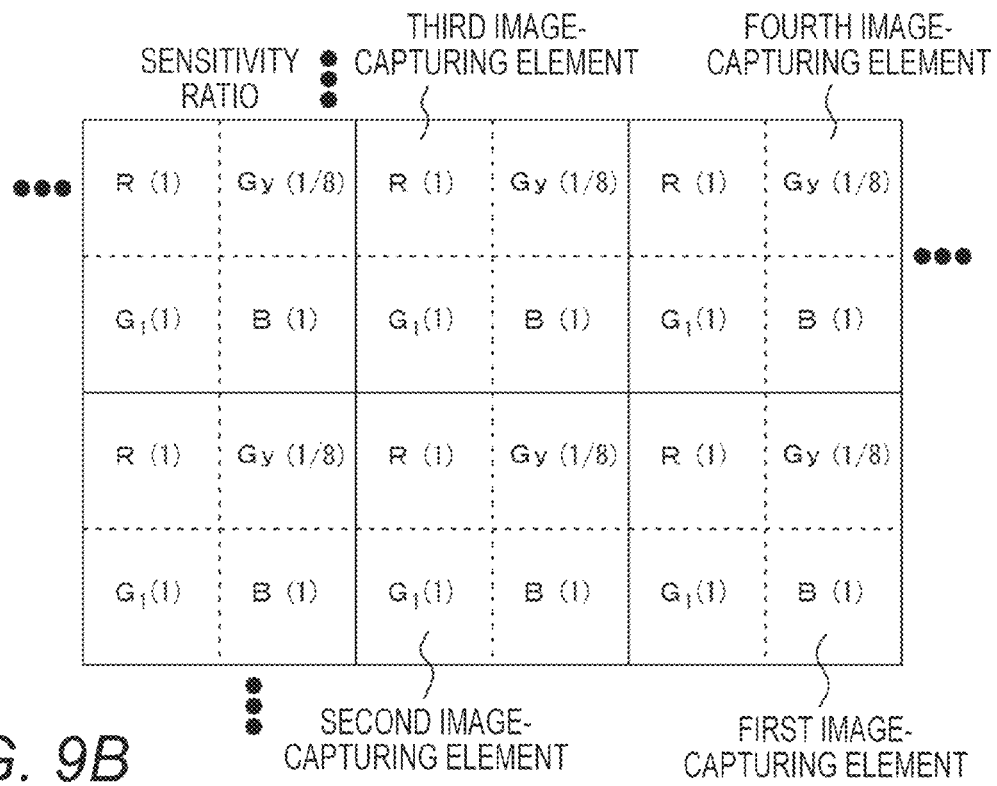
FIGS. 9A and 9B are a figure illustrating a sensitivity ratio of the first image-capturing element, the second image-capturing element, the third image-capturing element, and the fourth image-capturing element of the image-capturing device of the third embodiment, and a figure illustrating a gain ratio of the first image-capturing element, the second image-capturing element, the third image-capturing element, and the fourth image-capturing element thereof, respectively.
Figure 9B:
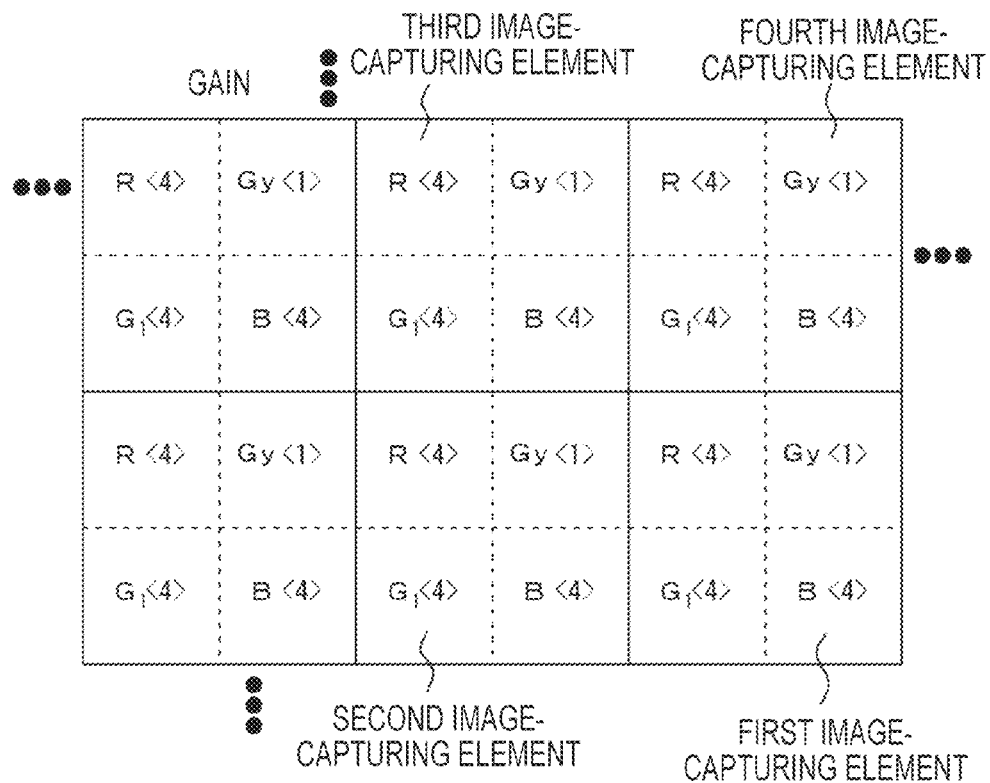
Figure 23A:
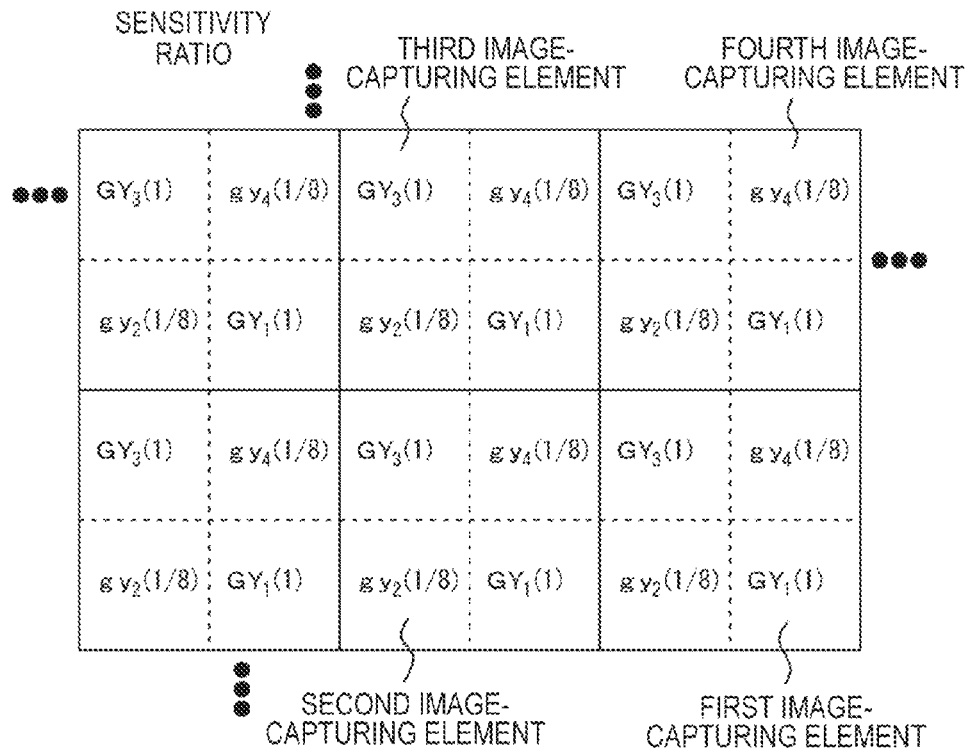
FIGS. 23A and 23B are a figure illustrating a sensitivity ratio of a first image-capturing element, a second image-capturing element, a third image-capturing element, and a fourth image-capturing element of the image-capturing device of the seventh embodiment, and a figure illustrating a gain ratio caused by difference in the sizes of apertures of the first image-capturing element, the second image-capturing element, the third image-capturing element, and the fourth image-capturing element thereof, respectively.
Figure 23B:
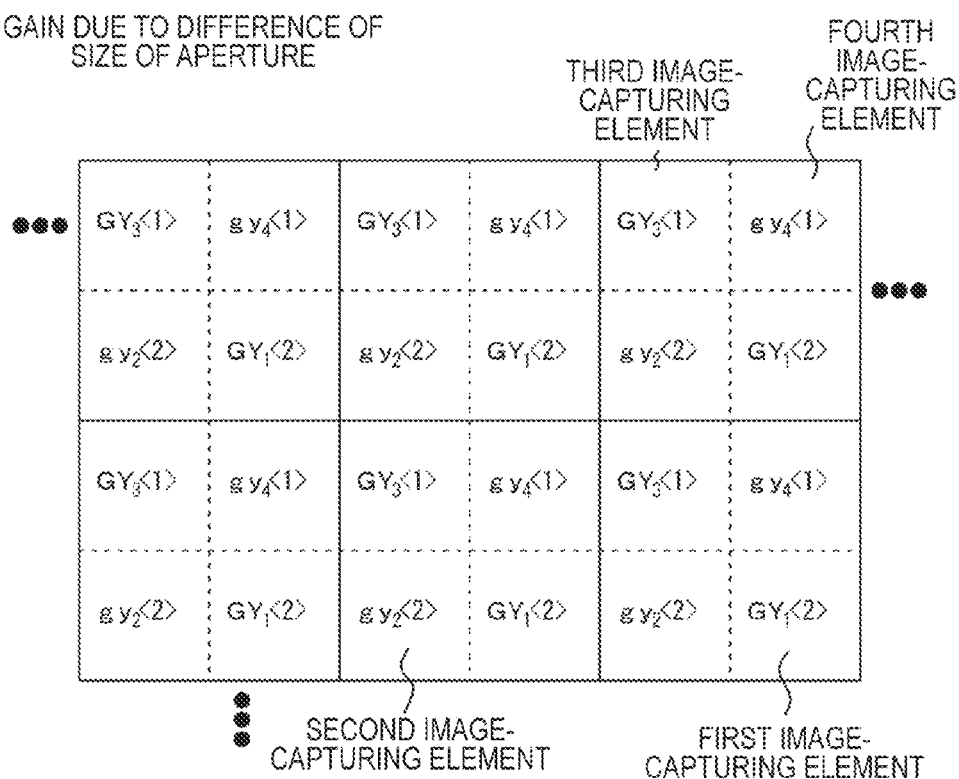

FIG. 9A illustrates a sensitivity ratio of the first image-capturing element 41, the second image-capturing element 51, the third image-capturing element 61, and the fourth image-capturing element 71. FIG. 9B is a gain ratio of the first image-capturing element 41, the second image-capturing element 51, the third image-capturing element 61, and the fourth image-capturing element 71. FIG. 10A illustrates a final output ratio of high sensitivity image data (a ratio of output to the outside, which is also applicable to the following cases). FIG. 10B illustrates a final output ratio of low sensitivity image data. In FIG. 9A or FIG. 23A explained later, numerals in the parentheses "( )" denote a sensitivity ratio. In FIG. 9B or FIG. 23B explained later, numerals in the angle brackets "< >" denote a gain value. In FIGS. 10A, 10B or FIGS. 24A, 28B, and 29 explained later, numerals in the square brackets "[ ]" denote a final output ratio. The sensitivity ratio of the first image-capturing element 41, the second image-capturing element 51, and the third image-capturing element 61, and the fourth image-capturing element 71 is 1:(⅛), and the gain ratio of the first image-capturing element 41, the second image-capturing element 51, and the third image-capturing element 61, and the fourth image-capturing element 71 is 4:1. Therefore, the final output ratio of the first image-capturing element 41, the second image-capturing element 51, and the third image-capturing element 61, and the fourth image-capturing element 71 is 1:(1/32), which is 30 dB.

The values of the adjustment coefficients $Gn_1$, $Gn_2$ may be fixed values, or may be automatically or manually changeable in accordance with the image-capturing scene and the difference between the average luminance in the high sensitivity image data and the average luminance in the low sensitivity image data, and therefore, image-capturing can be done with the optimum dynamic range in accordance with various kinds of bright and dark scenes.

It should be noted that the second embodiment and the third embodiment may be combined.

Fourth Embodiment

The fourth embodiment also relates to a modification of the first embodiment. In a recent image-capturing device, images can be captured with a frame rate equal to or more than twice an ordinary frame rate. In the fourth embodiment, an image-capturing device capable of capturing an image with such high frame rate (HFR), that is, an image-capturing device capable of capturing an image with HFR which is twice the frame rate (60 fps), is used.

More specifically, in the image-capturing device of the fourth embodiment, image processing unit 11 generates N sets of high sensitivity image data and low sensitivity image data of which exposure times are different, and the image processing unit 11 further divides an illumination area of an image obtained from the low sensitivity image data or the high sensitivity image data into 2N levels of areas ranging from an area of which illumination is the lowest to an area of which illumination is the highest, and generates a combined image using N sets of high sensitivity image data respectively corresponding to N levels of low illumination image areas in N levels of low illumination image areas ranging from the area of which illumination is the lowest to the area of which illumination is the N-th lowest, and using N sets of low sensitivity image data respectively corresponding to N levels of high illumination image areas in N levels of high illumination image areas ranging from the area of which illumination is the (N+1)-th lowest to the area of which illumination is the highest. In the fourth embodiment, N is 2, and there is such relationship that the image-capturing time for obtaining the high sensitivity image data and the low sensitivity image data of the first set is twice the image-capturing time for obtaining the high sensitivity image data and the low sensitivity image data of the second set.

Figure 11A:
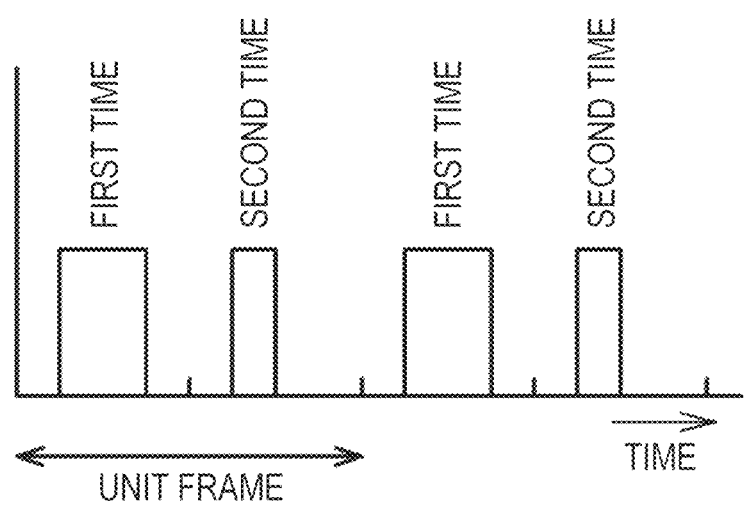
FIGS. 11A and 11B are a figure schematically illustrating an image-capturing state (exposure time) of the image-capturing device of the fourth embodiment in accordance with elapse of time, and a figure schematically illustrating output of the first image-capturing element, the second image-capturing element, the third image-capturing element, and the fourth image-capturing element, respectively.
Figure 11B:
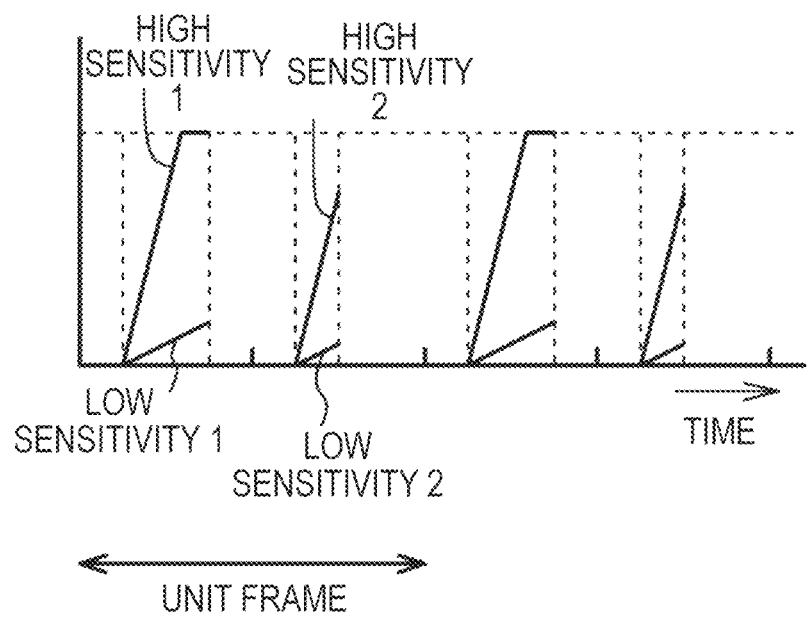

FIG. 11A schematically illustrates an image-capturing state (exposure time) in accordance with elapse of time. FIG. 11B schematically illustrates outputs from the first image-capturing element 41, the second image-capturing element 51, and the third image-capturing element 61, and the fourth image-capturing element 71. In the fourth embodiment, in the first image-capturing process, the image processing unit 11 generates one set of high sensitivity image data (indicated as "high sensitivity 1" in FIG. 11B) and low sensitivity image data (indicated as "low sensitivity 1" in FIG. 11B), and in the second image-capturing process, the image processing unit 11 generates another set of high sensitivity image data (indicated as "high sensitivity 2" in FIG. 11B) and low sensitivity image data (indicated as "low sensitivity 2" in FIG. 11B). When the outputs from the first image-capturing element 41, the second image-capturing element 51, and the third image-capturing element 61 are "1" in the first image-capturing process, the outputs from the first image-capturing element 41, the second image-capturing element 51, and the third image-capturing element 61 are "½" in the second image-capturing process. The output from the fourth image-capturing element 71 in the first image-capturing process is "⅛," and the output from the fourth image-capturing element 71 in the second image-capturing process is "1/16." Then, on the basis of the outputs from these image-capturing elements, two sets of high sensitivity image data and low sensitivity image data are generated.

More specifically, the image processing unit 11 divides an illumination area of an image obtained from the low sensitivity image data or the high sensitivity image data into 4 levels of areas ranging from an area of which illumination is the lowest to an area of which illumination is the highest, and generates a combined image using two sets of high sensitivity image data respectively corresponding to two levels of low illumination image areas, that is, high sensitivity image data obtained from the "high sensitivity 1" and the "high sensitivity 2," in two levels of low illumination image areas ranging from the area of which illumination is the lowest to the area of which illumination is the second lowest, and using two sets of low sensitivity image data respectively corresponding to two levels of high illumination image areas, that is, low sensitivity image data obtained from the "low sensitivity 1" and the "low sensitivity 2," in two levels of high illumination image areas ranging from the area of which illumination is the third lowest to the fourth area of which illumination is the highest.

As a result, the dynamic range of the image combined by HDR imaging is 24 dB. It should be noted that, in the example as shown in FIG. 11B, the high sensitivity image data in the first image-capturing process are saturated, on the other hand, the high sensitivity image data in the second image-capturing process are not saturated.

According to the fourth embodiment, the range in which the color information can be obtained is twice as large as the conventional range, and the lower limit of detection of the gray image is also extended to the half, and therefore, information can be obtained in a lower illumination spatial area. Therefore, as compared to the image combined by HDR imaging from an ordinary unit frame, not only the dynamic range is expanded, but also information about intermediate illumination is increased, and therefore, the noise in the high dynamic range combined image is reduced, and an image made by highly precise HDR imaging can be formed from two unit frames.

It should be noted that the configuration and the structure of the image-capturing device of the second embodiment can be applied to the image-capturing device of the fourth embodiment, or the configuration and the structure of the image-capturing device of the third embodiment can be applied to the image-capturing device of the fourth embodiment, or the configurations and the structures of the image-capturing devices of the second embodiment and the third embodiment can be applied to the image-capturing device of the fourth embodiment.

Fifth Embodiment

In a case where the first filter, the second filter, the third filter and the fourth filter are independently formed, more specifically, in a case where the first filter, the second filter, the third filter, and the fourth filter of independent dot patterns are formed, a pattern of a corner portion of a resist material is withdrawn in an exposure mask having an ordinary rectangular opening when the resist material is exposed, and for this reason, in the order of exposure wavelength, the four corners of the filter become round although a filter in a rectangular shape is originally expected to be formed. As a result, a gap is formed between a corner portion of the filter and a corner portion of the filter, and there occurs a problem in that the colors may mix between image-capturing elements, and the overall reliability of the image-capturing element is reduced.

Figure 12:
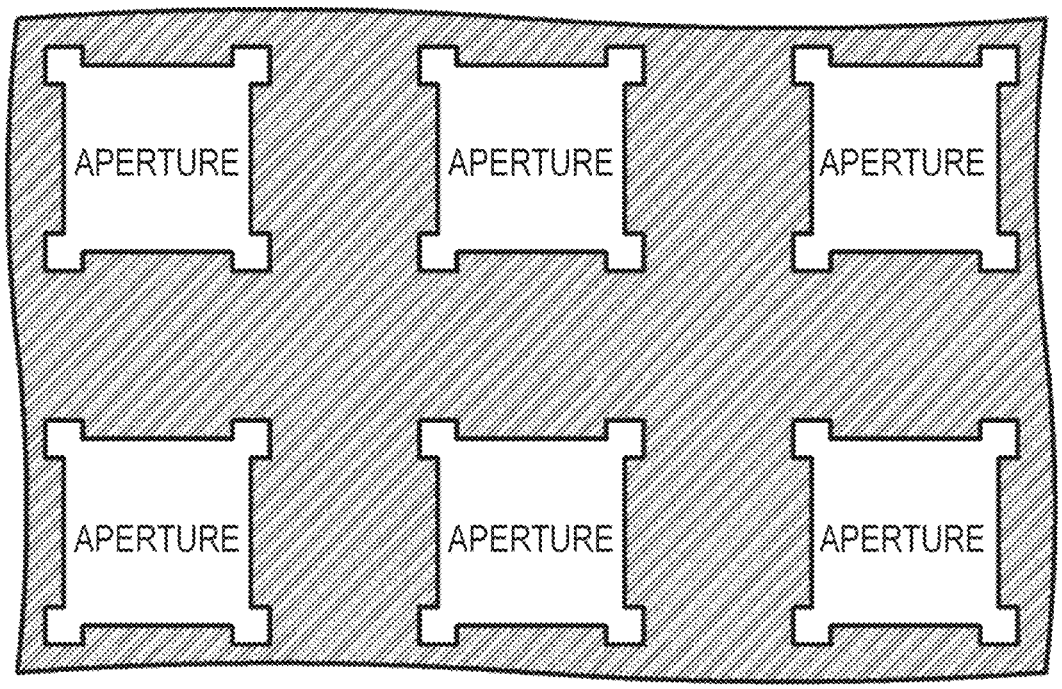
FIG. 12 is a schematic partial top view illustrating an exposure mask with a corner serif pattern for forming a filter on the basis of a lithography technique.

The fifth embodiment relates to a modification of the first embodiment to the fourth embodiment. In the image-capturing device of the fifth embodiment, there is no gap between the first filter 43, the second filter 53, the third filter 63, and the fourth filter 73. When any one of the first filter 43, the second filter 53, the third filter 63, and the fourth filter 73 is formed using the photolithography technique, this kind of configuration can be easily achieved by using an exposure mask with corner serif patterns of which schematic partial top view is shown in FIG. 12. More specifically, rectangular openings are formed in the exposure mask, and at the four corners of the opening, small rectangular openings are formed in a protruding manner. When at least one of the first filter, the second filter, the third filter, and the fourth filter is formed, the exposure mask with the corner serif patterns is used. In the fifth embodiment, the resist material for a negative-type color filter is considered to be used.

Figure 13A:
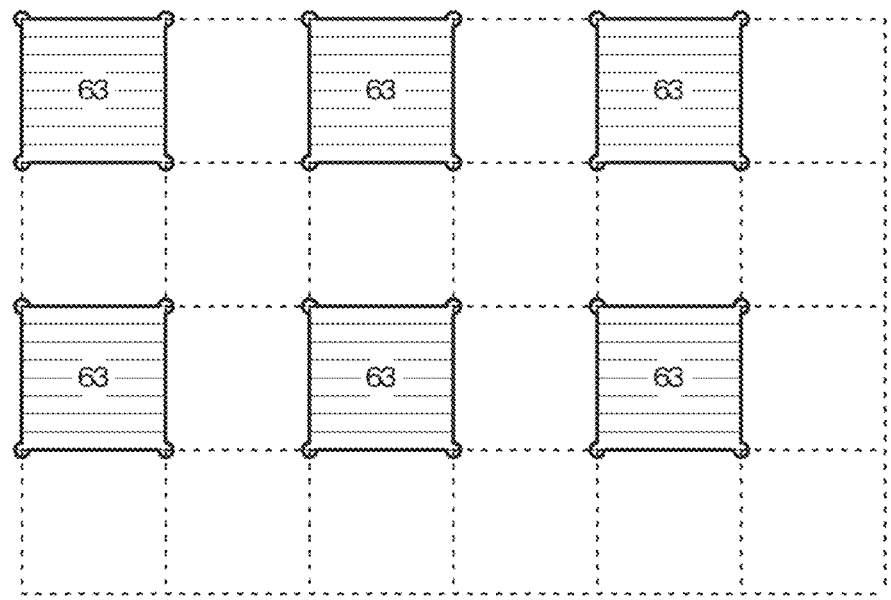
FIGS. 13A and 13B are schematic partial top views of filters for explaining a method for forming a first filter, a second filter, a third filter, and a fourth filter according to the fifth embodiment.
Figure 13B:
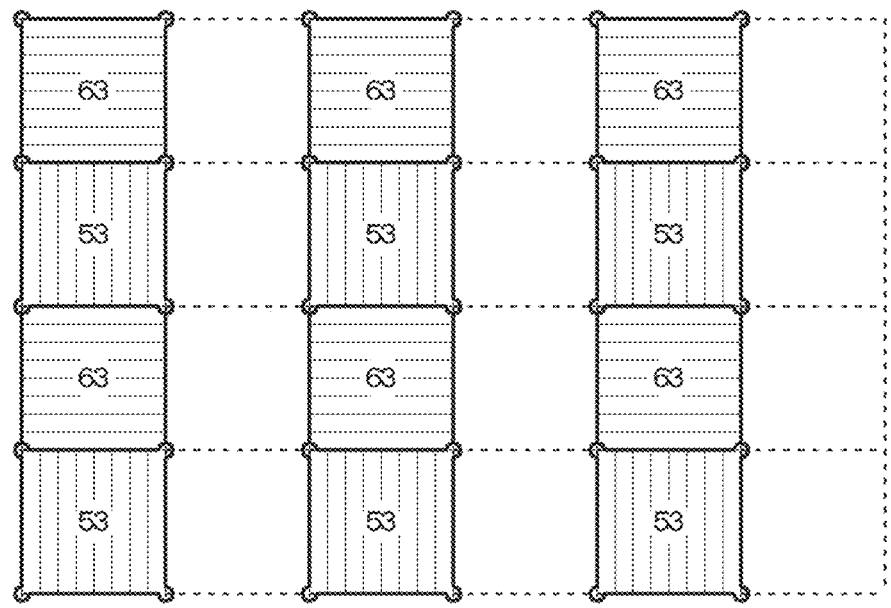
Figure 14A:
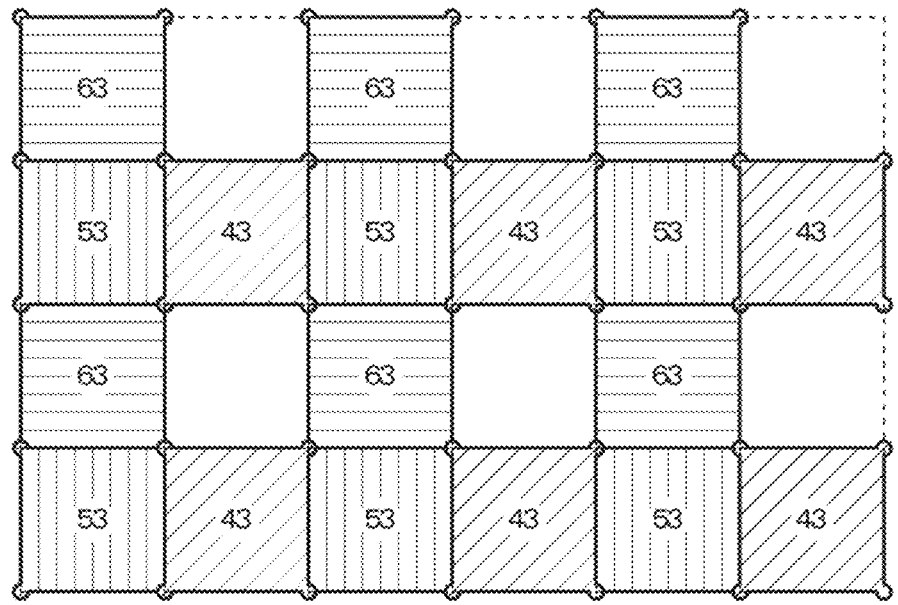
FIGS. 14A and 14B are, continued from FIG. 13B, schematic partial top views of the filters for explaining the method for forming the first filter, the second filter, the third filter, and the fourth filter according to the fifth embodiment.
Figure 14B:
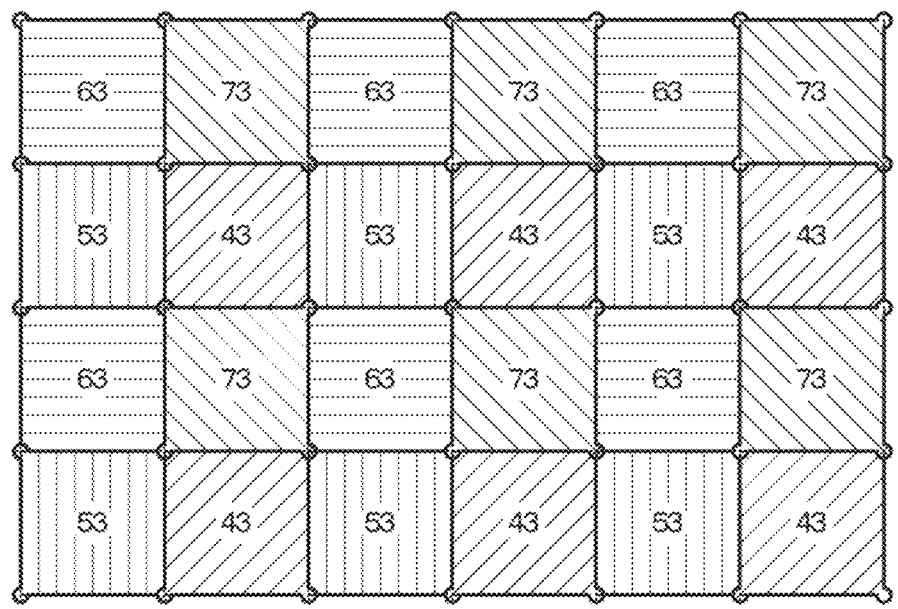

More specifically, on the basis of a well-known method, photoelectric conversion elements 42, 52, 62, 72 are formed on a silicon semiconductor substrate 80, and subsequently, a first planarization film 82 and a light shield layer 86 are formed thereon. Subsequently, a resist material including a pigment-based third material constituting the third filter 63 is applied to the entire surface, and the resist material is exposed and developed using the exposure mask as shown in FIG. 12, so that the third filter 63 of which four corners are swelling can be obtained as shown in FIG. 13A. Subsequently, a resist material including a pigment-based second material constituting the second filter 53 is applied to the entire surface, and the resist material is exposed and developed using the exposure mask as shown in FIG. 12, so that the second filter 53 of which four corners are swelling can be obtained as shown in FIG. 13B. Subsequently, a resist material including a pigment-based first material constituting the first filter 43 is applied to the entire surface, and the resist material is exposed and developed using the exposure mask as shown in FIG. 12, so that the first filter 43 of which four corners are swelling can be obtained as shown in FIG. 14A. Subsequently, a resist material including the pigment-based first material, second material, and third material (or the pigment-based first material and third material) constituting the fourth filter 73 is applied to the entire surface, and the resist material is exposed and developed using the exposure mask as shown in FIG. 12, so that the fourth filter 73 of which four corners are swelling can be obtained as shown in FIG. 14B. The four corners of each of the filters 43, 53, 63, 73 are swelling, and in addition, the four corners of each of the filters 43, 53, 63, 73 overlap each other, and therefore, there would be no gap between the filters 43, 53, 63, 73.

Figure 15A:
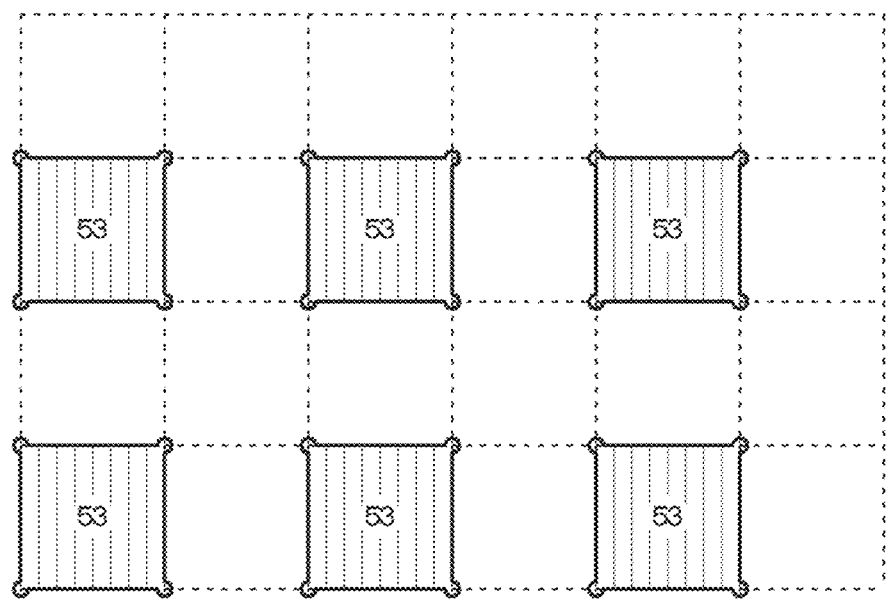
FIGS. 15A and 15B are schematic partial top views of filters for explaining another method for forming the first filter, the second filter, the third filter, and the fourth filter according to the fifth embodiment.
Figure 15B:
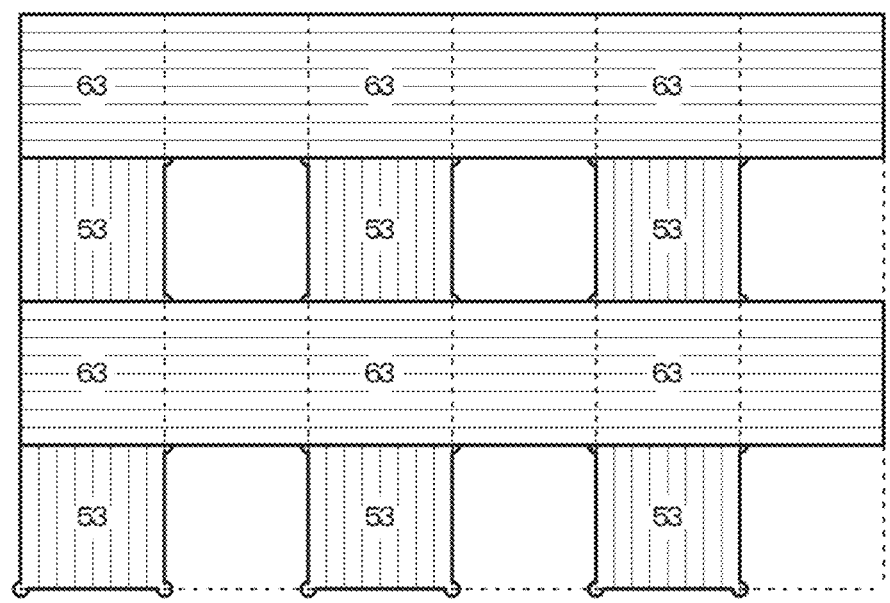
Figure 16A:
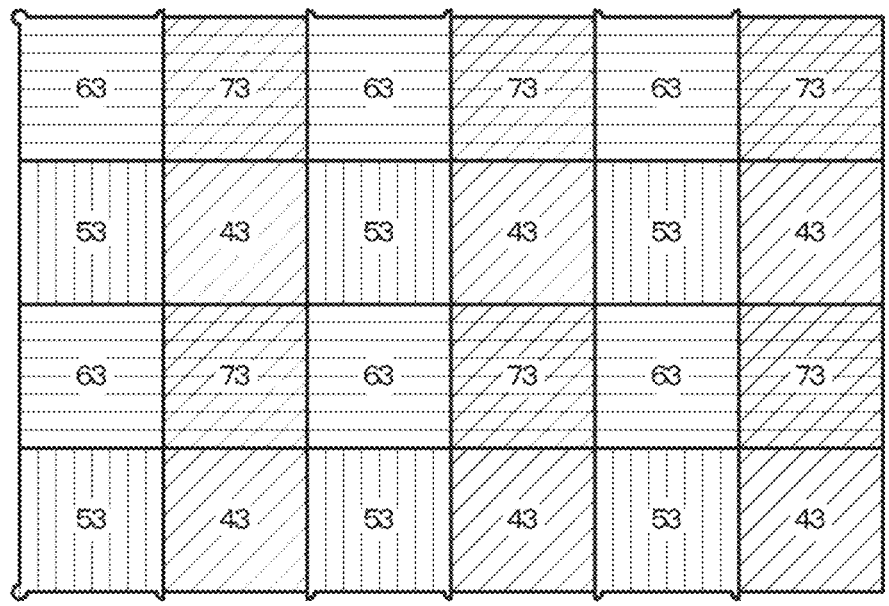
FIG. 16A is, continued from FIG. 15B, a schematic partial top view of the filters for explaining the another method for forming the first filter, the second filter, the third filter, and the fourth filter according to the fifth embodiment.

The method for forming the filters 43, 53, 63, 73 is not limited to the above method. For example, a resist material including a pigment-based second material constituting the second filter 53 is applied to the entire surface, and the resist material is exposed and developed using the exposure mask as shown in FIG. 12, so that the second filter 53 of which four corners are swelling can be obtained as shown in FIG. 15A. Subsequently, a resist material including a pigment-based third material constituting the third filter 63 is applied to the entire surface, and the resist material is exposed and developed using the exposure mask having a band-like opening, so that the third filter 63 can be obtained as shown in FIG. 15B, and in addition, the third material layer can be formed in an area where the fourth filter 73 is to be formed subsequently. Subsequently, a resist material including a pigment-based first material constituting the first filter 43 is applied to the entire surface, and the resist material is exposed and developed using the exposure mask having a band-like opening, so that the first filter 43 can be obtained as shown in FIG. 16A, and in addition, the first material layer can be formed in an area where the fourth filter 73 is to be formed on the band-like pattern 63 as shown in FIG. 15B. Thus, the fourth filter 73 can be obtained, which has two-layer stacked structure including the first material layer made of the first material constituting the first filter 43 and the third material layer made of the third material constituting the third filter 63. In this manner, by stacking the first filter and the third filter, the ND filter (fourth filter 73) can be formed on the basis of the first material constituting the first filter which is magenta-like but is an existing material and the third material constituting the third filter.

Figure 16B:
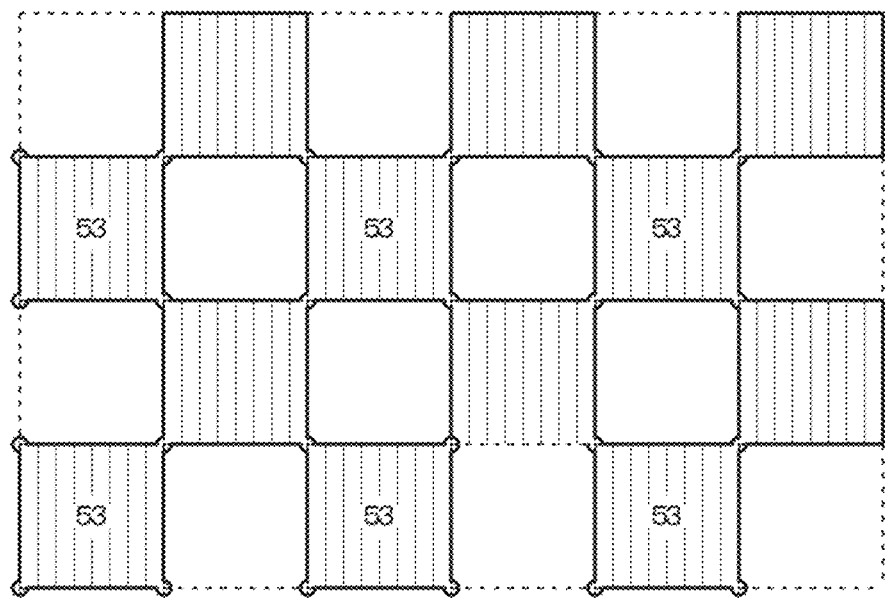
FIG. 16B is a schematic partial top view of the second filter and the like for explaining still another method for forming the first filter, the second filter, the third filter, and the fourth filter according to the fifth embodiment.

Alternatively, a resist material including a pigment-based second material constituting the second filter 53 is applied to the entire surface, and the resist material is exposed and developed using the exposure mask, so that the second filter 53 of which four corners are swelling can be obtained as shown in FIG. 16B, and in addition, a layer made of the second material can be formed in an area where the fourth filter 73 is to be formed subsequently. Thereafter, by forming the third filter 63 based on formation of the layer made of the band-like third material which is similar to what is shown in FIG. 15B and forming the first filter 43 based on formation of the layer made of the band-like first material which is similar to what is shown in FIG. 16A, the fourth filter 73 can be obtained that has the three-layer stacked layer structure including the first material layer made of the first material constituting the first filter 43, the second material layer made of the second material constituting the second filter 53, and the third material layer made of the third material constituting the third filter 63.

It should be noted that the order in which the first filter, the second filter, the third filter, and the fourth filter are formed is merely an example, and may be changed as necessary, the order in which the first material layer, the second material layer, and the third material layer are stacked in the fourth filter is also merely an example, and may be changed as necessary.

Sixth Embodiment

Figure 17A:
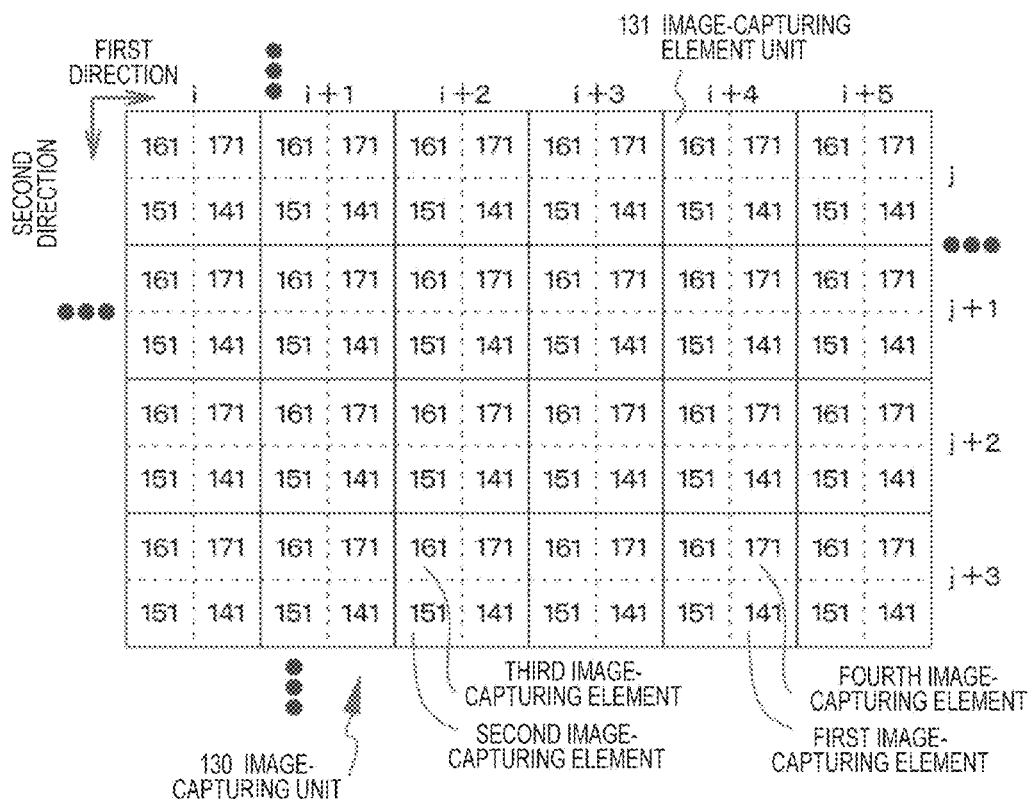
FIGS. 17A and 17B are a conceptual diagram illustrating an image-capturing unit of an image-capturing device of the sixth embodiment, and a figure schematically illustrating light reception characteristics of a first image-capturing element and a third image-capturing element and of a second image-capturing element and a fourth image-capturing element, respectively.
Figure 17B:
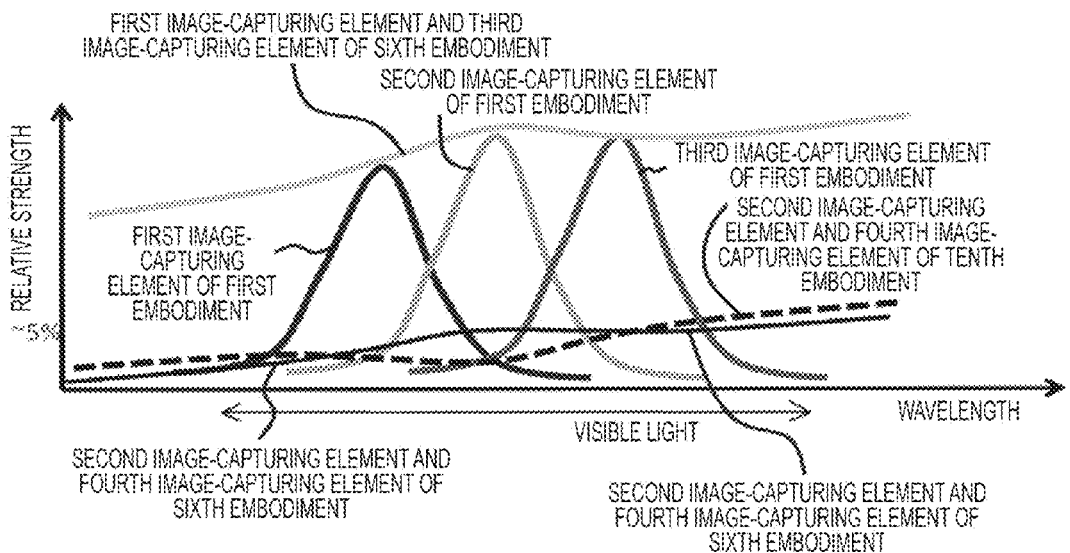

The sixth embodiment relates to an image-capturing device according to the second aspect and the fourth aspect of the present disclosure. A conceptual diagram of an image-capturing unit of the image-capturing device of the sixth embodiment is shown in FIG. 17A. Conceptual diagrams for explaining operation of the image-capturing unit are shown in FIGS. 18A, 18B, 19A, 19B, 20, and 21. Light reception characteristics of the first image-capturing element, the second image-capturing element, the third image-capturing element, and the fourth image-capturing element are schematically shown in FIG. 17B. It should be noted that the conceptual diagram of the image-capturing device and the schematic partial cross sectional view of the image-capturing element schematic partial cross sectional view are similar to what are shown in FIGS. 7A and 7B.

The image-capturing device 2 of the sixth embodiment is an image-capturing device for obtaining a single-color image. When this is explained according to the second aspect of the present disclosure, the image-capturing device 2 of the sixth embodiment is an image-capturing device that includes an image-capturing unit 130 and an image processing unit 11, wherein the image-capturing unit 130 includes image-capturing element units 131 arranged in a two-dimensional matrix form, and each of the image-capturing element units 131 includes: a first image-capturing element 141 and a third image-capturing element 161 including a first photoelectric conversion element and configured to receive light in a visible light range, and a second image-capturing element 151 and a fourth image-capturing element 171 including a neutral density filter and a second photoelectric conversion element and configured to receive light in a visible light range.

Then, image processing unit 11 generates high sensitivity image data on the basis of outputs from the first image-capturing element 141 and the third image-capturing element 161, and generates low sensitivity image data on the basis of outputs from the second image-capturing element 151 and the fourth image-capturing element 171. Further, the image processing unit 11 generates a combined image using high sensitivity image data corresponding to a low illumination image area in the low illumination image area obtained from the low sensitivity image data or the high sensitivity image data, and using low sensitivity image data corresponding to a high illumination image area in the high illumination image area obtained from the low sensitivity image data or the high sensitivity image data.

The image-capturing device 2 of the sixth embodiment is an image-capturing device for obtaining a single-color image. When this is explained according to the fourth aspect of the present disclosure, the image-capturing device 2 of the sixth embodiment is an image-capturing device that includes an image-capturing unit and an image processing unit 11, wherein the image-capturing unit is arranged with image-capturing element units, and each of the image-capturing element units includes: first image-capturing elements 141, 161 including a first photoelectric conversion element and configured to receive light in a visible light range and second image-capturing elements 151, 171 including a neutral density filter and a second photoelectric conversion element and configured to receive light in a visible light range. Although not shown in the drawing, the image-capturing device according to the fourth aspect is configured such that, for example, the image-capturing element units are all arranged in a row of the image-capturing unit along the first direction, or the image-capturing element units are arranged, with an interval therebetween, in a row of the image-capturing unit along the first direction, and further, the image-capturing element units are arranged at every M (however, M 2) rows along the second direction. A portion constituting the image-capturing unit except the image-capturing element units may be occupied by the first image-capturing elements.

Then, the image processing unit 11 generates high sensitivity image data on the basis of outputs from the first image-capturing elements 141, 161, and generates low sensitivity image data on the basis of outputs from the second image-capturing elements 151, 171. Further, the image processing unit 11 generates a combined image using high sensitivity image data corresponding to a low illumination image area in the low illumination image area obtained from the low sensitivity image data or the high sensitivity image data, and using low sensitivity image data corresponding to a high illumination image area in the high illumination image area obtained from the low sensitivity image data or the high sensitivity image data.

In this case, the neutral density filter is made of a material obtained by mixing a pigment-based first material constituting the first filter 43, a pigment-based second material constituting the second filter 53, and a pigment-based third material constituting the third filter 63 of the first embodiment, or the fourth filter 73 is made of the three-layer structure including the first material layer made of the pigment-based first material constituting the first filter 43, the second material layer made of the pigment-based second material constituting the second filter 53, and the third material layer made of the pigment-based third material constituting the third filter 63. By employing the configuration and the structure explained above and the neutral density filter where the film thickness of each material layer is set appropriately, the same spectral characteristic as the spectral characteristic of the filter obtained by stacking the first filter and the third filter can be given to the neutral density filter.

Alternatively, the neutral density filter is made of a material obtained by mixing the pigment-based second material constituting the second filter 53 according to the first embodiment and magenta material, or the neutral density filter 73 may be constituted by two-layer structure including the second material layer made of the pigment-based second material constituting the second filter 53 and the material layer made of magenta material. In such configuration, the same spectral characteristic as the spectral characteristic of the filter obtained by stacking the first filter and the third filter can also be given to the neutral density filter where the film thickness of each material filter is set appropriately.

As shown in FIG. 17A, in the image-capturing device 2 of the sixth embodiment, the arrangement of the four image-capturing elements 141, 151, 161, 171 (indicated by squares of solid lines and dotted lines in FIG. 17A) in any given image-capturing element unit 131 (indicated by a square of solid lines in FIG. 17A) is the Bayer arrangement. More specifically, the image-capturing element units 131 are arranged in a two-dimensional matrix form, and the image-capturing element units 131 are arranged in the first direction and the second direction perpendicular to the first direction. In any given image-capturing element unit 131, the third image-capturing element 161 and the fourth image-capturing element 171 are arranged adjacently to each other along the first direction, the first image-capturing element 141 and the second image-capturing element 151 are arranged adjacently to each other along the first direction, the first image-capturing element 141 and the fourth image-capturing element 171 are arranged adjacently to each other along the second direction, and the second image-capturing element 151 and the third image-capturing element 161 are arranged adjacently to each other along the second direction. The sensitivities of the second image-capturing element 151 and the fourth image-capturing element 171 are less than the sensitivities of the first image-capturing element 141 and the third image-capturing element 161.

Then, the image processing unit 11 generates high sensitivity image data on the basis of outputs from the first image-capturing element 141 and the third image-capturing element 161, and generates low sensitivity image data on the basis of outputs from the second image-capturing element 151 and the fourth image-capturing element 171.

Figures 18A, 18B:
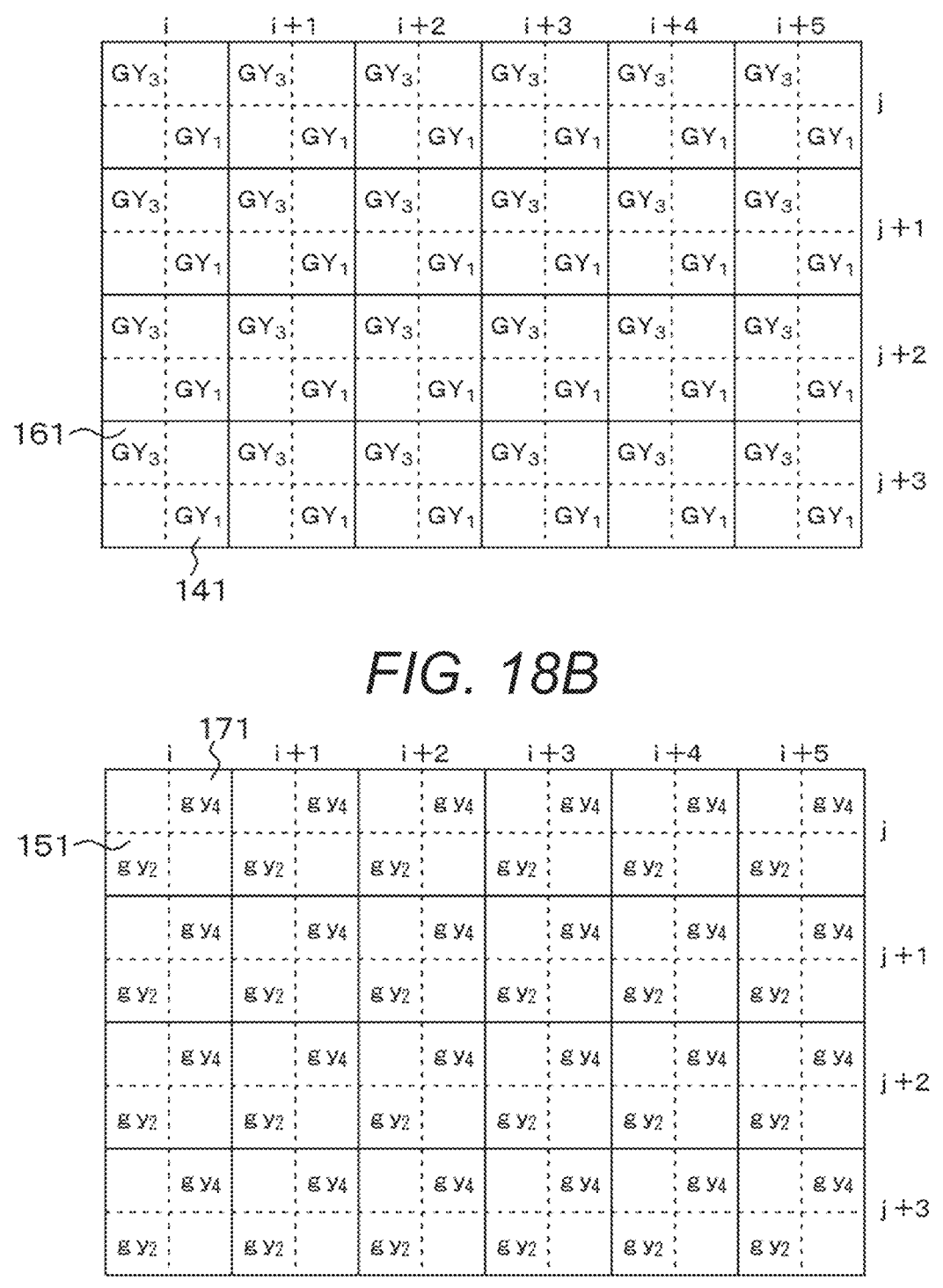

More specifically, when a certain image-capturing scene is captured, the first image-capturing element 141 and the third image-capturing element 161, and the second image-capturing element 151 and the fourth image-capturing element 171 output signal values "$GY_1$", "$GY_{31}$", "$gy_2$", and "$gy_4$", respectively, as shown in FIGS. 18A and 18B.

It should be noted that the light reception sensitivities of the first photoelectric conversion element constituting the first image-capturing element 141 and the photoelectric conversion element constituting the third image-capturing element 161 are both configured to be the same, "1", for the sake of convenience and for simplifying the explanation, and the light reception sensitivities of the photoelectric conversion elements constituting the second image-capturing element 151 and the fourth image-capturing element 171 is "1/8" for the sake of convenience. This is considered to be also applicable to the following explanation. More specifically, a ratio between the average accumulation electrical-charge quantity of the first image-capturing element 141 and the third image-capturing element 161 and the accumulation electrical-charge quantity of the second image-capturing element 151 and the fourth image-capturing element 171 is 8:1 (18 dB). Due to the sensitivity difference of 18 dB, low sensitivity image data for three levels of exposure are obtained. This is basically also applicable to the following explanation.

Each image-capturing element having received the light in the state as shown in FIGS. 18A and 18B transmits the output (electric signal) based on the received light quantity to the image processing unit 11. In the image processing unit 11, for example, the interpolation processing is performed on the basis of the following method.

More specifically, the first image-capturing element 141 is assumed to be located in an area where the fourth image-capturing element 171 is located, and an output that may be considered to be output by the first image-capturing element 141 that is assumed as above (assumed first image-capturing element 141) is interpolated from an output from a first image-capturing element 141 adjacent to the assumed first image-capturing element 141. For example, in FIG. 19A, an output that may be considered to be output by the (i+1, j+1)-th assumed first image-capturing element 141 is derived as an average value "$GY'_4$" of outputs from two image-capturing elements which are the (i+1, j)-th first image-capturing element 141 and the (i+1, j+1)-th first image-capturing element 141. The third image-capturing element 161 is assumed to be located in an area where the second image-capturing element 151 is located, and an output that may be considered to be output by the third image-capturing element 161 that is assumed as above (assumed third image-capturing element 161) is interpolated from an output from a second image-capturing element 151 adjacent to the assumed third image-capturing element 161. For example, in FIG. 19A, an output that may be considered to be output by the (i+1, j+1)-th assumed third image-capturing element 161 is derived as an average value "$GY'_2$" of outputs from the two image-capturing elements which are the (i+1, j+1)-th third image-capturing element 161 and the (i+1, j+2)-th third image-capturing element 161. In this manner, the same outputs ($GY_1$, $GY'_2$, $GY_3$, $GY'_4$) as the outputs from the image-capturing elements (one red color image-capturing element, two green color image-capturing elements, and one blue color image-capturing element) in an ordinary image-capturing device of the Bayer arrangement can be obtained (see FIG. 19A), and the high sensitivity image data can be obtained from all of the obtained outputs.

The fourth image-capturing element 171 is assumed to be located in an area where the first image-capturing element 141 is located, and an output that may be considered to be output by the fourth image-capturing element 171 that is assumed as above (assumed fourth image-capturing element 171) is interpolated from an output from a fourth image-capturing element 171 adjacent to the assumed fourth image-capturing element 171. For example, in FIG. 19B, an output that may be considered to be output by the (i+1, j+1)-th assumed fourth image-capturing element 171 is derived as an average value "$gy'_1$" of outputs from two image-capturing elements which are the (i+1, j+1)-th fourth image-capturing element 171 and the (i+1, j+2)-th fourth image-capturing element 171. The second image-capturing element 151 is assumed to be located in an area where the third image-capturing element 161 is located, and an output that may be considered to be output by the second image-capturing element 151 that is assumed as above (assumed second image-capturing element 151) is interpolated from an output from a third image-capturing element 161 adjacent to the assumed second image-capturing element 151. For example, in FIG. 19B, an output that may be considered to be output by the (i+1, j+1)-th assumed second image-capturing element 151 is derived as an average value "$gy'_3$" of outputs from two image-capturing elements which are the (i+1, j)-th second image-capturing element 151 and the (i+1, j+1)-th second image-capturing element 151. In this manner, the same outputs ($gy'_1$, $gy_2$, $gy'_3$, $gy_4$) as the outputs from the image-capturing elements (one red color image-capturing element, two green color image-capturing elements, and one blue color image-capturing element) in an ordinary image-capturing device of the Bayer arrangement can be obtained (see FIG. 19B), and the low sensitivity image data can be obtained from all of the obtained outputs.

With such processing, the data configuration and the data structure of the low sensitivity image data and the data configuration and the data structure of the high sensitivity image data can be configured to be the same while the original number of pixels is not changed, and therefore, various kinds of signal processing can be simplified, and an image can be generated that is combined by HDR imaging with a processing engine at an extremely low cost. Since the simplest periodicity property and symmetric property are maintained as image processing, image quality degradation such as false color and jaggy is less likely to occur when a combined image is formed.

Figure 20:
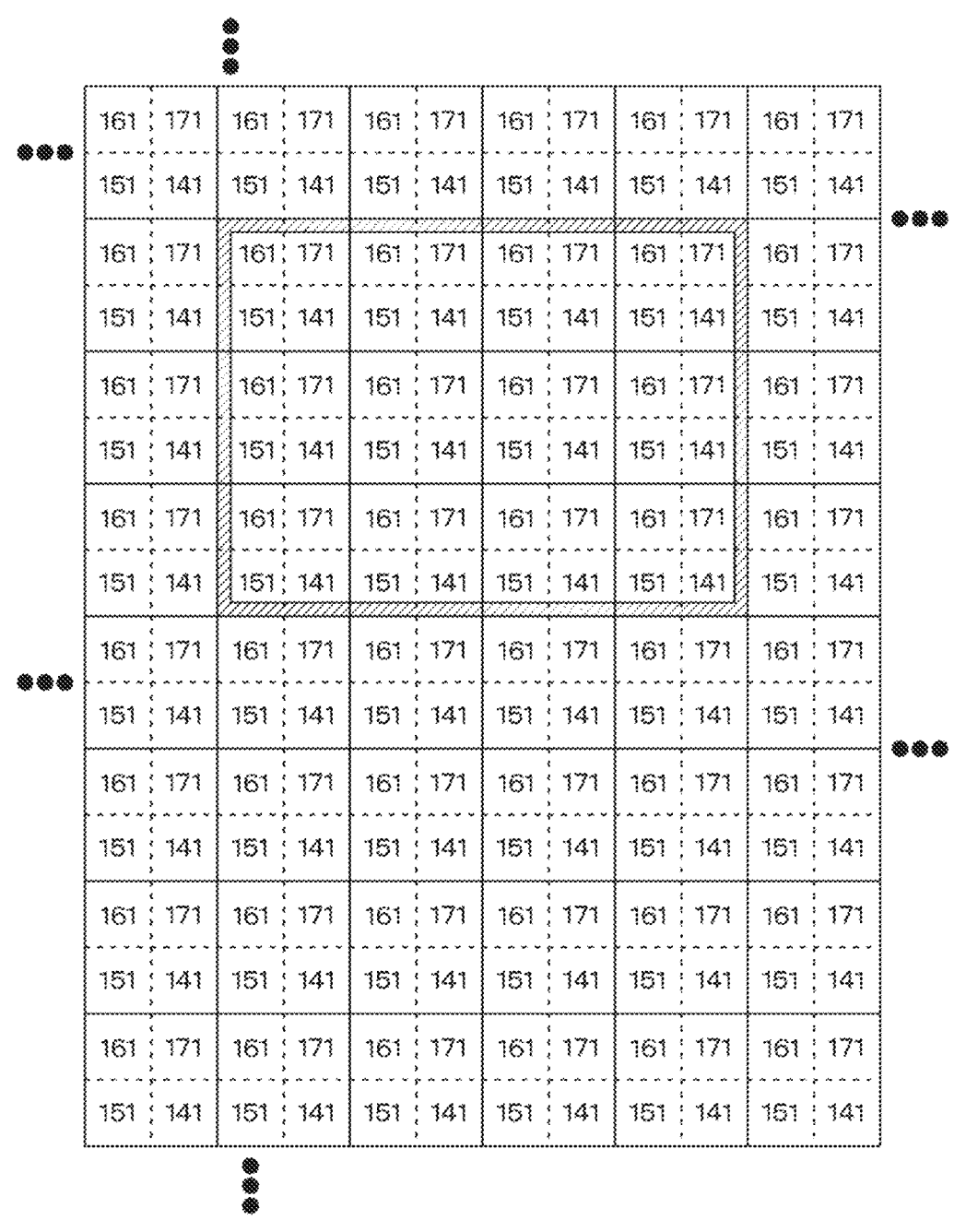
Figure 21:
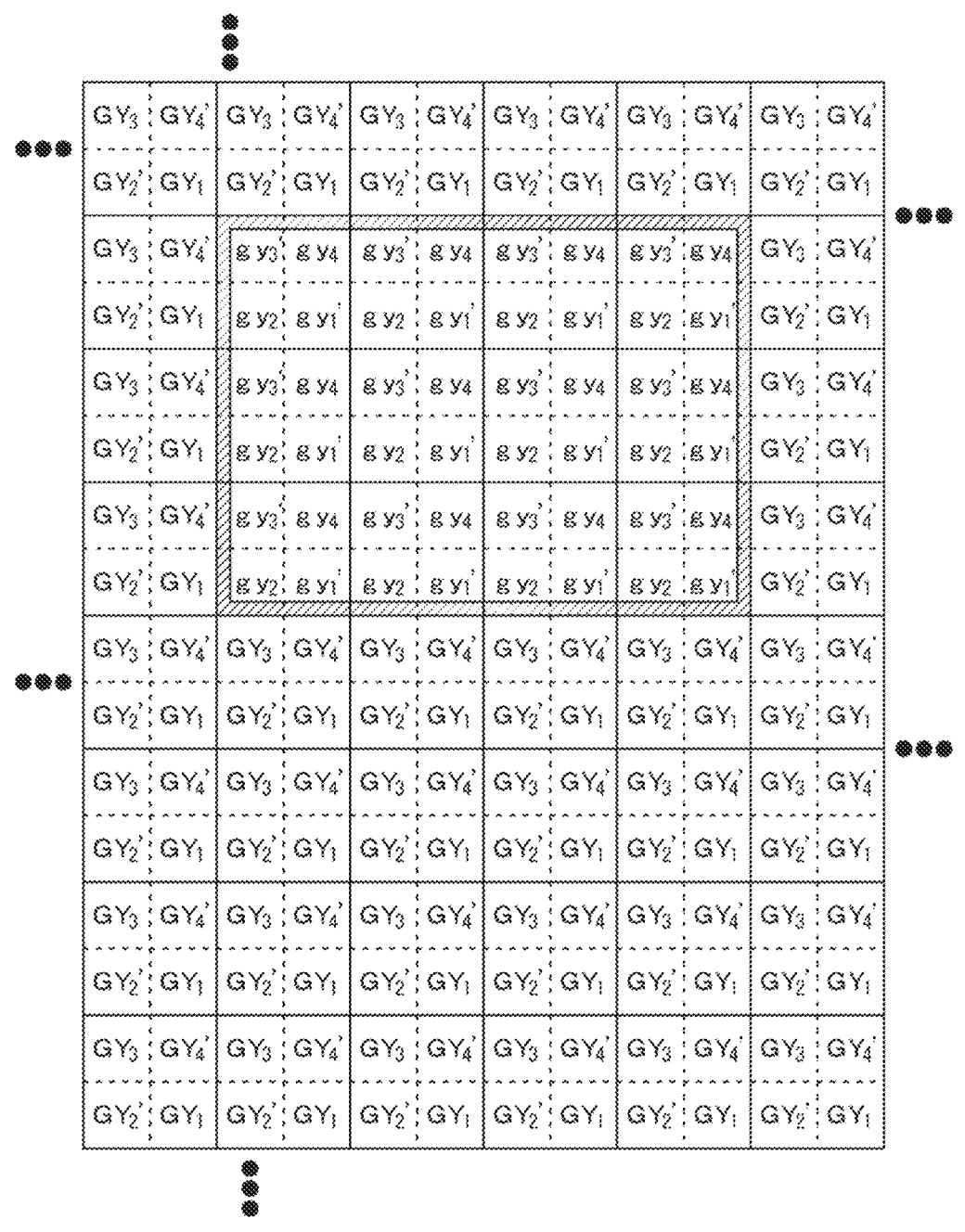

Subsequently, the image processing unit 11 generates a combined image using high sensitivity image data corresponding to a low illumination image area in the low illumination image area obtained from the low sensitivity image data or the high sensitivity image data, and using low sensitivity image data corresponding to a high illumination image area in the high illumination image area obtained from the low sensitivity image data or the high sensitivity image data. More specifically, for example, the low illumination image area and the high illumination image area are extracted from the high sensitivity image data. More specifically, in a case where the luminance average value in any given size of area is equal to or more than a value defined in advance (for example, equal to or more than the maximum illumination), this area may be adopted as the high illumination image area, and in a case where the illumination average value is less than the value defined in advance, this area may be adopted as the low illumination image area. In FIG. 20, an area encircled by double lines with shade is considered to be the high illumination image area. Then, the combined image is generated using the high sensitivity image data corresponding to the low illumination image area in the low illumination image area and using the low sensitivity image data corresponding to the high illumination image area in the high illumination image area. This state is schematically shown in FIG. 21.

Seventh Embodiment

Figure 22:
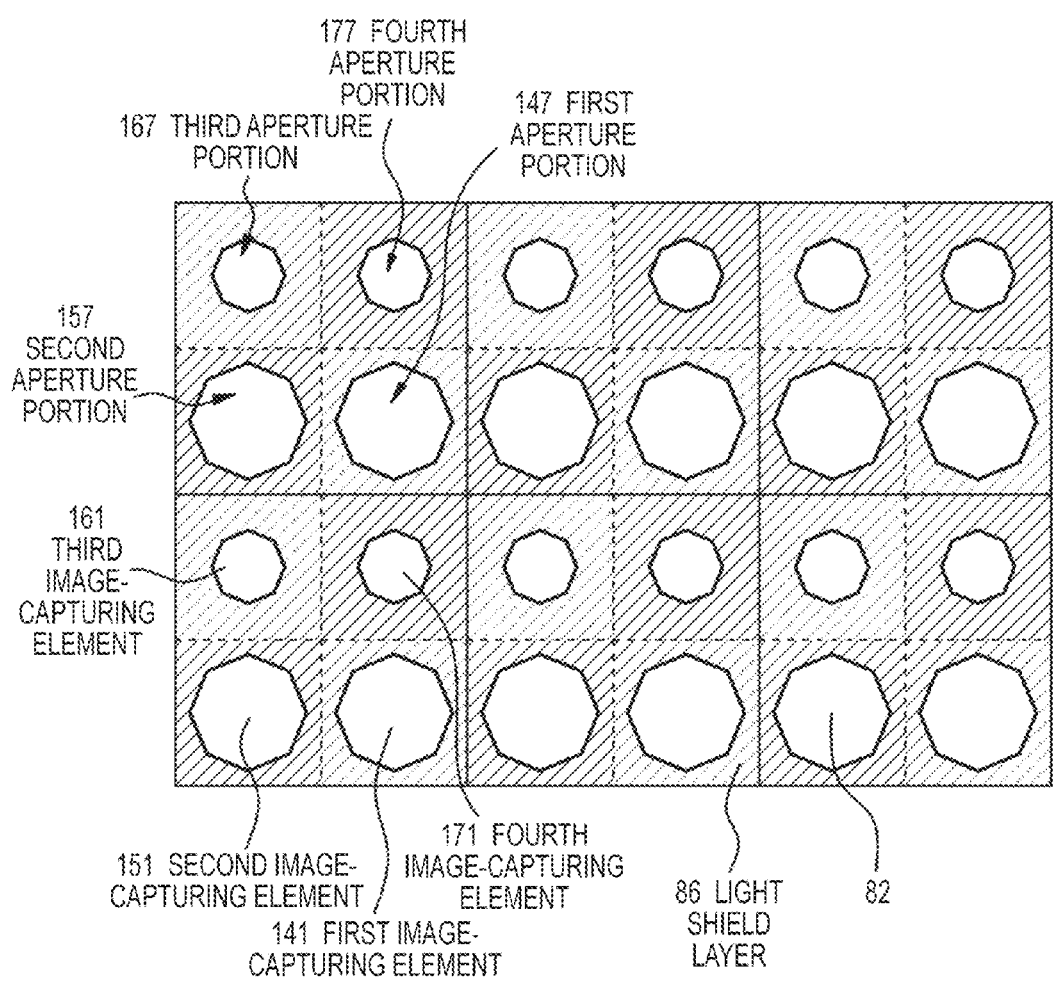
FIG. 22 is a schematic partial top view illustrating a light shield layer when an image-capturing element is cut along arrow B-B of FIG. 7B in the image-capturing device of the seventh embodiment.

The seventh embodiment is a modification of the sixth embodiment, and relates to an embodiment similar to the second embodiment. In the image-capturing device of the seventh embodiment, a schematic partial top view of a light shield layer 86 when the image-capturing element is considered to be cut along arrow B-B of FIG. 7B is shown in FIG. 22. As shown in FIG. 22, a first aperture portion 147 is formed in a light incidence area of the first photoelectric conversion element. A second aperture portion 157 is formed between the neutral density filter and the second photoelectric conversion element. A third aperture portion 167 is formed in a light incidence area of the third photoelectric conversion element. A fourth aperture portion 177 is formed between the neutral density filter and the fourth photoelectric conversion element. The third aperture portion 167 is smaller than the first aperture portion 147, and the fourth aperture portion 177 is smaller than the second aperture portion 157.

Figure 24A:
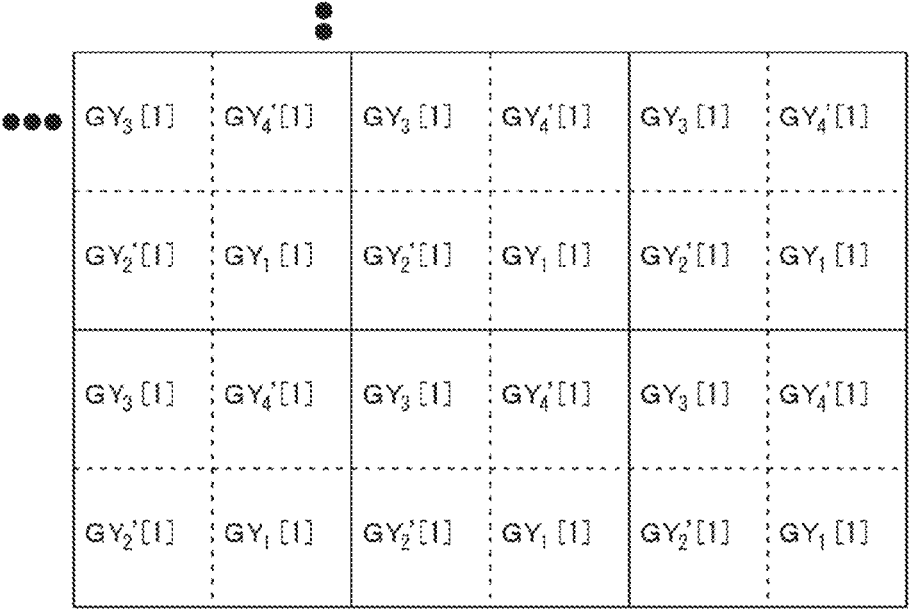
FIGS. 24A and 24B are figures illustrating final output ratios of high sensitivity image data according to the image-capturing device of the seventh embodiment.
Figure 24B:
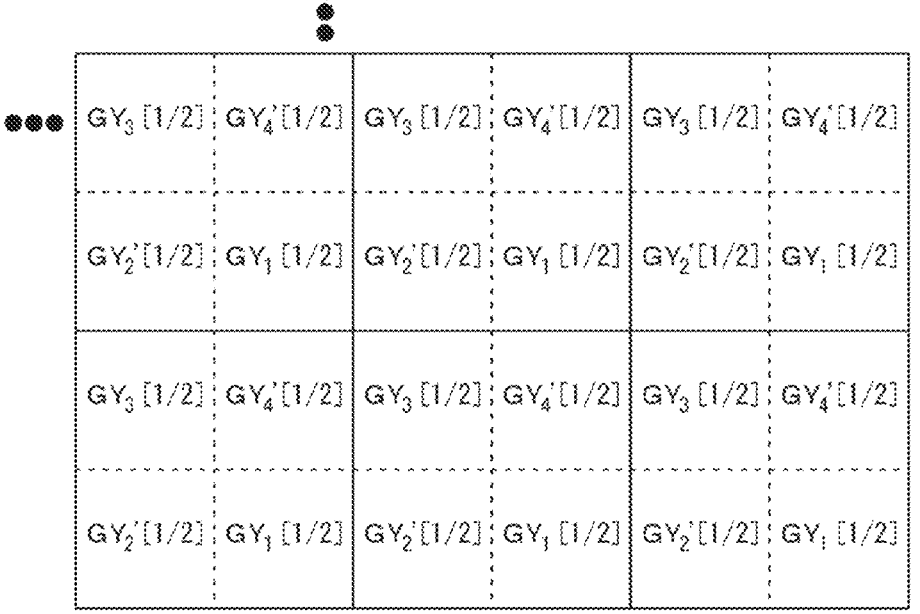
Figure 25A:
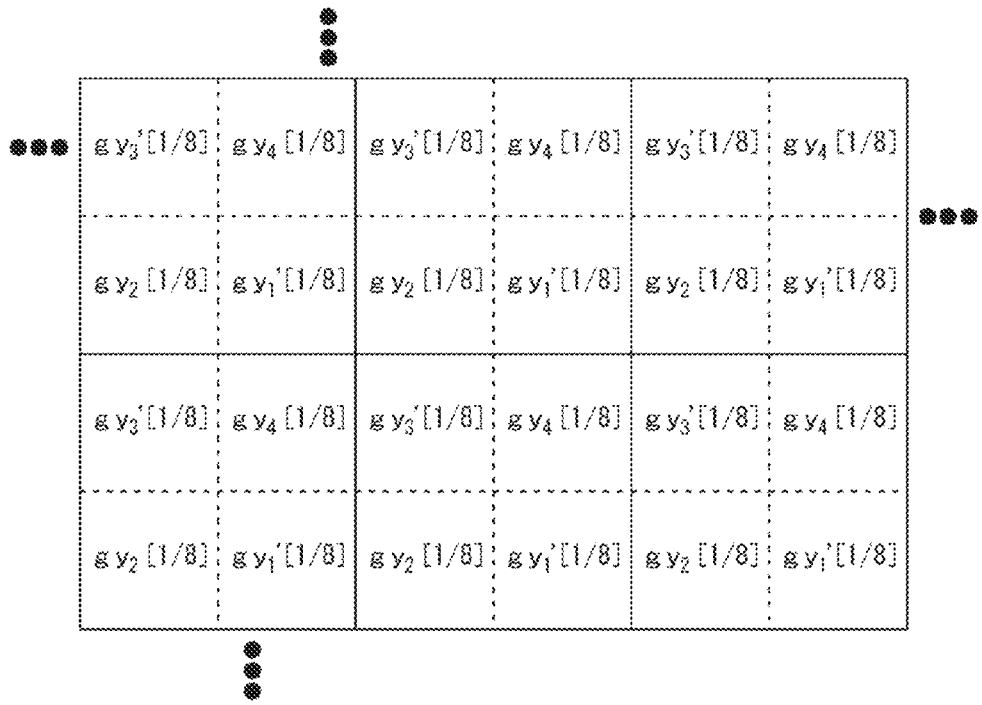
FIGS. 25A and 25B are figures illustrating final output ratios of low sensitivity image data according to the image-capturing device of the seventh embodiment.
Figure 25B:
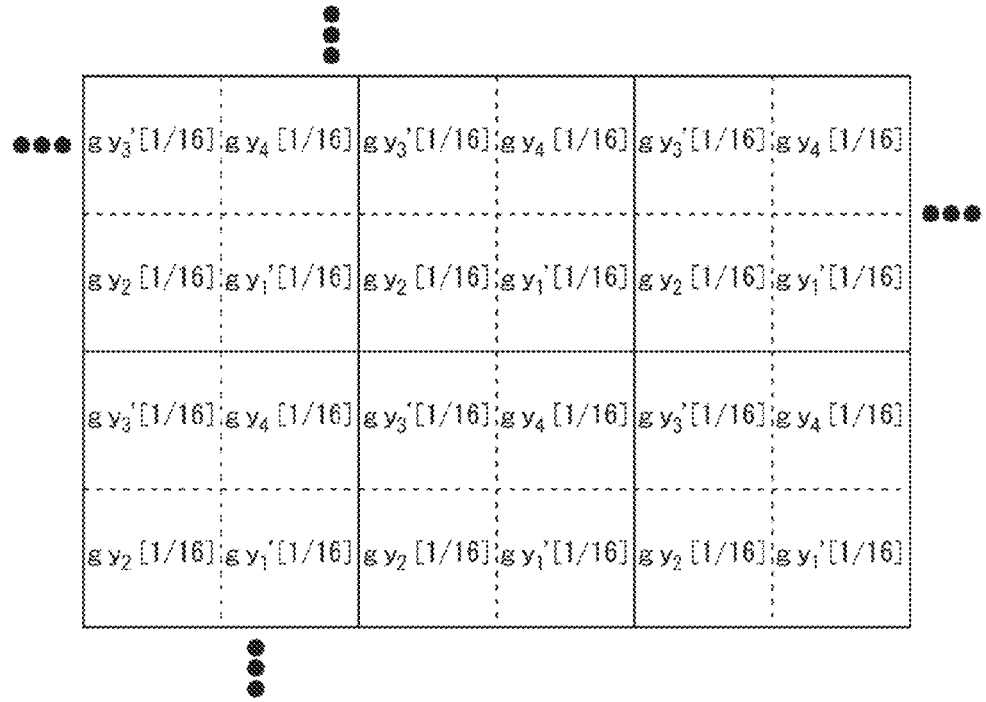

For example, when the sizes of the first aperture portion 147, the second aperture portion 157, the third aperture portion 167, and the fourth aperture portion 177 are determined so that the light quantity attenuation for the second image-capturing element 151 and the fourth image-capturing element 171 is twice as large as the light quantity attenuation for the first image-capturing element 141 and the third image-capturing element 161, the sensitivity of the third image-capturing element 161 is ($1/2$) of the sensitivity of the first image-capturing element 141, and the sensitivity of the fourth image-capturing element 171 is $1/8$ (the sixth embodiment) to $1/16$ (24 dB) of the sensitivity of the second image-capturing element 151 (see FIGS. 23A and 23B). Therefore, the high sensitivity image data [1] based on the output from the first image-capturing element 141 and the high sensitivity image data [2] based on the output from the third image-capturing element 161 can be obtained. However, a final output ratio of the high sensitivity image data [1] versus the high sensitivity image data [2] is 1:($1/2$) (see FIGS. 24A and 24B). The low sensitivity image data [1] based on the output from the second image-capturing element 151 and the low sensitivity image data [2] based on the output from the fourth image-capturing element 171 can be obtained. However, a final output ratio of the low sensitivity image data [1] versus the low sensitivity image data [2] is ($1/8$):($1/16$) (see FIGS. 25A and 25B). As described above, in the seventh embodiment, four levels of information can be obtained by one image-capturing process. According to the seventh embodiment, the range from where information can be obtained becomes two times larger, and the lower limit of detection of a gray image is greatly extended, and information can be obtained in a lower illumination spatial area.

Eighth Embodiment

The eighth embodiment is also a modification of the sixth embodiment, and relates to an embodiment similar to the third embodiment. In the image-capturing device of the eighth embodiment, an image processing unit 11 includes a first gain adjustment unit configured to adjust outputs from the first image-capturing element 141 and the third image-capturing element 161, and a second gain adjustment unit configured to adjust an output from the second image-capturing element 151 and the fourth image-capturing element 171. Where an adjustment coefficient for the outputs from the first image-capturing element 141 and the third image-capturing element 161 by the first gain adjustment unit is denoted as $Gn_1$, and an adjustment coefficient for the output from the second image-capturing element 151 and the fourth image-capturing element 171 by the second gain adjustment unit is denoted as $Gn_2$, $Gn_1/Gn_2 \geq 1$ is satisfied, and more specifically, $Gn_1/Gn_2=4$ is satisfied, although the present embodiment is not limited thereto. The range of gain difference of the first image-capturing element 141 and the third image-capturing element 161 and the second image-capturing element 151 and the fourth image-capturing element 171 is up to 12 dB. The sensitivity ratio of the first image-capturing element 141 and the third image-capturing element 161 and the sensitivity ratio of the second image-capturing element 151 and the fourth image-capturing element 171 is 1:($1/8$). The gain ratio of the first image-capturing element 141 and the third image-capturing element 161 and the second image-capturing element 151 and the fourth image-capturing element 171 is 4:1. Therefore, the final output ratio of the first image-capturing element 141 and the third image-capturing element 161 and the second image-capturing element 151 and the fourth image-capturing element 171 is 1:($1/32$), that is, 30 dB.

The values of the adjustment coefficients $Gn_1$, $Gn_2$ may be fixed values, or may be automatically or manually changeable in accordance with the image-capturing scene and the difference between the average luminance in the high sensitivity image data and the average luminance in the low sensitivity image data, and therefore, image-capturing can be done with the optimum dynamic range in accordance with various kinds of bright and dark scenes. The gain value for the first image-capturing element 141 and the gain value for the third image-capturing element 161 may be configured to be different (for example, four times the gain value for the first image-capturing element 141, and twice the gain value for the third image-capturing element 161), and the gain value for the second image-capturing element 151 and the gain value for the fourth image-capturing element 171 may be configured to be different (for example, twice the gain value for the second image-capturing element 151, and four times the gain value for the fourth image-capturing element 171).

It should be noted that the seventh embodiment and the eighth embodiment may be combined.

Ninth Embodiment

The ninth embodiment is also a modification of the sixth embodiment, and relates to an embodiment similar to the fourth embodiment. Also in the ninth embodiment, the image processing unit 11 may generate N sets of high sensitivity image data and low sensitivity image data of which exposure times are different, and the image processing unit 11 may further divide an illumination area of an image obtained from the low sensitivity image data or the high sensitivity image data into 2N levels of image areas ranging from an image area of which illumination is the lowest to an image area of which illumination is the highest, and may generate a combined image using N sets of high sensitivity image data respectively corresponding to N levels of low illumination image areas in the N levels of low illumination image areas ranging from the image area of which illumination is the lowest to the image area of which illumination is the N-th lowest, and using N sets of low sensitivity image data respectively corresponding to N levels of high illumination image areas in the N levels of high illumination image areas ranging from the image area of which illumination is the (N+1)-th lowest to the image area of which illumination is the highest. In the ninth embodiment, N is 2, and there is such relationship that the image-capturing time for obtaining the high sensitivity image data and the low sensitivity image data of the first set is twice the image-capturing time for obtaining the high sensitivity image data and the low sensitivity image data of the second set.

Like the third embodiment, the image processing unit 11 divides an illumination area of an image obtained from the low sensitivity image data or the high sensitivity image data into 4 levels of areas ranging from an area of which illumination is the lowest to an area of which illumination is the highest, and generate a combined image using two sets of high sensitivity image data respectively corresponding to two levels of low illumination image areas, that is, high sensitivity image data obtained from the "high sensitivity 1" and the "high sensitivity 2" shown in FIG. 11, in two levels of low illumination image areas ranging from the area of which illumination is the lowest to the area of which illumination is the second lowest, and using two sets of low sensitivity image data respectively corresponding to two levels of high illumination image areas, that is, low sensitivity image data obtained from the "low sensitivity 1" and the "low sensitivity 2" shown in FIG. 11, in two levels of high illumination image areas ranging from the area of which illumination is the third lowest to the fourth area of which illumination is the highest. As a result, the dynamic range of the image combined by HDR imaging is 24 dB.

Also in the ninth embodiment, the range in which the color information can be obtained is twice as large as the conventional range, and the lower limit of detection of the gray image is also extended to the half, and therefore, information can be obtained in a lower illumination spatial area. Therefore, as compared to the image combined by HDR imaging from an ordinary unit frame, not only the dynamic range is expanded, but also information about intermediate illumination is increased, and therefore, an image made by highly precise HDR imaging can be formed from two unit frames.

It should be noted that the configuration and the structure of the image-capturing device of the seventh embodiment can be applied to the image-capturing device of the ninth embodiment. The configuration and the structure of the image-capturing device of the eighth embodiment can be applied to the image-capturing device of the ninth embodiment. The configuration and the structure of the image-capturing device of the seventh embodiment and the eighth embodiment can be applied to the image-capturing device of the ninth embodiment.

Tenth Embodiment

The tenth embodiment is a modification of the first embodiment and the sixth embodiment. More specifically, in the tenth embodiment, a single-color image is obtained from the image-capturing device explained in the first embodiment. In this case, the first gain adjustment unit provided in the image processing unit 11 adjusts outputs from the first image-capturing element 41, the second image-capturing element 51, and the third image-capturing element 61, so that the spectral characteristics based on the outputs become the same as the spectral characteristic of the fourth filter (neutral density filter) 73 of the fourth image-capturing element 71 as much as possible. For example, when the fourth filter is constituted by stacking the first filter and the third filter as described above, the output of the first image-capturing element 41 may be multiplied by 1.0, the output of the second image-capturing element 51 may be multiplied by 0.2, and the output of the third image-capturing element 61 may be multiplied by 1.0. In this case, these output multiplication factors are merely examples, and may be configured appropriately so as to be similar to the spectral characteristic of the fourth filter. As explained in the sixth embodiment, the neutral density filter is made of a material obtained by mixing the first material, the second material, and the third material, or may be constituted by three-layer structure including the first material layer, the second material layer, and the third material layer, or may be made of a material obtained by mixing the first material and the third material, or may be constituted by two-layer structure including the first material layer and the third material layer, or a material obtained by mixing the second material and magenta material, or may be constituted by a two-layer structure including the second material layer and a material layer made of magenta material. It should be noted that the spectral characteristic of a material obtained by mixing the first material and the third material is schematically shown in FIG. 17B.

Eleventh Embodiment

Figure 26:
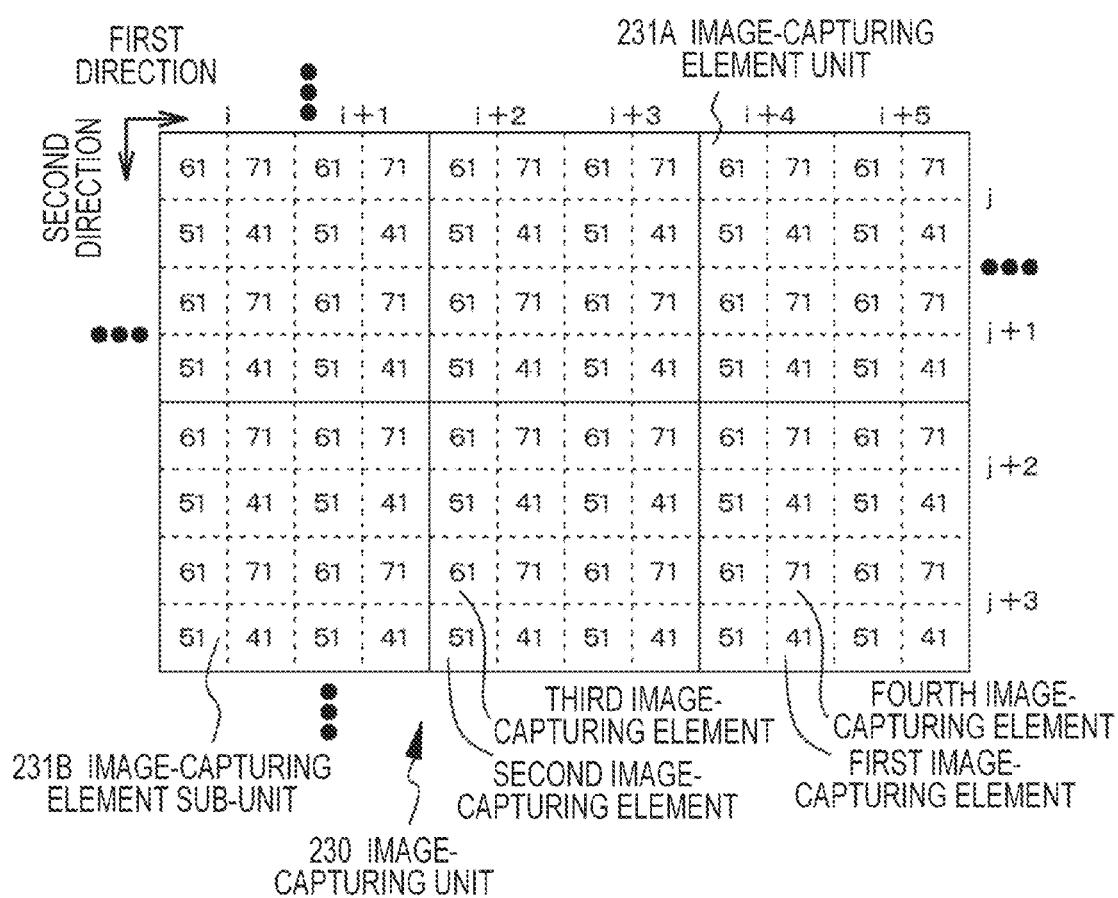
FIG. 26 is a conceptual diagram illustrating an image-capturing unit of an image-capturing device according to an eleventh embodiment.

The eleventh embodiment relates to an image-capturing device according to the third aspect of the present disclosure. A conceptual diagram of an image-capturing unit of the image-capturing device according to the eleventh embodiment is shown in FIG. 26. Conceptual diagrams for explaining operation of the image-capturing unit are shown in FIGS. 27A, 27B, 28A, 28B, and 29.

The image-capturing device of the eleventh embodiment is an image-capturing device for obtaining a combined image in which a portion of the image is a single-color image and the remaining portion thereof is a color image. The image-capturing device of the eleventh embodiment is an image-capturing device that includes an image-capturing unit 230 and an image processing unit 11, wherein the image-capturing unit 230 includes image-capturing element units 231A arranged in a two-dimensional matrix form, and each of the image-capturing element units 231A includes four image-capturing element sub-units 231B including a first image-capturing element 41 including a first filter 43 and a first photoelectric conversion element 42 and configured to receive light in a first wavelength band, a second image-capturing element 51 including a second filter 53 and a second photoelectric conversion element 52 and configured to receive light in a second wavelength band having a peak wavelength longer than a peak wavelength of the first wavelength band, a third image-capturing element 61 including a third filter 63 and a third photoelectric conversion element 62 and configured to receive light in a third wavelength band having a peak wavelength longer than the peak wavelength of the second wavelength band, and a fourth image-capturing element 71 including a fourth filter 73 and a fourth photoelectric conversion element 72 and configured to receive light in the first wavelength band, the second wavelength band, and the third wavelength band. The first image-capturing element 41, the second image-capturing element 51, the third image-capturing element 61, and the fourth image-capturing element 71, the photoelectric conversion element, the filters 43, 53, 63, 73, and the like of the eleventh embodiment have the same configuration and the same structure as those of the first embodiment.

Like the first embodiment, the light transmission rate of the fourth filter 73 of the image-capturing device of the eleventh embodiment is less than the light transmission rate of the first filter 43, the light transmission rate of the second filter 53, and the light transmission rate of the third filter 63. Alternatively, the sensitivity of the fourth image-capturing element 71 is less than the sensitivities of the first image-capturing element 41, the second image-capturing element 51, and the third image-capturing element 61. The image processing unit 11 generates high sensitivity image data on the basis of an output summation of the first image-capturing elements 41, an output summation of the second image-capturing elements 51, and an output summation of the third image-capturing elements 61 of the four image-capturing element sub-units 231B constituting the image-capturing element unit 231A, and generates low sensitivity image data on the basis of an output from the fourth image-capturing elements 71 of each of the four image-capturing element sub-units 231B. More specifically, the total output of the first image-capturing elements 41, the total output of the second image-capturing elements 51, and the total output of the third image-capturing elements 61 are four times the output of each of the fourth image-capturing elements 71, and the sensitivity ratio of the sensitivity of the first image-capturing element 41, the second image-capturing element 51, and the third image-capturing element 61 and the sensitivity of the fourth image-capturing element 71 is 1:(⅛), and therefore, the final output ratio of the high sensitivity image data and the low sensitivity image data is 1:(1/32).

Further, the image processing unit 11 generates a combined image using high sensitivity image data corresponding to a low illumination image area in the low illumination image area obtained from the low sensitivity image data or the high sensitivity image data and using low sensitivity image data corresponding to a high illumination image area in the high illumination image area obtained from the low sensitivity image data or the high sensitivity image data.

It should be noted that the arrangement of the four image-capturing elements 41, 51, 61, 71 of any given image-capturing element sub-unit 231B is the Bayer arrangement. In FIG. 26, the image-capturing element unit 231A is indicated as being enclosed by solid lines, and the image-capturing element sub-unit 231B is indicated as being enclosed by solid lines and dotted lines. More specifically, for example, in any given image-capturing element sub-unit 231B, the third image-capturing element 61 and the fourth image-capturing element 71 are arranged adjacently to each other along the first direction, the first image-capturing element 41 and the second image-capturing element 51 are arranged adjacently to each other along the first direction, the first image-capturing element 41 and the fourth image-capturing element 71 are arranged adjacently to each other along the second direction, and the second image-capturing element 51 and the third image-capturing element 61 are arranged adjacently to each other along the second direction.

Figure 27A:
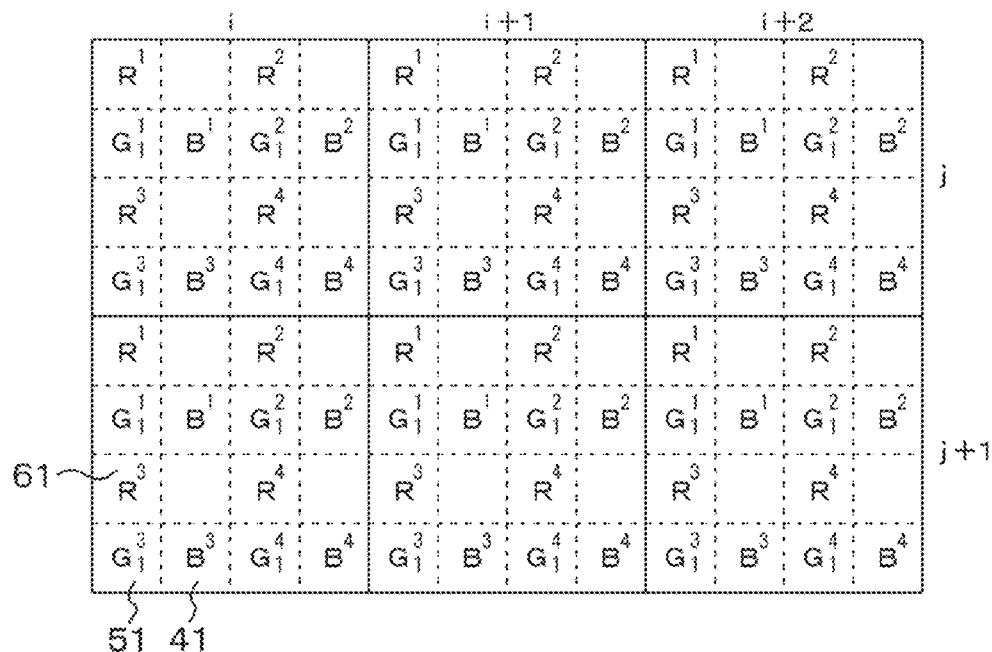
FIGS. 27A and 27B are conceptual diagrams for explaining operation of the image-capturing unit of the image-capturing device according to the eleventh embodiment.

When a certain image-capturing scene is captured, four first image-capturing elements 41 in any given image-capturing element unit 231A output signal values "$B^1$", "$B^2$", "$B^3$", "$B^4$" as shown in FIG. 27A. Four second image-capturing elements 51 in any given image-capturing element unit 231A output signal values "$G_1^1$", "$G_1^2$", "$G_1^3$", "$G_1^4$" as shown in FIG. 27A. Further, four third image-capturing elements 61 in any given image-capturing element unit 231A output signal values "$R_1^1$", "$R_1^2$", "$R_1^3$", "$R_1^4$" as shown in FIG. 27A. On the other hand, four fourth image-capturing elements 71 in any given image-capturing element unit 231A output signal values "$Gy_4^1$", "$Gy_4^2$", "$Gy_4^3$", "$Gy_4^4$" as shown in FIG. 27B.

Figure 27B:
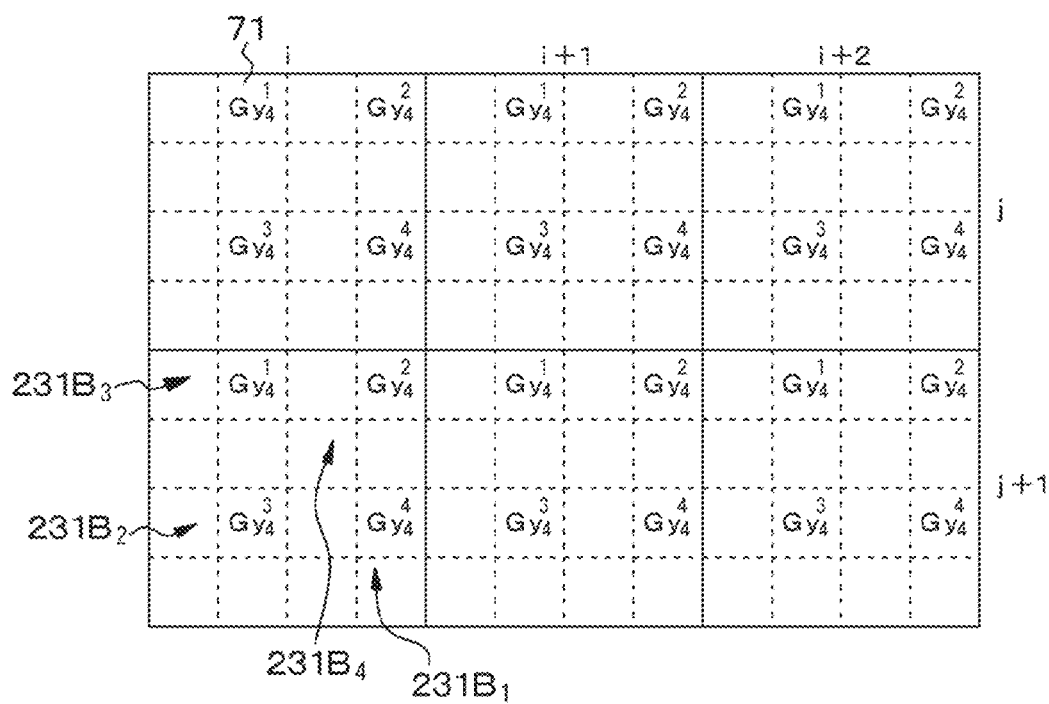

Each image-capturing element having received light in the state as shown in FIGS. 27A and 27B transmits an output (electric signal) based on the received light quantity to the image processing unit 11. In the image processing unit 11, for example, the interpolation processing is performed on the basis of the following method.

More specifically, the image processing unit 11, derives output summations $B^{1-4}$, $G_1^{1-4}$, $R^{1-4}$ of a cluster of four first image-capturing elements 41 (first image-capturing element cluster), a cluster of four second image-capturing elements 51 (second image-capturing element cluster), and a cluster of four third image-capturing elements 61 (third image-capturing element cluster) of the four image-capturing element sub-units 231B (see FIG. 28A). Further, the second image-capturing element cluster is assumed to be located in an area where the fourth image-capturing element cluster is located, and an output that may be considered to be output by the second image-capturing element cluster (assumed second image-capturing element cluster) that is assumed as above is interpolated from an output from a second image-capturing element cluster adjacent to the assumed second image-capturing element cluster, so that an output $G'_2^{1-4}$ which is the same as the output from an image-capturing element in an ordinary image-capturing device of the Bayer arrangement is obtained (see FIG. 28B). An output based on the fourth image-capturing element 71 similar to an output from an image-capturing element in an ordinary image-capturing device of the Bayer arrangement is obtained without performing adding processing on the basis of the fourth image-capturing element 71 constituting the first image-capturing element sub-unit $231B_1$, the fourth image-capturing element 71 constituting the second image-capturing element sub-unit $231B_2$, the fourth image-capturing element 71 constituting the third image-capturing element sub-unit $231B_3$, and the fourth image-capturing element 71 constituting the fourth image-capturing element sub-unit $231B_4$ (see FIG. 29). Therefore, the high sensitivity image data (see FIG. 28B) and the low sensitivity image data (see FIG. 29) of which number of pixels is ¼ of the original number of pixels can be obtained, but the data configuration and the data structure of the low sensitivity image data and the data configuration and the data structure of the high sensitivity image data can be configured to be the same, and therefore, various kinds of signal processing can be simplified. The high sensitivity image data are subjected to the four-pixel adding processing, but the low sensitivity image data are not subjected to the adding processing. Therefore, there is an advantage in that the sensitivity difference can be increased to four times.

Thereafter, by performing the same processing as the first embodiment on the basis of the high sensitivity image data and the low sensitivity image data, the image combined by HDR imaging can be obtained.

It should be noted that the configuration and the structure of the image-capturing device explained in the second embodiment can also be applied to the eleventh embodiment, the configuration and the structure of the image-capturing device explained in the third embodiment can also be applied to the eleventh embodiment, and the configuration and the structure of the image-capturing device explained in the fourth embodiment can also be applied to the eleventh embodiment, or any given combination thereof may also be applied to the eleventh embodiment.

The present disclosure has been hereinabove explained with reference to the preferred embodiments, but the present disclosure is not limited to these embodiments. The configuration and the structure of the image-capturing device and the image-capturing element explained in the embodiments are merely examples, and can be changed as necessary. For example, image-capturing element may be configured such that a photoelectric conversion element is provided on a silicon semiconductor substrate, and then a first planarization film, an on-chip lens, a second planarization film, and a filter are stacked thereon. The image-capturing element may be a front-illuminated element instead of a back-illuminated element.

It should be noted that the present disclosure may be configured as follows.

[1]<<Image-Capturing Device: First Aspect>>

An image-capturing device including: an image-capturing unit; and an image processing unit, wherein the image-capturing unit includes image-capturing element units arranged in a two-dimensional matrix form, and each of the image-capturing element units includes: a first image-capturing element including a first filter and a first photoelectric conversion element, and configured to receive light in a first wavelength band; a second image-capturing element including a second filter and a second photoelectric conversion element, and configured to receive light in a second wavelength band having a peak wavelength longer than a peak wavelength of the first wavelength band; a third image-capturing element including a third filter and a third photoelectric conversion element, and configured to receive light in a third wavelength band having a peak wavelength longer than a peak wavelength of the second wavelength band; and a fourth image-capturing element including a fourth filter and a fourth photoelectric conversion element, and configured to receive light in the first wavelength band, the second wavelength band, and the third wavelength band, and wherein a light transmission rate of the fourth filter is less than a light transmission rate of the first filter, a light transmission rate of the second filter, and a light transmission rate of the third filter, and the image processing unit generates high sensitivity image data in accordance with outputs from the first image-capturing element, the second image-capturing element, and the third image-capturing element, and generates low sensitivity image data in accordance with an output from the fourth image-capturing element, and the image processing unit further generates a combined image using high sensitivity image data corresponding to a low illumination image area in the low illumination image area obtained from the low sensitivity image data or the high sensitivity image data, and using low sensitivity image data corresponding to an high illumination image area in the high illumination image area obtained from the low sensitivity image data or the high sensitivity image data.

[2] The image-capturing device according to [1], wherein a first aperture portion is formed between the first filter and the first photoelectric conversion element, a second aperture portion is formed between the second filter and the second photoelectric conversion element, a third aperture portion is formed between the third filter and the third photoelectric conversion element, and a fourth aperture portion is formed between the fourth filter and the fourth photoelectric conversion element, and wherein the fourth aperture portion is smaller than the first aperture portion, the second aperture portion, and the third aperture portion.

[3] The image-capturing device according to [1] or [2], wherein the image processing unit includes a first gain adjustment unit configured to adjust outputs from the first image-capturing element, the second image-capturing element, and the third image-capturing element, and a second gain adjustment unit configured to adjust an output from the fourth image-capturing element.

[4] The image-capturing device according to [3], wherein where an adjustment coefficient for outputs from the first image-capturing element, the second image-capturing element, and the third image-capturing element by the first gain adjustment unit is denoted as $Gn_1$, and an adjustment coefficient for an output from the fourth image-capturing element by the second gain adjustment unit is denoted as $Gn_2$, $Gn_1/Gn_2 \geq 1$ is satisfied.

[5] The image-capturing device according to any one of [1] to [4], wherein the image processing unit generates N sets of high sensitivity image data and low sensitivity image data of which exposure times are different, and the image processing unit further divides an illumination area of an image obtained from the low sensitivity image data or the high sensitivity image data into 2N levels of areas ranging from an area of which illumination is the lowest to an area of which illumination is the highest, and generates a combined image using N sets of high sensitivity image data respectively corresponding to N levels of low illumination image areas in the N levels of low illumination image areas ranging from the area of which illumination is the lowest to the area of which illumination is the N-th lowest, and using N sets of low sensitivity image data respectively corresponding to N levels of high illumination image areas in the N levels of high illumination image areas ranging from the area of which illumination is the (N+1)-th lowest to the area of which illumination is the highest.

[6] The image-capturing device according to [5], wherein N is 2, and there is such relationship that the image-capturing time for obtaining the high sensitivity image data and the low sensitivity image data of the first set is twice the image-capturing time for obtaining the high sensitivity image data and the low sensitivity image data of the second set.

[7] The image-capturing device according to any one of [1] to [6], wherein there is no gap between the first filter, the second filter, the third filter, and the fourth filter.

[8] The image-capturing device according to any one of [1] to [7], wherein the fourth filter has a three-layer stacked layer structure including a first material layer made of a first material constituting the first filter, a second material layer made of a second material constituting the second filter, and a third material layer made of a third material constituting the third filter.

[9] The image-capturing device according to any one of [1] to [7], wherein the fourth filter is made of a material obtained by mixing a first material constituting the first filter, a second material constituting the second filter, and a third material constituting the third filter.

[10] The image-capturing device according to any one of [1] to [7], wherein the fourth filter has a two layer stacked layer structure including a first material layer made of a first material constituting the first filter and a third material layer made of a third material constituting the third filter.

[11] The image-capturing device according to any one of [1] to [7], wherein the fourth filter is made of a material obtained by mixing a first material constituting the first filter and a third material constituting the third filter.

[12]<<Image-Capturing Device: Second Aspect>>

An image-capturing device including: an image-capturing unit; and an image processing unit, wherein the image-capturing unit includes image-capturing element units arranged in a two-dimensional matrix form, and each of the image-capturing element units includes: a first image-capturing element and a third image-capturing element including a first photoelectric conversion element and configured to receive light in a visible light range; and a second image-capturing element and a fourth image-capturing element including a neutral density filter and a second photoelectric conversion element and configured to receive light in a visible light range, wherein the image processing unit generates high sensitivity image data on the basis of outputs from the first image-capturing element and the third image-capturing element, and generates low sensitivity image data on the basis of outputs from the second image-capturing element and the fourth image-capturing element, and the image processing unit further generates a combined image using high sensitivity image data corresponding to a low illumination image area in the low illumination image area obtained from the low sensitivity image data or the high sensitivity image data and using low sensitivity image data corresponding to a high illumination image area in the high illumination image area obtained from the low sensitivity image data or the high sensitivity image data.

[13] The image-capturing device according to [12], wherein a first aperture portion is formed in a light incidence area of the first photoelectric conversion element, a second aperture portion is formed between the neutral density filter and the second photoelectric conversion element, a third aperture portion is formed in a light incidence area of the third photoelectric conversion element, and a fourth aperture portion is formed between the neutral density filter and the fourth photoelectric conversion element, wherein the third aperture portion is smaller than the first aperture portion, and the fourth aperture portion is smaller than the second aperture portion.

[14] The image-capturing device according to [12] or [13], wherein the image processing unit has a first gain adjustment unit configured to adjust outputs from the first image-capturing element and the third image-capturing element, and an second gain adjustment unit configured to adjust outputs from the second image-capturing element and the fourth image-capturing element.

[15] The image-capturing device according to [14], wherein where an adjustment coefficient for outputs from the first image-capturing element and the third image-capturing element by the first gain adjustment unit is denoted as $Gn_1$, and an adjustment coefficient for outputs from the second image-capturing element and the fourth image-capturing element by the second gain adjustment unit is denoted as $Gn_2$, $Gn_1/Gn_2 \geq 1$ is satisfied.

[16] The image-capturing device according to any one of [12] to [15], wherein the image processing unit generates N sets of high sensitivity image data and low sensitivity image data of which exposure times are different, and the image processing unit further divides an illumination area of an image obtained from the low sensitivity image data or the high sensitivity image data into 2N levels of image areas ranging from an image area of which illumination is the lowest to an image area of which illumination is the highest, and generates a combined image using N sets of high sensitivity image data respectively corresponding to N levels of low illumination image areas in the N levels of low illumination image areas ranging from the image area of which illumination is the lowest to the image area of which illumination is the N-th lowest, and using N sets of low sensitivity image data respectively corresponding to N levels of high illumination image areas in the N levels of high illumination image areas ranging from the image area of which illumination is the (N+1)-th lowest to the image area of which illumination is the highest.

[17] The image-capturing device according to [16], wherein N is 2, and there is such relationship that the image-capturing time for obtaining the high sensitivity image data and the low sensitivity image data of the first set is twice the image-capturing time for obtaining the high sensitivity image data and the low sensitivity image data of the second set.

[18] The image-capturing device according to any one of [12] to [17], wherein the neutral density filter has the same spectral characteristic as a spectral characteristic of a filter made by stacking the first filter and the third filter.

[19]<<Image-Capturing Device: Third Aspect>>

An image-capturing device including: an image-capturing unit; and an image processing unit, wherein the image-capturing unit includes image-capturing element units arranged in a two-dimensional matrix form, and each of the image-capturing element units includes four image-capturing element sub-units each including a first image-capturing element including a first filter and a first photoelectric conversion element and configured to receive light in a first wavelength band; a second image-capturing element including a second filter and a second photoelectric conversion element and configured to receive light in a second wavelength band having a peak wavelength longer than a peak wavelength of the first wavelength band; a third image-capturing element including a third filter and a third photoelectric conversion element and configured to receive light in a third wavelength band having a peak wavelength longer than a peak wavelength of the second wavelength band; and a fourth image-capturing element including a fourth filter and a fourth photoelectric conversion element and configured to receive light in the first wavelength band, the second wavelength band, and the third wavelength band, wherein a light transmission rate of the fourth filter is less than a light transmission rate of the first filter, a light transmission rate of the second filter, and a light transmission rate of the third filter, and the image processing unit generates high sensitivity image data on the basis of an output summation of the first image-capturing elements, an output summation of the second image-capturing elements, and an output summation of the third image-capturing elements of the four image-capturing element sub-units constituting the image-capturing element unit, and generates low sensitivity image data on the basis of an output from the fourth image-capturing element of each of the four image-capturing element sub-units, and the image processing unit further generates a combined image using high sensitivity image data corresponding to a low illumination image area in the low illumination image area obtained from the low sensitivity image data or the high sensitivity image data, and using low sensitivity image data corresponding to an high illumination image area in the high illumination image area obtained from the low sensitivity image data or the high sensitivity image data.

[20]<<Image-Capturing Device: Fourth Aspect>>

An image-capturing device including: an image-capturing unit; and an image processing unit, wherein the image-capturing unit is arranged with image-capturing element units, each of the image-capturing element units includes: a first image-capturing element including a first photoelectric conversion element and configured to receive light in a visible light range; and a second image-capturing element including a neutral density filter and a second photoelectric conversion element and configured to receive light in a visible light range, and the image processing unit generates high sensitivity image data on the basis of an output from the first image-capturing element and generates low sensitivity image data on the basis of an output from the second image-capturing element, and the image processing unit further generates a combined image using high sensitivity image data corresponding to a low illumination image area in the low illumination image area obtained from the low sensitivity image data or the high sensitivity image data and using low sensitivity image data corresponding to a high illumination image area in the high illumination image area obtained from the low sensitivity image data or the high sensitivity image data.

REFERENCE SIGNS LIST

1, 2 image-capturing device
2 camera main body 11 image processing unit
12 image storage unit
20 lens system
21 image-capturing lens
22 diaphragm unit
23 imaging lens
30, 130, 230 image-capturing unit
31, 131, 231A image-capturing element unit
231B image-capturing element sub-unit
41, 141 first image-capturing element
42 first photoelectric conversion element
43 first filter
51, 151 second image-capturing element
52 second photoelectric conversion element
53 second filter
61, 161 third image-capturing element
62 third photoelectric conversion element
63 third filter
71, 171 fourth image-capturing element
72 fourth photoelectric conversion element
73 fourth filter
80 silicon semiconductor substrate
82 first planarization film
84 on-chip lens
85 second planarization film

The invention claimed is:

1. An image-capturing device, comprising:
an image-capturing circuit; and
an image processing circuit,
wherein the image-capturing circuit includes image-capturing element units arranged in a two-dimensional matrix form, and each of the image-capturing element units includes:
a first image-capturing element including a first filter and a first photoelectric conversion element, and wherein the first image-capturing element is configured to receive light in a first wavelength band having a first peak wavelength;
a second image-capturing element including a second filter and a second photoelectric conversion element, and wherein the second image-capturing element is configured to receive light in a second wavelength band having a second peak wavelength longer than the first peak wavelength of the first wavelength band;
a third image-capturing element including a third filter and a third photoelectric conversion element, and wherein the third image-capturing element is configured to receive light in a third wavelength band having a third peak wavelength longer than the second peak wavelength of the second wavelength band; and
a fourth image-capturing element including a fourth filter and a fourth photoelectric conversion element, and wherein the fourth image-capturing element is configured to receive light in the first wavelength band, the second wavelength band, and the third wavelength band,
wherein a light transmission rate of the fourth filter is less than a light transmission rate of the first filter, a light transmission rate of the second filter, and a light transmission rate of the third filter, and the image processing circuit is configured to generate high sensitivity image data based on outputs from the first image-capturing element, the second image-capturing element, and the third image-capturing element, and generate low sensitivity image data based on an output from the fourth image-capturing element,
wherein the image processing circuit is further configured to generate a combined image based on the high sensitivity image data corresponding to a low illumination image area in the low illumination image area obtained from the low sensitivity image data or the high sensitivity image data, and based on the low sensitivity image data corresponding to a high illumination image area in the high illumination image area obtained from the low sensitivity image data or the high sensitivity image data,
wherein the image processing circuit includes a first gain adjustment unit configured to adjust the outputs from the first image-capturing element, the second image-capturing element, and the third image-capturing element, and a second gain adjustment unit configured to adjust the output from the fourth image-capturing element, and wherein the first gain adjustment unit and the second gain adjustment unit are implemented as a part of the image processing circuit.

2. The image-capturing device according to claim 1, wherein a first aperture portion is formed between the first filter and the first photoelectric conversion element, a second aperture portion is formed between the second filter and the second photoelectric conversion element, a third aperture portion is formed between the third filter and the third photoelectric conversion element, and a fourth aperture portion is formed between the fourth filter and the fourth photoelectric conversion element, and
wherein the fourth aperture portion is smaller than the first aperture portion, the second aperture portion, and the third aperture portion.

3. The image-capturing device according to claim 1, wherein where a first adjustment coefficient for an output from the first image-capturing element, the second image-capturing element, or the third image-capturing element by the first gain adjustment unit is denoted as $Gn_1$, and a second adjustment coefficient for the output from the fourth image-capturing element by the second gain adjustment unit is denoted as $Gn_2$, $Gn_1/Gn_2 \geq 1$ is satisfied.

4. The image-capturing device according to claim 1, wherein the image processing circuit generates N sets of high sensitivity image data and low sensitivity image data of which exposure times are different, and
the image processing circuit further divides an illumination area of an image obtained from the low sensitivity image data or the high sensitivity image data into 2N levels of areas ranging from an area of which illumination is the lowest to an area of which illumination is the highest, and generates a combined image using N sets of high sensitivity image data respectively corresponding to N levels of low illumination image areas in the N levels of low illumination image areas ranging from the area of which illumination is the lowest to the area of which illumination is the N-th lowest, and using N sets of low sensitivity image data respectively corresponding to N levels of high illumination image areas in the N levels of high illumination image areas ranging from the area of which illumination is the (N+1)-th lowest to the area of which illumination is the highest.

5. The image-capturing device according to claim 4, wherein N is 2, and there is such relationship that the image-capturing time for obtaining the high sensitivity image data and the low sensitivity image data of the first set is twice the image-capturing time for obtaining the high sensitivity image data and the low sensitivity image data of the second set.

6. The image-capturing device according to claim 1, wherein there is no gap between the first filter, the second filter, the third filter, and the fourth filter.

7. The image-capturing device according to claim 1, wherein the fourth filter has a three-layer stacked layer structure including a first material layer made of a first material constituting the first filter, a second material layer made of a second material constituting the second filter, and a third material layer made of a third material constituting the third filter.

8. The image-capturing device according to claim 1, wherein the fourth filter is made of a material obtained by mixing a first material constituting the first filter, a second material constituting the second filter, and a third material constituting the third filter.

9. The image-capturing device according to claim 1, wherein the fourth filter has a two layer stacked layer structure including a first material layer made of a first material constituting the first filter and a third material layer made of a third material constituting the third filter.

10. The image-capturing device according to claim 1, wherein the fourth filter is made of a material obtained by mixing a first material constituting the first filter and a third material constituting the third filter.

* * * * *